US006645691B1

(12) United States Patent
Yasuda

(10) Patent No.: US 6,645,691 B1
(45) Date of Patent: Nov. 11, 2003

(54) SILVER HALIDE PHOTOGRAPHIC LIGHT-SENSITIVE MATERIAL

(75) Inventor: Shoji Yasuda, Minami-ashigara (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/195,415

(22) Filed: Jul. 16, 2002

(30) Foreign Application Priority Data

Jul. 16, 2001 (JP) ....................................... 2001-215106

(51) Int. Cl.[7] ............................ G03C 3/02; G03C 3/00; G03F 7/06

(52) U.S. Cl. ........................ 430/264; 430/501; 396/513

(58) Field of Search ................................ 430/264, 501; 396/513

(56) References Cited

U.S. PATENT DOCUMENTS 5,238,800 A * 8/1993 Hosoi et al. ................ 430/264
5,286,598 A * 2/1994 Inoue et al. ................ 430/264
5,353,933 A * 10/1994 Takahashi et al. .......... 206/398
6,481,904 B2 * 11/2002 Fukugawa et al. .......... 396/513
2002/0117415 A1 * 8/2002 Fukugawa et al. .......... 206/410

FOREIGN PATENT DOCUMENTS

EP 1113 319 * 7/2001
JP 2001249431 A 9/2001

* cited by examiner

*Primary Examiner*—Richard L. Schilling
(74) *Attorney, Agent, or Firm*—Birch, Stewart, Kolasch & Birch, LLP

(57) ABSTRACT

Disclosed is a silver halide photographic light-sensitive material in the shape of a light-shielded light-sensitive material roll, which has a characteristic curve drawn in orthogonal coordinates of logarithm of light exposure (x-axis) and optical density (y-axis) using equal unit lengths for the both axes, on which gamma is 5.0 or more for the optical density range of 0.3–3.0. There is provided a silver halide photographic light-sensitive material in the shape of a light-shielded light-sensitive material roll suffering from little influence on photographic properties after long term storage.

9 Claims, 5 Drawing Sheets

1st step

2nd step

3rd step

4th step (a)

(b)

(c)

SILVER HALIDE PHOTOGRAPHIC LIGHT-SENSITIVE MATERIAL

TECHNICAL FIELD

The present invention relates to a silver halide photographic light-sensitive material. In particular, the present invention relates to an ultrahigh contrast negative type photographic light-sensitive material suitable for scanners and image setters for photomechanical processes.

RELATED ART

Silver halide photographic light-sensitive materials for scanners and image setters for use in photomechanical processes are used in the shape of a roll in many cases.

As a light-shielded light-sensitive material roll which is a packaged light-sensitive material roll comprising a light-sensitive material roll including a light-sensitive material sheet wound around a roll core, disk-shaped light-shielding members (also called light-shielding flanges) attached at each of the both ends of the roll and a light-shielding leader wound around the roll (henceforth referred to as "light-shielded light-sensitive material roll") and which can be mounted on a machine in a light room without exposing the light-sensitive material sheet, there are known those having the structures described below.

Japanese Patent No. 2899594 proposes a light-shielded light-sensitive material roll constituted by a light-sensitive material roll, light-shielding leader, sealing disks and end caps comprising a flexible portion having incisions (flap form segments) on the periphery thereof and a hub form portion, wherein the light-shielding leader is wound around the light-sensitive material roll, the hub form portions of the end caps are inserted into a hollow core of the light-sensitive material roll, and the flap form segments are folded to fix the light-shielding leader and the end caps. However, this light-shielded light-sensitive material roll has the complicated form of the flexible portion of the end cap, and an apparatus for folding the flexible portion of the end cap must be required in the production thereof.

Japanese Patent Laid-open Publication (Kokai, hence forth referred to as "JP-A") No. 11-105941 proposes a light-shielded light-sensitive material roll in which disk-shaped light-shielding members are attached to both end surfaces of the light-sensitive material roll wound with a light-shielding leader, peripheral portions of the disk-shaped light-shielding members are folded, and the light-shielding leader and the disk-shaped light-shielding members are adhered. However, this light-shielded light-sensitive material roll also requires an apparatus for folding flexible portions of the disk-shaped light-shielding members in the production thereof like the aforementioned light-shielded light-sensitive material roll proposed in Japanese Patent No. 2899594.

Further, JP-A-8-62783 proposes a light-shielded light-sensitive material roll in which a light-shielding leader having a width larger than a light-sensitive material is partially elongated by winding the light-shielding leader around the light-sensitive material roll with tension so that the light-shielding leader can also cover outer side surfaces of light-shielding flanges of the light-sensitive material roll.

However, in the structures proposed so far, photographic properties may be affected during long term storage of the materials, for example, the materials may suffer from sensitization, desensitization, increase of fog and so forth, and therefore improvements have been desired.

SUMMARY OF THE INVENTION

Therefore, an object of the present invention is to provide a silver halide photographic light-sensitive material in the shape of a light-shielded roll that suffers from little influence on photographic properties during long term storage thereof.

In order to achieve the aforementioned object, the present invention provides a silver halide photographic light-sensitive material comprising at least one silver halide emulsion layer on a support, which has a characteristic curve drawn in orthogonal coordinates of logarithm of light exposure (x-axis) and optical density (y-axis) using equal unit lengths for the both axes, on which gamma is 5.0 or more for the optical density range of 0.3–3.0, and is in the shape of a light-shielded light-sensitive material roll comprising a light-sensitive material roll including the light-sensitive material wound around a roll core, disk-shaped light-shielding members each attached to each of both ends of the roll core and having a radius approximately equal to a radius of the light-sensitive material roll and a light-shielding leader comprising a long length light-shielding sheet having a length longer than a length around the disk-shaped light-shielding member and a width approximately equal to a width of the long length light-sensitive material sheet and heat-shrinkable light-shielding film strips that have a length longer than a length around the disk-shaped light-shielding member, can be torn along the length direction and attached to both sides of the long length light-shielding sheet along side ends so that the strips can each extend from the long length light-shielding sheet in the transverse direction, and wherein the extending portions of the heat-shrinkable light-shielding film strips exceed outer peripheries of the disk-shaped light-shielding members and are fused to outside surfaces of the disk-shaped light-shielding members in a state that the extending portions of the heat-shrinkable light-shielding film strips are thermally shrunk mainly along the length direction.

The aforementioned silver halide photographic light-sensitive material of the present invention is preferably in the shape of the light-shielded light-sensitive material roll in which the roll core is hollow, the disk-shaped light-shielding members have ring-shaped projections on the surfaces at the center and the ring-shaped projections are fitted into a hollow of the roll core so that the ring-shaped projections can contact with inner wall of the hollow roll core; light-shielded light-sensitive material roll in which the heat-shrinkable light-shielding film strips that can be torn show an Elmendorf tear strength along the length direction in the range of 0.1–0.5 N; light-shielded light-sensitive material roll in which the heat-shrinkable light-shielding film strips that can be torn have a property that they are torn along a direction parallel to the side ends of the light-shielding sheet or a direction of going away from the side ends of the light-shielding sheet, when the light-shielding leader is rolled out; light-shielded light-sensitive material roll in which the heat-shrinkable light-shielding film strips that can be torn have a shrinking ratio along the length direction of 5–30% at 100° C. and a shrinking ratio along the width direction smaller than the shrinking ratio along the length direction by at least 1%; light-shielded light-sensitive material roll in which the heat-shrinkable light-shielding film strips that can be torn comprise a heat shrinkable film and thermoplastic light-shielding films substantially not showing heat-shrinking property laminated on both surfaces of the heat shrinkable film; or light-shielded light-sensitive material roll which has a light-shielding leader comprising a long length light-shielding sheet attached with heat-shrinkable light-shielding film strips that can be torn along the length direction on both sides of the long length light-shielding sheet along the side ends so that the each heat-shrinkable light-shielding film strip can extend from the long length light-shielding sheet in the transverse direction.

Further, the aforementioned silver halide photographic light-sensitive material of the present invention preferably contains a hydrazine compound, and preferably has a film surface pH of 6.0 or less for the emulsion layer side.

By using the silver halide photographic light-sensitive material of the present invention in the shape of a light-shielded light-sensitive material roll, which is characterized by having a characteristic curve drawn in orthogonal coordinates of logarithm of light exposure (x-axis) and optical density (y-axis) using equal unit lengths for the both axes, on which gamma is 5.0 or more for the optical density range of 0.3–3.0, influences on photographic properties can be reduced even after long term storage thereof.

BEST MODE FOR CARRYING OUT THE INVENTION

The silver halide photographic light-sensitive material of the present invention will be explained in detail hereafter. In the present specification, ranges indicated with "–" mean ranges including the numerical values before and after "–" as the minimum and maximum values, respectively.

The silver halide photographic light-sensitive material of the present invention is partly characterized by having a characteristic curve drawn in orthogonal coordinates of logarithm of light exposure (x-axis) and optical density (y-axis) using equal unit lengths for the both axes, on which gamma is 5.0 or more for the optical density range of 0.3–3.0.

The gamma used in the present invention means inclination of a straight line connecting two points corresponding to optical densities of 0.3 and 3.0 on the characteristic curve drawn in orthogonal coordinates of common logarithm of light exposure (x-axis) and optical density (y-axis) in which equal unit lengths are used for the both axes. That is, when the angle formed by the straight line and the x-axis is represented by H, the gamma is represented by tan .

The gamma of the silver halide photographic light-sensitive material of the present invention is 5.0 or more.

Specific development conditions and solutions used for light-sensitive materials having the characteristic curve defined in the present invention are described as follows, for example.

Developer: ND-1 produced by Fuji Photo Film Co., Ltd.

Fixer: NF-1 produced by Fuji Photo Film Co., Ltd.

Automatic developing machine: FG-680AG produced by Fuji Photo Film Co., Ltd.

Development conditions: 30 seconds at 35° C.

Various methods can be used as the method for obtaining a light-sensitive material having the characteristic curve defined by the present invention, and the details thereof are not particularly limited. The following can be mentioned as preferred examples.

For example, there can be mentioned a method of adding a heavy metal that can realize high contrast, for example, a metal belonging to Group VIII, to a silver halide emulsion. It is particularly preferable to add a rhodium compound, iridium compound, ruthenium compound and so forth.

Further, there can also be mentioned a method of adding at least one kind of compound selected from hydrazine derivatives, amine compounds, phosphonium compounds and so forth as a nucleating agent on the side having an emulsion layer.

Figure 2:
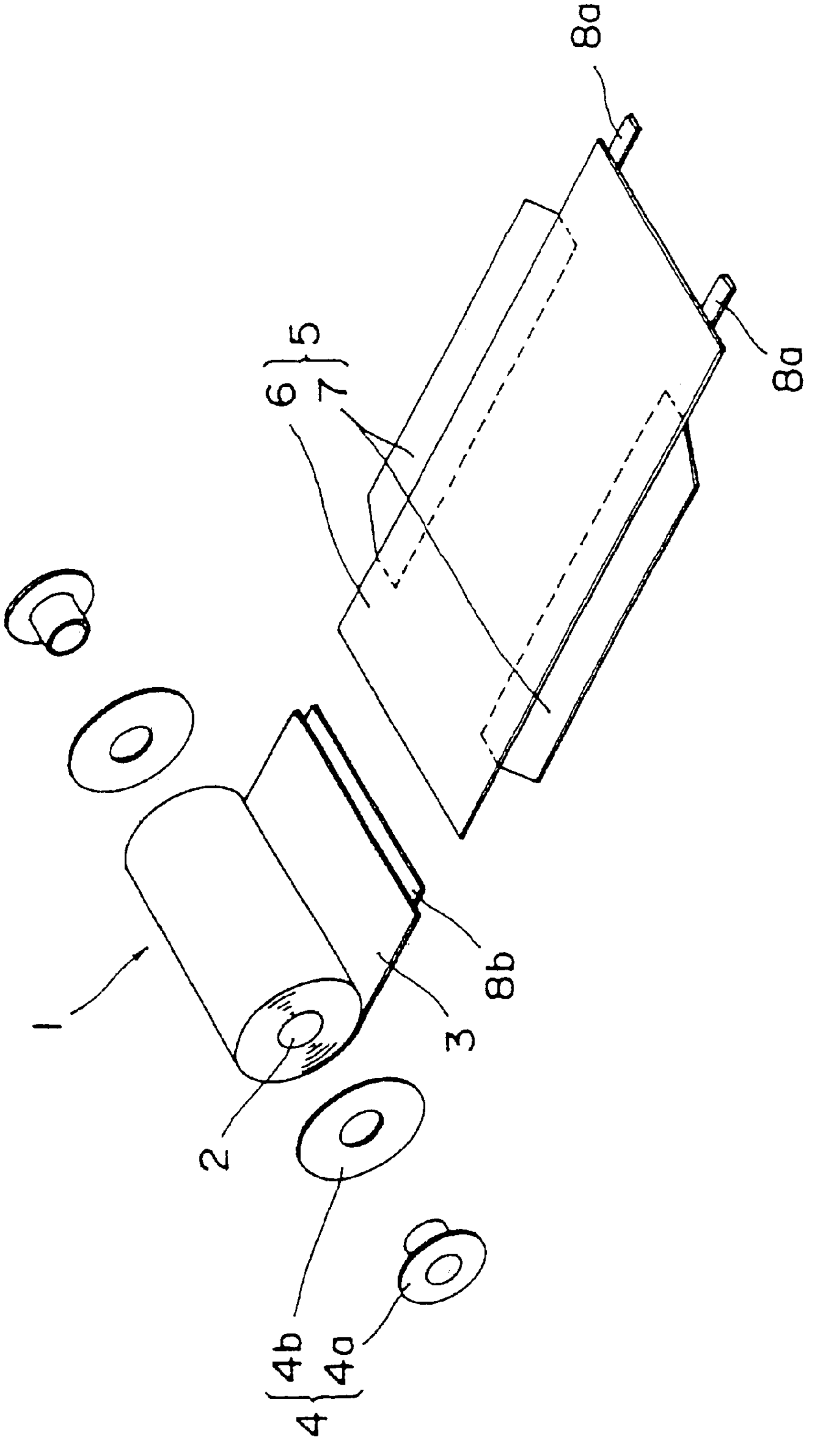
FIG. 2 shows a perspective view of dismantled parts of an exemplary silver halide photographic light-sensitive material in the form of light-shielded light-sensitive material roll according to the present invention.

FIG. 2 shows a perspective view of dismantled parts of an exemplary light-shielded light-sensitive material roll of the present invention. The light-shielded light-sensitive material roll of the present invention comprises a light-sensitive material roll 1 including a long length light-sensitive material sheet 3 wound around a roll core 2, a pair of disk-shaped light-shielding members 4 attached to the both ends of the roll core 2 of the light-sensitive material roll and shielding light irradiated on surface of the both ends of the light-sensitive material roll, a light-shielding leader 5 which is attached to an end of the long length light-sensitive material sheet 3 of the light-sensitive material roll 1 and wound around the light-sensitive material roll to shield light irradiated on the outer surface of the light-sensitive material roll, an adhesive tape **8*b* adhering the light-shielding leader and the light-sensitive material roll, and an adhesive tape 8*a*** attached to an end of the light-shielding leader and sealing the light-shielding leader.

The light-shielded light-sensitive material roll that constitutes the silver halide photographic light-sensitive material of the present invention is mainly characterized in that the light-shielding leader 5 comprises heat-shrinkable light-shielding film strips 7 that can be torn along their length direction and are provided on the both sides of the long length light-shielding sheet 6 along its side end portions, respectively, so that the strips can extend from the long length light-shielding sheet 6 in the transverse direction.

The light-shielding sheet 6 is a sheet having a length longer than the circumference length of the disk-shaped light-shielding members and preferably shorter than the twice of the circumference length of the disk-shaped light-shielding members, and a width substantially the same as the width of the long length light-sensitive material sheet. The heat-shrinkable light-shielding film strips 7 are films having a length longer than the circumference length of the disk-shaped light-shielding members, and shorter than the length of the light-shielding sheet. In addition, the heat-shrinkable light-shielding film strips 7 are preferably attached on the surface of the light-shielded sheet 6 on the side that is not in contact with the light-sensitive material roll.

The light-shielding sheet 6 preferably does not substantially show heat-shrinkable property or does not show heat-shrinkable property at all, and a known light-shielding leader for light-shielded light-sensitive rolls can be used for it. As specific examples of the light-shielding sheet 6, light-shielding plastic sheets such as low density polyethylene sheets containing pigments such as carbon black and so forth can be mentioned.

As for the heat shrinking ratio of the heat-shrinkable light-shielding film strips 7, they preferably have a heat shrinking ratio along the length direction of the film relatively larger than that along the width direction. For example, the heat shrinking ratio of the heat-shrinkable light-shielding film strips at 100° C. along the length direction is preferably 5% or more, more preferably 10% or more, and it is preferably larger than the shrinking ratio along the width direction by 1% or more as an absolute difference. The heat shrinking ratio of the heat-shrinkable light-shielding film strips referred to in the present invention is represented with a value measured according to the method described in JIS Z 1709-1976 (Films for Shrink Packaging).

The heat-shrinkable light-shielding film strips 7 preferably show an Elmendorf tear load along the length direction in the range of 0.1–0.5 N. If the Elmendorf tear load along the length direction becomes larger than 0.5, it will becomes difficult to tear the heat-shrinkable light-shielding film strips. On the other hand, when the Elmendorf tear load becomes smaller than 0.1 N, the heat-shrinkable light-shielding film strips may be torn at the time of transportation of the light-shielded light-sensitive material roll. The Elmendorf tear load of the heat-shrinkable light-shielding film strips referred to in the present invention is represented with a value measured according to the method described in JIS K 7128-2:1998 (Plastics—Test Methods for Tear Strength of Films and Sheets, Part II).

As an example of the heat-shrinkable light-shielding film strip, there can be mentioned a laminate film comprising a transparent or translucent heat-shrinkable film (shrink film) that shows significant heat-shrinkable property along the length direction and can be torn along the length direction and a light-shielding film substantially not showing heat-shrinkable property or not showing it at all laminated on the heat-shrinkable film, but it is not limited to this. As a heat-shrinkable film that can be used for such a laminate type heat-shrinkable light-shielding film strip, there can be mentioned, for example, Fancy Wrap (trade name, Gunze, Ltd.) of THS, TNS, TAS, TBS or TRS grade can be mentioned. Further, as light-shielding films that can be used for the laminate type heat-shrinkable light-shielding film strips, there can be mentioned films, for example, low density polyethylene films containing pigments such as carbon black.

Examples of the layer structure of the laminate type heat-shrinkable light-shielding film strips include a structure in which light-shielding films are laminated on surfaces, of both sides of a heat-shrinkable film, structure in which a light-shielding film is laminated on one surface of a heat-shrinkable film, and structure in which heat-shrinkable films are laminated on surfaces of both sides of a light-shielding film. Among these layer structures, the structure in which light-shielding films are laminated on surfaces of both sides of a heat-shrinkable film is preferred.

Thickness of the heat-shrinkable light-shielding film strip is preferably 100 $\mu$m or less, particularly preferably in the range of 60–90 $\mu$m. In the case of the laminate type heat-shrinkable light-shielding film strip, the thickness of the heat-shrinkable film is preferably in the range of 20–40 $\mu$m. Thickness of the light-shielding film is preferably in the range of 20–40 $\mu$m, and it is preferably larger than the thickness of the heat-shrinkable film by 1 $\mu$m or more.

The laminate type heat-shrinkable light-shielding film strip shows better tearing property as bonding strength between the heat-shrinkable film and the light-shielding film becomes larger. The bonding strength between the heat-shrinkable film and the light-shielding film is preferably 1.5 N or more for 15 mm width. This bonding strength is represented with a value measured according to the method described in JIS Z 0237.

The method for producing the laminate type heat-shrinkable light-shielding film strip (method for bonding the heat-shrinkable film and the light-shielding film) is not particularly limited, and the extrusion lamination method and the dry lamination method (any of solvent type adhesives and non-solvent type adhesives can be used) can be employed.

In the present invention, a hollow paper pipe or plastic pipe can be used for the roll core 2 of the light-shielded light-sensitive material roll. Further, the disk-shaped light-shielding member 4 is not particularly limited as for its material and so forth, so long as it has light-shielding property and it is hardly deformed when the heat-shrinkable light-shielding film strip of the light-shielding leader is fused on its surface. As the disk-shaped light-shielding member 4, one having a flange shape in which a ring-shaped projection is provided on the surface at the center is usually used. The disk-shaped light-shielding member 4 may not be constituted by integrally provided ring-shaped projection and flange portion. As shown in FIG. 2, it may be formed by fitting a cap **4*a* into a ring 4*b* and adhering the inner portion of the flange portion of the cap 4*a* and the outer surface of the ring 4*b* for fixation. The disk-shaped light-shielding member 4 is preferably attached to the roll core 2 by fitting the cap 4*a* of the disk-shaped light-shielding member 4** into the hollow roll core so that it can be in contact with the inner wall of the roll core, and it is more preferred that the ring-shaped projection and the inner wall of the roll core should be adhered with an adhesive.

Conventionally, identification signs are provided on surfaces of light-shielding leaders of light-shielded light-sensitive material rolls, indicating types of light-sensitive materials (light-sensitive emulsions) of long length light-sensitive material sheets, product numbers (lot numbers) and so forth, so that they can be identified at a glance. Also in the light-shielded light-sensitive material roll of the present invention, it is preferred that identification signs for the long length light-sensitive material sheet should be provided on the surface of the light-shielding leader like the conventional products. Furthermore, in the light-shielded light-sensitive material roll used for the present invention, it is preferred that identification signs should be provided also on the disk-shaped light-shielding member or roll core so that type and product number of the light-sensitive material of the long length light-sensitive material sheet can be identified even after use of the light-shielded light-sensitive material roll (namely, after the long length light-sensitive material sheet is rolled out) There are no particular limitations on the method for providing identification signs on the disk-shaped light-shielding member or the roll core. Specifically, there can be mentioned a method of printing identification signs on label and adhering the label, and a method of directly printing identification signs by an ink jet printer, printer based on pressure-sensitive or heat-sensitive printing, laser marker or the like.

In the light-shielded light-sensitive material roll, the adhesive tape 8*b* adhering the light-shielding leader and the light-sensitive material roll, and the adhesive tape 8*a* attached to an end of the light-shielding leader and sealing the light-shielding leader are not particularly limited, and adhesive tapes generally marketed can be used for them.

Figure 3:
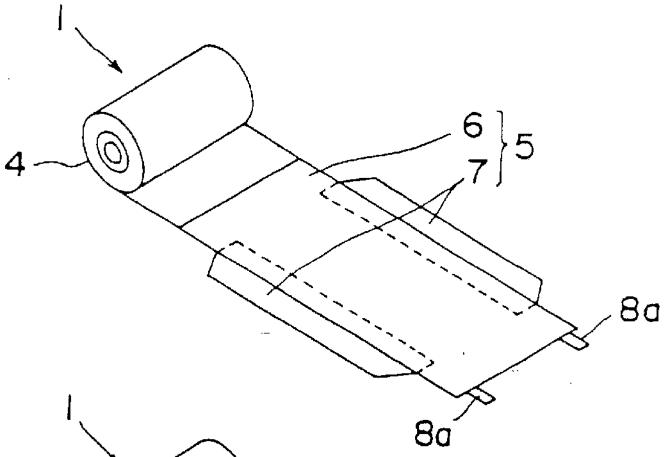
FIG. 3 shows an assembling process of an exemplary silver halide photographic light-sensitive material in the form of light-shielded light-sensitive material roll according to the present invention.
Figure 3:
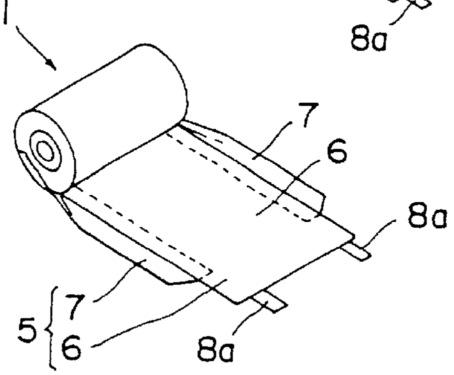
Figure 3:
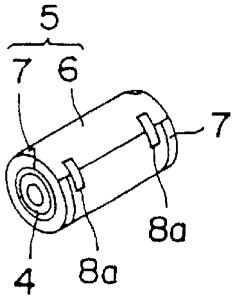
Figure 3:
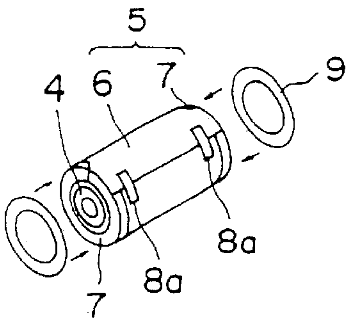

FIG. 3 shows a production process of an exemplary light-shielded light-sensitive material roll. In the present invention, the light-shielded light-sensitive material roll can be produced, for example, according to the following steps: (1) step of attaching the disk-shaped light-shielding members 4 to the both ends of the roll core 2 of the light-sensitive material roll 1, respectively, and attaching an end of the light-shielding leader 5 to the end of the long length light-sensitive material sheet 3 (first step), (2) step of winding the light-shielding leader 5 around the circumference of the light-sensitive material roll 1 while blowing hot wind onto the surfaces of the heat-shrinkable light-shielding film strips 7 to allow shrinkage of the heat-shrinkable light-shielding film strips 7, so that the heat-shrinkable light-shielding film strips can be contacted with (adhered to) the outer surfaces of the disk-shaped light-shielding members 4 (second step), (3) step of sealing the end of the wound light-shielding leader and the outside surface of light-shielding leader at a position corresponding to the previous round of winding with an adhesive tape 8*a (third step), and (*4) step of pressing heaters 9 against the surfaces of the heat-shrinkable light-shielding film strips 7 brought into contact with (adhered to) the outer surfaces of the disk-shaped light-shielding members in the above second step to fuse the heat-shrinkable light-shielding film strips to the outer surfaces of the disk-shaped light-shielding members 4 (fourth step).

Figure 4:
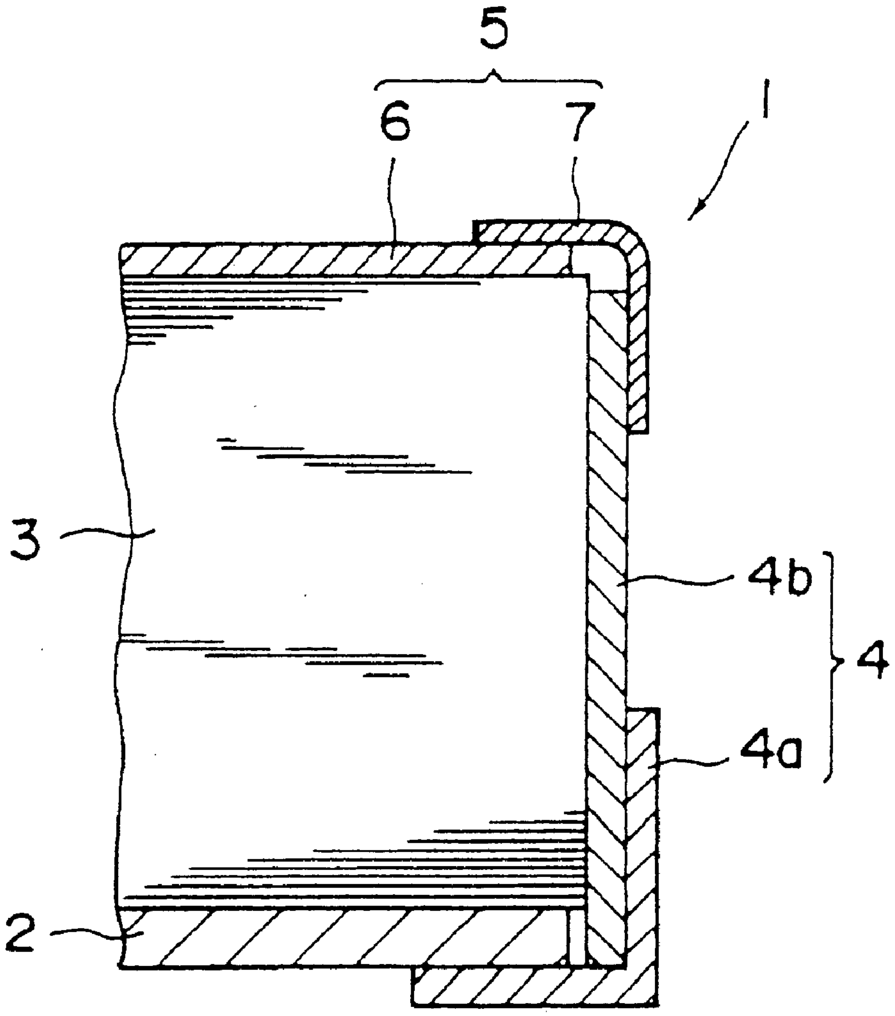
FIG. 4 shows a partial sectional view of an exemplary silver halide photographic light-sensitive material in the form of light-shielded light-sensitive material roll according to the present invention.

FIG. 4 shows a partial sectional view of a light-shielded light-sensitive material roll produced by the aforementioned steps. In the light-shielded light-sensitive material roll, the inner surfaces of the disk-shaped light-shielding members 4 are in contact with the both end surfaces of the long length light-sensitive material sheet 3 to shield the both ends of the long length light-sensitive material sheet 3 from light, the light-shielding sheet 6 of the light-shielding leader 5 is wound around the light-sensitive material sheet to shield the outer circumference surface of the long length light-sensitive material sheet 3 from light, and the heat-shrinkable light-shielding film strips 7 shield the gaps between the light-shielding sheet 6 and the disk-shaped light-shielding member 4 from light. Further, since the heat-shrinkable light-shielding film strips 7 of the light-shielding leader 5 are fused to the outer surfaces of the disk-shaped light-shielding members 4, the light-shielding leader is hardly separated from the light-sensitive material roll.

Figure 5:
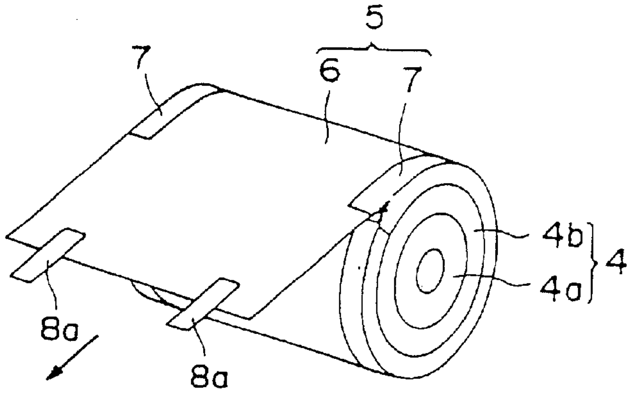
FIG. 5 shows schematic views of operations for rolling out a light-sensitive material sheet of the silver halide photographic light-sensitive material in the form of light-shielded light-sensitive material roll according to the present invention.
Figure 5:
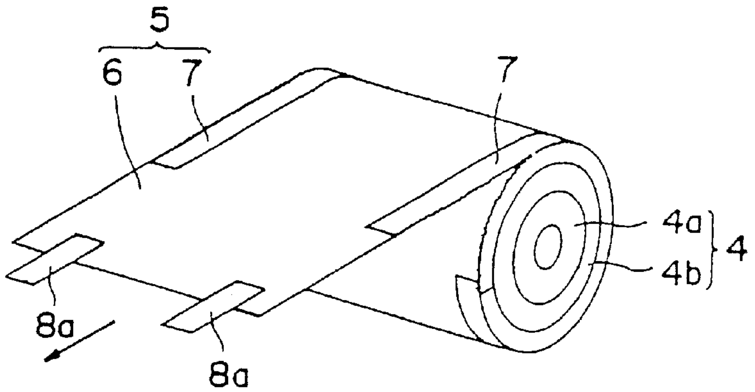
Figure 5:
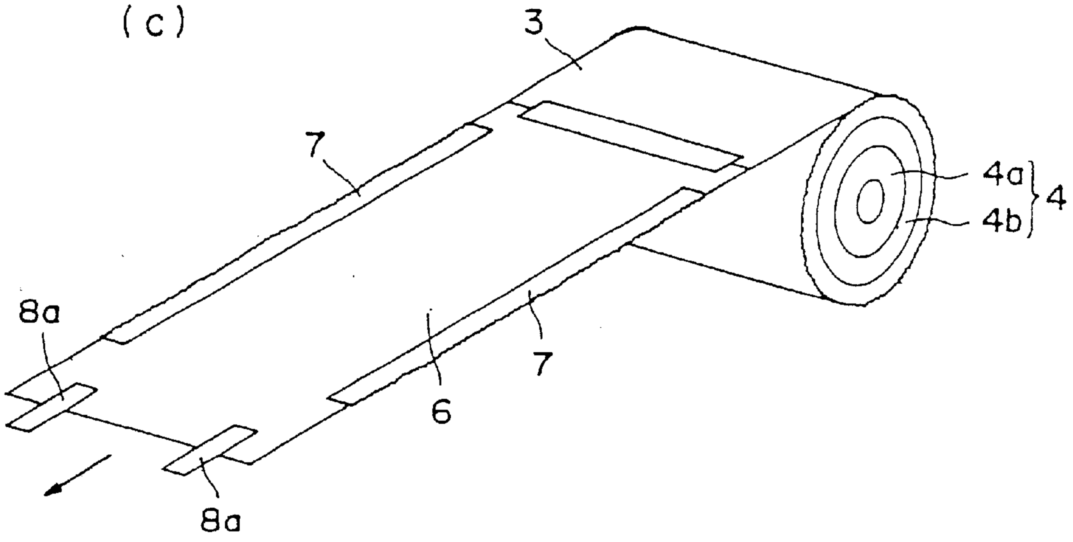

FIG. 5(*a*) to (*c*) are schematic views showing operations of rolling out the light-sensitive material sheet from the light-shielded light-sensitive material roll. Hereafter, the operations of taking out the light-sensitive material sheet from the light-shielded light-sensitive material roll will be explained by reference to the drawings. By pulling the light-shielding leader 5 of the light-shielded light-sensitive material roll in the direction indicated by the arrow head, the heat-shrinkable light-shielding film strips 7 of the light-shielding leader are torn at a position between a portion fused to the light-shielding sheet 6 and a portion adhered to the disk-shaped light-shielding member 4 (refer to FIG. 5(*a*)). In addition, in order to easily obtain this tear, it is preferable to preliminarily provide a cut in the heat-shrinkable light-shielding film strip on the end side. When the light-shielding leader is further pulled, the tear of the light-shielding leader is extended and the light-shielding leader is torn from the light-shielded light-sensitive material roll (refer to FIG. 5(*b*)). Further, if the light-shielding leader is pulled in the state that the heat-shrinkable light-shielding film strips 7 of the light-shielding leader are completely torn, the long length light-sensitive material sheet 3 can be taken out (refer to FIG. 5(*c*)).

When the light-shielding leader is rolled out from the light-shielded light-sensitive material roll by tearing the heat-shrinkable light-shielding film strips, the heat-shrinkable light-shielding film strips are preferably torn along the direction parallel to the side ends of the light-shielding sheet or a direction of going away from the side end of the light-shielding sheet. By tearing the heat-shrinkable light-shielding film strips in such a manner, it becomes unlikely that the transportation of the long length light-sensitive material sheet (including a case where the long length light-sensitive material sheet once rolled out is further rolled out and a case where the long length light-sensitive material sheet once rolled out is rolled around the roll core again) should be prevented by the heat-shrinkable light-shielding film strips remained on the disk-shaped light-shielding member side.

The direction along which the heat-shrinkable light-shielding film strip is torn is influenced by orientation of the heat-shrinkable light-shielding film strip. Therefore, the heat-shrinkable light-shielding film strip is preferably attached to the light-shielding sheet so that the orientation of the heat-shrinkable light-shielding film strip can be in parallel to the side end of the light-shielding sheet or the orientation should be in a direction of going away from the side end of the light-shielding sheet with respect to the side adhered to the long length light-sensitive material sheet when it constitutes a part of the light-shielding leader.

In addition, when the heat-shrinkable light-shielding film strip is of a laminate type, it is preferable to use a film substantially not having orientation as the light-shielding film and determine the orientation of the heat-shrinkable light-shielding film strip according to the orientation of the heat-shrinkable film (shrink film).

The light-sensitive material of the present invention preferably contains a hydrazine compound. It particularly preferably contains at least one kind of compound represented by the formula (D) as a nucleating agent.

Formula (D)

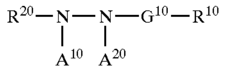

In the formula, $R^{20}$ represents an aliphatic group, an aromatic group or a heterocyclic group, $R^{10}$ represents a hydrogen atom or a blocking group, $G^{10}$ represents —CO—, —COCO—, —C(=S)—, $—SO_2—$, —SO— or —PO($R^{30}$)— group ($R^{30}$ is selected from the same range of groups defined for $R^{10}$, and $R^{30}$ may be different from $R^{10}$) or an iminomethylene group. $A^{10}$ and $A^{20}$ both represent a hydrogen atom, or one of them represents a hydrogen atom and the other represents a substituted or unsubstituted alkylsulfonyl group, a substituted or unsubstituted arylsulfonyl group or a substituted or unsubstituted acyl group.

In the formula (D), the aliphatic group represented by $R^{20}$ is preferably a substituted or unsubstituted straight, branched or cyclic alkyl, alkenyl or alkynyl group having 1–30 carbon atoms.

In the formula (D), the aromatic group represented by $R^{20}$ is a monocyclic or condensed-ring aryl group. Examples of the ring include benzene ring and naphthalene ring. The heterocyclic group represented by R20 is a monocyclic or condensed-ring, saturated or unsaturated, aromatic or non-aromatic heterocyclic group. Examples of the ring include pyridine ring, pyrimidine ring, imidazole ring, pyrazole ring, quinoline ring, isoquinoline ring, benzimidazole ring, thiazole ring, benzothiazole ring, piperidine ring, triazine ring and so forth.

R20 is preferably an aryl group, and especially preferably a phenyl group.

The group represented by R20 may be substituted with a substituent. Typical examples of the substituent include, for example, a halogen atom (fluorine, chlorine, bromine or iodine atom), an alkyl group (including an aralkyl group, a cycloalkyl group, an active methine group etc.), an alkenyl group, an alkynyl group, an aryl group, a heterocyclic group, a quaternized nitrogen atom-containing heterocyclic group (e.g., piperidinio group), an acyl group, an alkoxycarbonyl group, an aryloxycarbonyl group, a carbamoyl group, a carboxyl group or a salt thereof, a sulfonylcarbamoyl group, an acylcarbamoyl group, a sulfamoylcarbamoyl group, a carbazoyl group, an oxalyl group, an oxamoyl group, a cyano group, a thiocarbamoyl group, a hydroxy group, an alkoxy group (including a group containing a repeating unit of ethyleneoxy group or propyleneoxy group), an aryloxy group, a heterocyclyloxy group, an acyloxy group, an (alkoxy or aryloxy)carbonyloxy group, a carbamoyloxy group, a sulfonyloxy group, an amino group, an (alkyl, aryl or heterocyclyl) amino group, an N-substituted nitrogen-containing heterocyclic group, an acylamino group, a sulfonamido group, a ureido group, a thioureido group, an imido group, an (alkoxy or aryloxy)carbonylamino group, a sulfamoylamino group, a semicarbazido group, a thiosemicarbazido group, a hydrazino group, a quaternary ammonio group, an oxamoylamino group, an (alkyl or aryl) sulfonylureido group, an acylureido group, an N-acylsulfamoylamino group, a nitro group, a mercapto group, an (alkyl, aryl or heterocyclyl)thio group, an (alkyl or aryl)sulfonyl group, an (alkyl or aryl)sulfinyl group, a sulfo group or a salt thereof, a sulfamoyl group, an N-acylsulfamoyl group, a sulfonylsulfamoyl group or a salt thereof, a group having phosphonamide or phosphoric acid ester structure and so forth.

These substituents may be further substituted with any of these substituents.

Preferred examples of the substituent that $R^{20}$ may have include an alkyl group having 1–30 carbon atoms (including an active methylene group), an aralkyl group, a heterocyclic group, a substituted amino group, an acrylamino group, a sulfonamido group, a ureido group, a sulfamoylamino group, an imido group, a thioureido group, a phosphoramido group, a hydroxyl group, an alkoxy group, an aryloxy group, an acyloxy group, an acyl group, an alkoxycarbonyl group, an aryloxycarbonyl group, a carbamoyl group, a carboxyl group or a salt thereof, an (alkyl, aryl or heterocyclyl)thio group, a sulfo group or salt thereof, a sulfamoyl group, a halogen atom, a cyano group, a nitro group and so forth.

In the formula (D), $R^{10}$ represents a hydrogen atom or a blocking group, and specific examples of the blocking group include an alkyl group, an alkenyl group, an alkynyl group, an aryl group, a heterocyclic group, an alkoxy group, an aryloxy group, an amino group and hydrazino group.

The alkyl group represented by $R^{10}$ is preferably an alkyl group having 1–10 carbon atoms. Specific examples of the alkyl group include methyl group, trifluoromethyl group, difluoromethyl group, 2-carboxytetrafluoroethyl group, pyridiniomethyl group, difluoromethoxymethyl group, difluorocarboxymethyl group, 3-hydroxypropyl group, methanesulfonamidomethyl group, benzenesulfonamidomethyl group, hydroxymethyl group, methoxy-methyl group, methylthiomethyl group, phenylsulfonylmethyl group, o-hydroxybenzyl group and so forth. The alkenyl group is preferably an alkenyl group having 1–10 carbon atoms. Examples of the alkenyl group include vinyl group, 2,2-dicyanovinyl group, 2-ethoxycarbonylvinyl group, 2-trifluoro-2-methoxycarbonylvinyl group and so forth. The alkynyl group is preferably an alkynyl group having 1–10 carbon atoms. Examples of the alkynyl group include an ethynyl group, 2-methoxycarbonylethynyl group and so forth. The aryl group is preferably a monocyclic or condensed-ring aryl group, and especially preferably an aryl group containing a benzene ring. Examples of the aryl group include phenyl group, 3,5-dichlorophenyl group, 2-methanesulfonamidophenyl group, 2-carbamoylphenyl group, 4-cyanophenyl group, 2-hydroxymethyl-phenyl group and so forth.

The heterocyclic group is preferably a 5- or 6-membered, saturated or unsaturated, monocyclic or condensed-ring heterocyclic group that contains at least one nitrogen, oxygen or sulfur atom, and it may be a heterocyclic group containing a quaternized nitrogen atom. Examples of the heterocyclic group include a morpholino group, a piperidino group (N-substituted), a piperazino group, an imidazolyl group, an indazolyl group (e.g., 4-nitroindazolyl group etc.), a pyrazolyl group, a triazolyl group, a benzimidazolyl group, a tetrazolyl group, a pyridyl group, a pyridinio group (e.g., N-methyl-3-pyridinio group), a quinolinio group, a quinolyl group and so forth. Among these, especially preferred are a morpholino group, a piperidino group, a pyridyl group, pyridinio group and so forth.

The alkoxy group is preferably an alkoxy group having 1–8 carbon atoms. Examples of the alkoxy group include methoxy group, 2-hydroxyethoxy group, benzyloxy group and so forth. The aryloxy group is preferably a phenyloxy group. The amino group is preferably an unsubstituted amino group, an alkylamino group having 1–10 carbon atoms, an arylamino group or a saturated or unsaturated heterocyclylamino group (including a quaternized nitrogen atom-containing heterocyclic group). Examples of the amino group include 2,2,6,6-tetramethylpiperidin-4-ylamino group, propylamino group, 2-hydroxyethylamino group, anilino group, o-hydroxyanilino group, 5-benzotriazolylamino group, N-benzyl-3-pyridinioamino group and so forth. The hydrazino group is especially preferably a substituted or unsubstituted hydrazino group, a substituted or unsubstituted phenylhydrazino group (e.g., 4-benzenesulfonamidophenylhydrazino group) or the like.

The group represented by $R^{10}$ may be substituted with a substituent. Preferred examples of the substituent are the same as those exemplified as the substituent of $R^{20}$.

In the formula (D), $R^{10}$ may be a group capable of splitting the $G^{10}$ —$R^{10}$ moiety from the residual molecule and subsequently causing a cyclization reaction producing a cyclic structure containing atoms of the —$G^{10}$ —$R^{10}$ moiety. Examples of such a group include those described in, for example, JP-A-63-29751.

The hydrazine derivatives represented by the formula (D) may contain an absorbing group capable of being absorbed onto silver halide. Examples of the absorbing group include an alkylthio group, an arylthio group, a thiourea group, a thioamido group, a mercaptoheterocyclic group, a triazole group and so forth, described in U.S. Pat. Nos. 4,385,108 and 4,459,347, JP-A-59-195233, JP-A-59-200231, JP-A-59-201045, JP-A-59-201046, JP-A-59-201047, JP-A-59-201048, JP-A-59-201049, JP-A-61-170733, JP-A-61-270744, JP-A-62-948, JP-A-63-234244, JP-A-63-234245 and JP-A-63-234246. Further, these groups capable of being absorbed onto silver halide may be modified into a precursor thereof. Examples of the precursor include those groups described in JP-A-2-285344.

$R^{10}$ or $R^{20}$ in the formula (D) may contain a polymer or ballast group that is usually used for immobile photographic additives such as couplers. The ballast group used in the present invention means a group having 6 or more carbon atoms including a linear or branched alkyl group (or an alkylene group), an alkoxy group (or an alkyleneoxy group), an alkylamino group (or an alkyleneamino group), an alkylthio group and a group having any of these groups as a partial structure, more preferably a group having 7–24 carbon atoms including a linear or branched alkyl group (or an alkylene group), an alkoxy group (or an alkyleneoxy group), an alkylamino group (or an alkyleneamino group), an alkylthio group and a group having any of these groups as a partial structure. Examples of the polymer include those described in, for example, JP-A-1-100530.

$R^{10}$ or $R^{20}$ in the formula (D) may contain a plurality of hydrazino groups as substituents. In such a case, the compound represented by the formula (D) is a multi-mer for hydrazino group. Specific examples of such a compound include those described in, for example, JP-A-64-86134, JP-A-4-16938, JP-A-5-197091, WO95/32452, WO95/32453, JP-A-9-179229, JP-A-9-235264, JP-A-9-235265, JP-A-9-235266, JP-A-9-235267 and so forth.

$R^{10}$ or $R^{20}$ in the formula (D) may contain a cationic group (specifically, a group containing a quaternary ammonio group, a group containing a quaternized phosphorus atom, a nitrogen-containing heterocyclic group containing a quaternized nitrogen atom etc.), a group containing a repeating unit of ethyleneoxy group or propyleneoxy group, an (alkyl, aryl or heterocyclyl)thio group, or a dissociating group (this means a group or partial structure having a proton of low acidity that can be dissociated with an alkaline developer or a salt thereof, specifically, for example, carboxyl group/—COOH, sulfo group/—$SO_3H$, phosphonic acid group/—$PO_3H$, phosphoric acid group/—$OPO_3H$, hydroxy group/—OH, mercapto group/—SH, —$SO_2NH_2$ group, N-substituted sulfonamido group/—$SO_2NH$—, —$CONHSO_2$— group, —$CONHSO_2NH$— group, —$NHCONHSO_2$— group, —$SO_2NHSO_2$— group, —CONHCO— group, active methylene group, —NH— group contained in a nitrogen-containing heterocyclic group, a salt thereof etc.). Examples of the compounds containing these groups include those described in, for example, JP-A-7-234471, JP-A-5-333466, JP-A-6-19032, JP-A-6-19031, JP-A-5-45761, U.S. Pat. Nos. 4,994,365 and 4,988,604, JP-A-7-259240, JP-A-7-5610, JP-A-7-244348, and German Patent No. 4006032, JP-A-11-7093 and so forth.

In the formula (D), $A^{10}$ and $A^{20}$ each represent a hydrogen atom or an alkyl— or arylsulfonyl group having 20 or less carbon atoms (preferably, phenylsulfonyl group, or a phenylsulfonyl group substituted with substituent(s) so that the total of the Hammett substituent constant of the substituent(s) can become −0.5 or more), or an acyl group having 20 or less carbon atoms (preferably, benzoyl group, a benzoyl group substituted with substituent(s) so that the total of the Hammett substituent constant of the substituent(s) can become −0.5 or more, or a straight, branched or cyclic, substituted or unsubstituted, aliphatic acyl group (examples of the substituent include a halogen atom, an ether group, a sulfonamido group, a carbonamido group, a hydroxyl group, a carboxyl group, a sulfo group etc.). $A^{10}$ and $A^{20}$ each most preferably represent a hydrogen atom.

Hereafter, especially preferred hydrazine derivatives for the present invention are explained.

$R^{20}$ is especially preferably a substituted phenyl group. Particularly preferred as the substituent are a sulfonamido group, an acylamino group, a ureido group, a carbamoyl group, a thioureido group, an isothioureido group, a sulfamoylamino group, an N-acylsulfamoylamino group and so forth, further preferred are a sulfonamido group and a ureido group, and the most preferred is a sulfonamido group.

The hydrazine derivatives represented by the formula (D) preferably have at least one substituent, directly or indirectly on $R^{20}$ or $R^{10}$, selected from the group consisting of a ballast group, a group that can be absorbed on silver halide, a group containing quaternary ammonio group, a nitrogen-containing heterocyclic group containing a quaternized nitrogen atom, a group containing a repeating unit of ethyleneoxy group, an (alkyl, aryl or heterocyclyl)thio group, and a dissociating group capable of dissociating in an alkaline developer, and a hydrazino group capable of forming a multi-mer (group represented by —NHNH—$G^{10}$—$R^{10}$). Furthermore, $R^{20}$ preferably directly or indirectly has one group selected from the aforementioned groups, and $R^{20}$ is most preferably a phenyl group substituted with a benzenesulfonamido group directly or indirectly having one of the aforementioned groups on the benzene ring constituting the benzenesulfonamido group.

Among those groups represented by $R^{10}$, when $G^{10}$ is —CO— group, preferred are a hydrogen atom, an alkyl group, an alkenyl group, an alkynyl group, an aryl group and a heterocyclic group, more preferred are a hydrogen atom, an alkyl group or a substituted aryl group (the substituent is especially preferably an electron-withdrawing group or o-hydroxymethyl group), and the most preferred are a hydrogen atom and an alkyl group.

When $G^{10}$ is —COCO— group, an alkoxy group, an aryloxy group, and an amino group are preferred, and a substituted amino group, specifically an alkylamino group, an arylamino group and a saturated or unsaturated heterocyclylamino group are especially preferred.

Further, when $G^{10}$ is —$SO_2$— group, $R^{10}$ is preferably an alkyl group, an aryl group or a substituted amino group.

In the formula (D), $G^{10}$ is preferably —CO— group or —COCO— group, especially preferably —CO— group.

Specific examples of the compounds represented by the formula (D) are illustrated below, but the present invention is not limited to the following compounds.

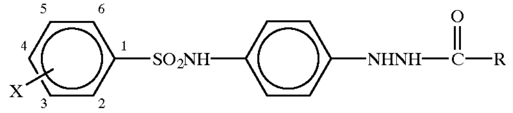
| | | R = | | | |
|---|---|---|---|---|---|
| | X = | —H | $—C_2F_4—COOH$ (or $—C_2F_4—COO^{\ominus}K^{\oplus}$) | 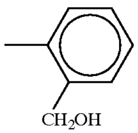 | 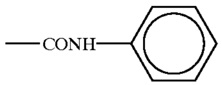 |
| D-1 | 3-$NHCOC_9H_{19}$(n) | 1 a | 1 b | 1 c | 1 d |
| D-2 | 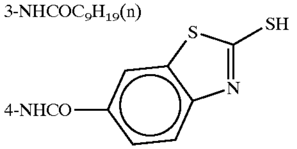 | 2 a | 2 b | 2 c | 2 d |
| D-3 | 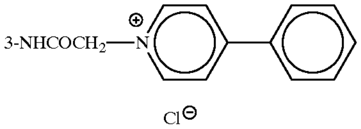 | 3 a | 3 b | 3 c | 3 d |
| D-4 | 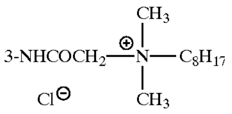 | 4 a | 4 b | 4 c | 4 d |
| D-5 | 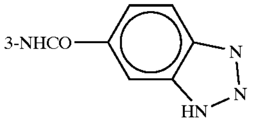 | 5 a | 5 b | 5 c | 5 d |
| D-6 | 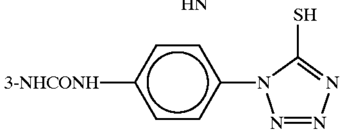 | 6 a | 6 b | 6 c | 6 d |
| D-7 | 2,4-$(CH_3)_2$-3-$SC_2H_4—OC_2H_4)_{4—OC8}H_{17}$ | 7 a | 7 b | 7 c | 7 d |

-continued
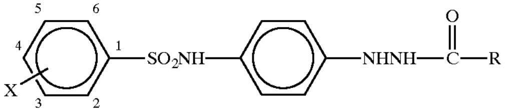
| | | R = | | | |
|---|---|---|---|---|---|
| | X = | —H | $—CF_2H$ | 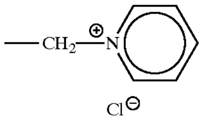 | 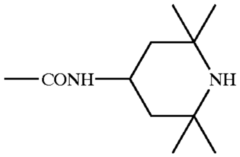 |
| D-8 | 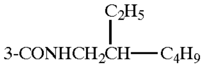 | 8 a | 8 e | 8 f | 8 g |
| D-9 | $6\text{-}OCH_3\text{-}3\text{-}C_5H_{11}(t)$ | 9 a | 9 e | 9 f | 9 g |
| D-10 | 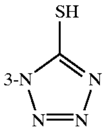 | 10 a | 10 e | 10 f | 10 g |
| D-11 | 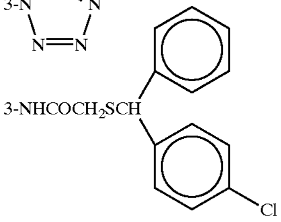 | 11 a | 11 e | 11 f | 11 g |
| D-12 | 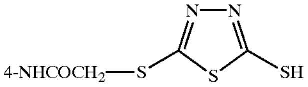 | 12 a | 12 e | 12 f | 12 g |
| D-13 | 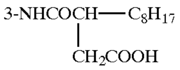 | 13 a | 13 e | 13 f | 13 g |
| D-14 | 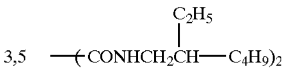 | 14 a | 14 e | 14 f | 14 g |

-continued
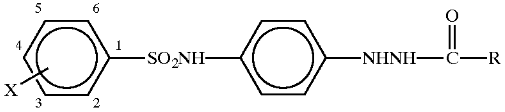
| | Y = | X = —CHO | X = —$COCF_3$ | X = —$SO_2CH_3$ | X = 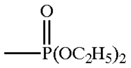 |
|---|---|---|---|---|---|
| D-15 | 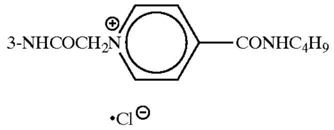 | 15 a | 15 h | 15 i | 15 j |
| D-16 | 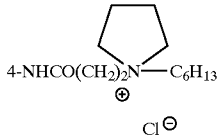 | 16 a | 16 h | 16 i | 16 j |
| D-17 | 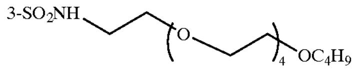 | 17 a | 17 h | 17 i | 17 j |
| D-18 | 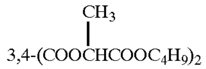 | 18 a | 18 h | 18 i | 18 j |
| D-19 | 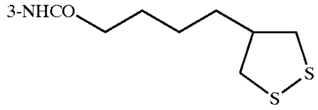 | 19 a | 19 h | 19 i | 19 j |
| D-20 | 3-$NHSO_2NH$—$C_8H_{17}$ | 20 a | 20 h | 20 i | 20 i |
| D-21 | 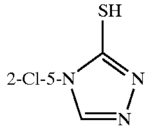 | 21 a | 21 h | 21 i | 21 j |

-continued
| | | R = | | | |
|---|---|---|---|---|---|
| | | —H | $—CF_2H$ | 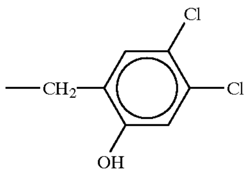 | $—CONHC_3H_7$ |
| D-22 | 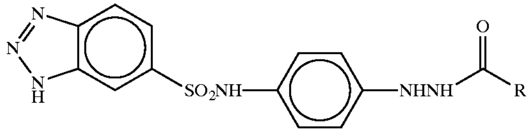 | 22 a | 22 e | 22 k | 22 l |
| D-23 | 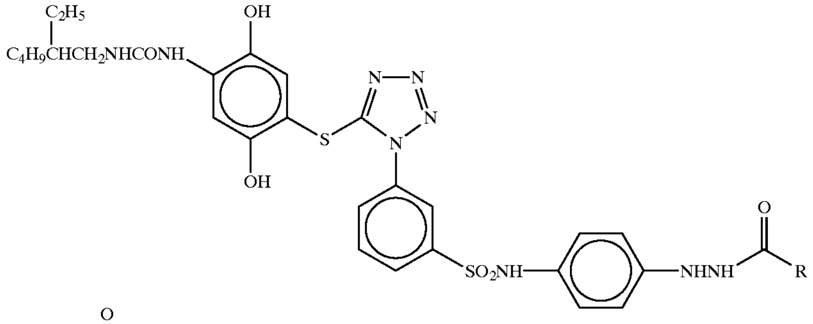 | 23 a | 23 e | 23 k | 23 l |
| D-24 | 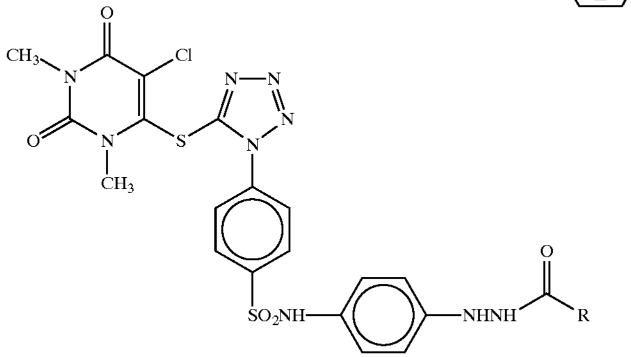 | 24 a | 24 e | 24 k | 24 l |

-continued
| | | | | | |
|---|---|---|---|---|---|
| D-25 | 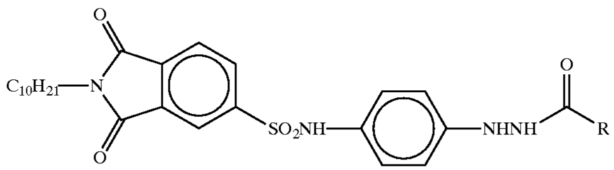 | 25 a | 25 e | 25 k | 25 l |
| D-26 | 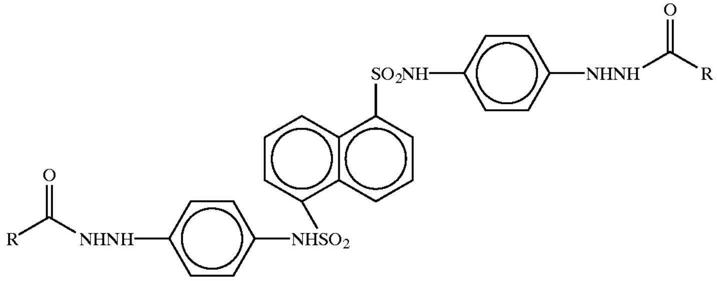 | 26 a | 26 e | 26 k | 26 l |
| D-27 | 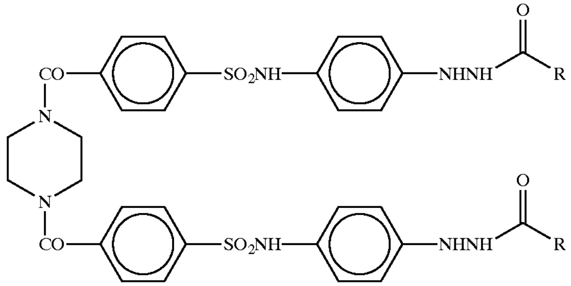 | 27 a | 27 e | 27 k | 27 l |
| D-28 | 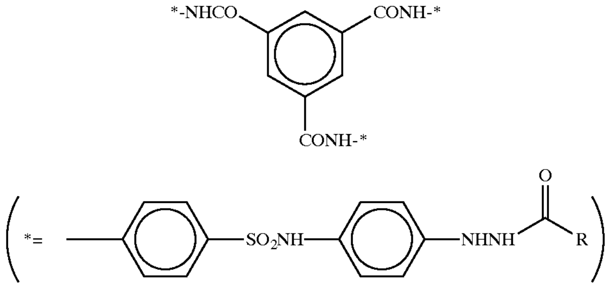 | 28 a | 28 e | 28 k | 28 l |

-continued
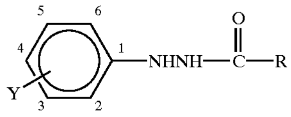
| | Y = | R = —H | —$CH_2OCH_3$ | 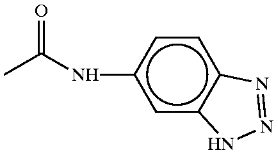 | 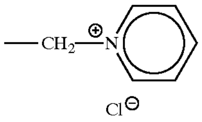 |
|---|---|---|---|---|---|
| D-29 | 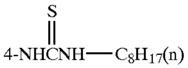 | 29 a | 29 m | 29 n | 29 f |
| D-30 | 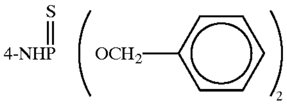 | 30 a | 30 m | 30 n | 30 f |
| D-31 | 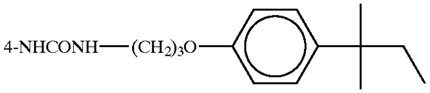 | 31 a | 31 m | 31 n | 31 f |
| D-32 | 4-OH 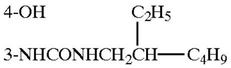 | 32 a | 32 m | 32 n | 32 f |
| D-33 | 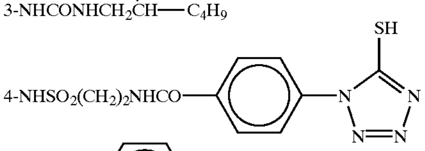 | 33 a | 33 m | 33 n | 33 f |
| D-34 | 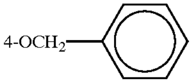 | 34 a | 34 m | 34 n | 34 f |
| D-35 | 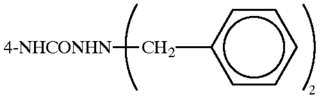 | 35 a | 35 m | 35 n | 35 f |

-continued
| | Y = | 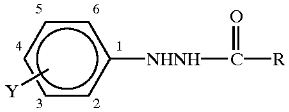 R = | | | |
|---|---|---|---|---|---|
| | | —H | —$C_3F_8$—COOH | —$CONHCH_3$ | 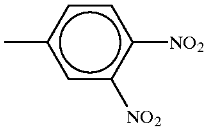 |
| D-36 | 4-NHCONH$(CH_2)_3$S 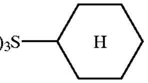 | 36 a | 36 o | 36 p | 36 q |
| D-37 | 2-$OCH_3$-4-$NHSO_2C_{12}H_{25}$ | 37 a | 37 o | 37 p | 37 q |
| D-38 | 3-$NHCOC_{11}H_{23}$-4-$NHSO_2CF_3$ | 38 a | 38 o | 38 p | 38 q |
| D-39 | 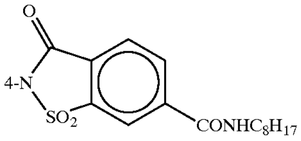 | 39 a | 39 o | 39 p | 39 q |
| D-40 | 4-$OCO(CH_2)_2COOC_6H_{13}$ | 40 a | 40 o | 40 p | 40 q |
| D-41 | 4-NHCONH 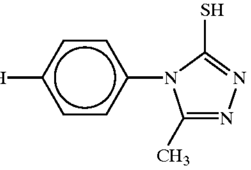 | 41 a | 41 o | 41 p | 41 q |
| D-42 | 4-NHCO 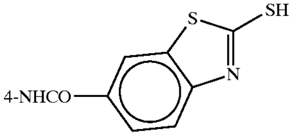 | 42 a | 42 o | 42 p | 42 q |

-continued
D-43
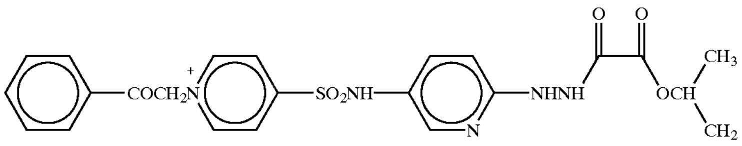
D-44
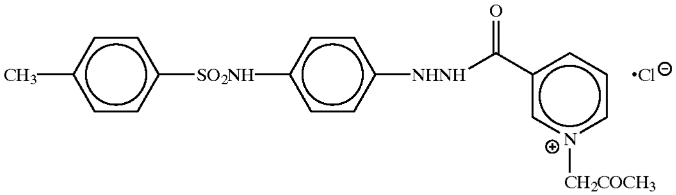
D-45
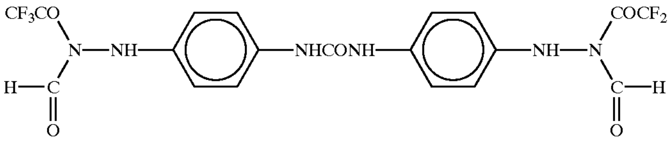
D-46
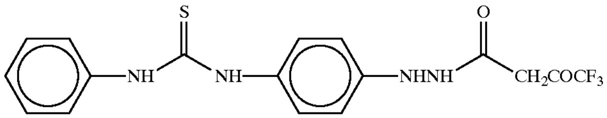
D-47
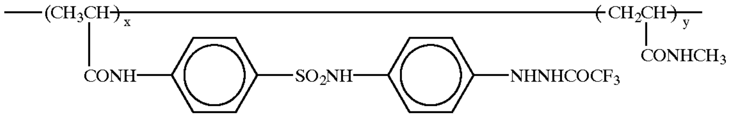
x:y=3:97 MW (average) = 100,000
D-48
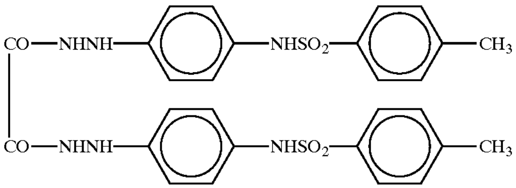

-continued
D-49
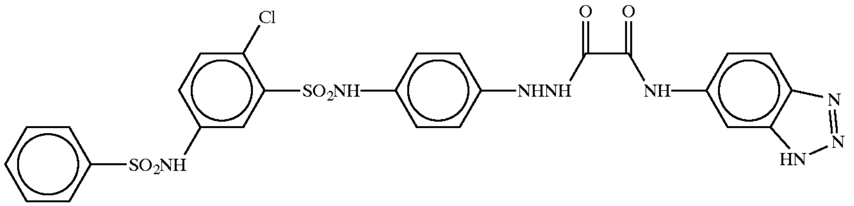
No.
D-50
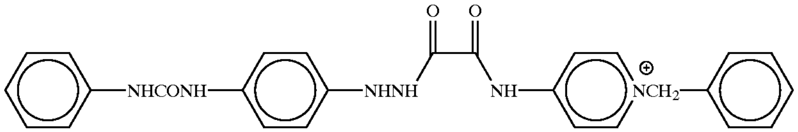
D-51
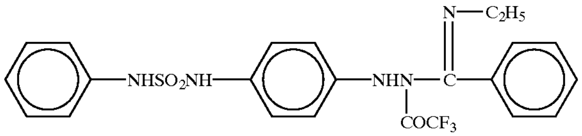
D-52
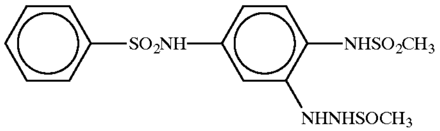
D-53
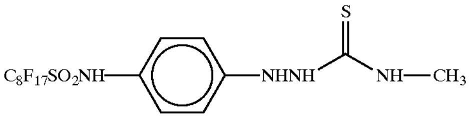
D-54
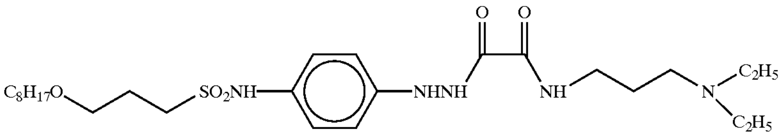

-continued
D-55
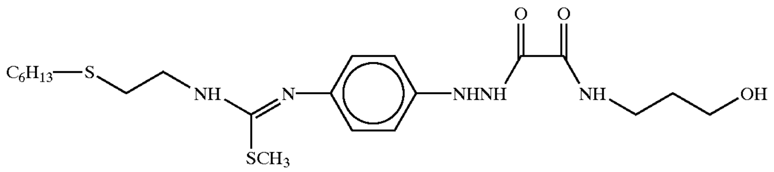
D-56
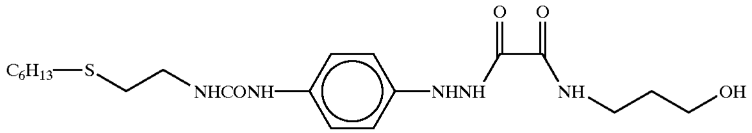
D-57
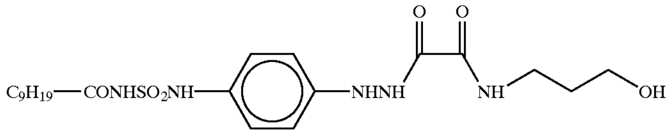
D-58
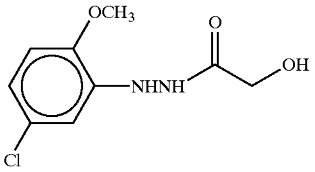
D-59
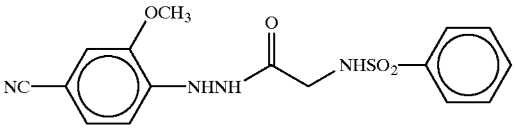
D-60
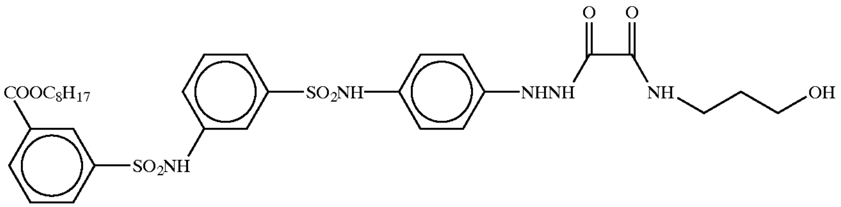

-continued
D-61
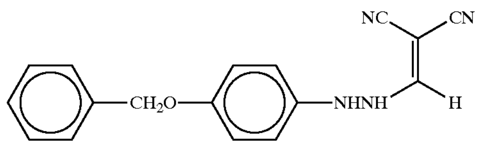
D-62
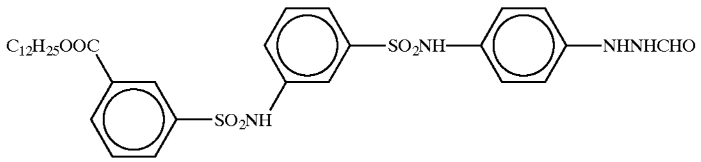
D-63
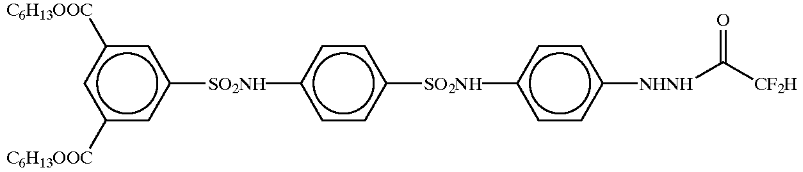
D-64
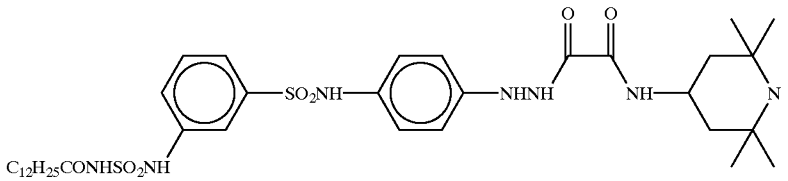
D-65
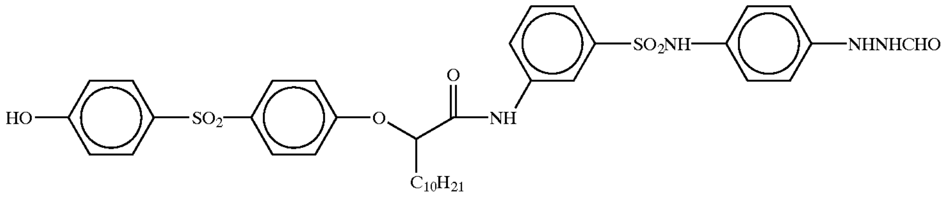

-continued
D-66 D-66
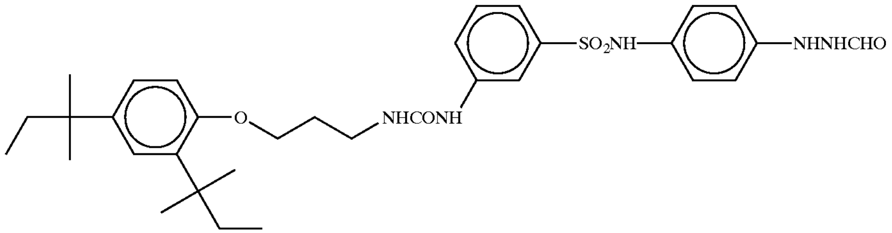
D-67 D-67
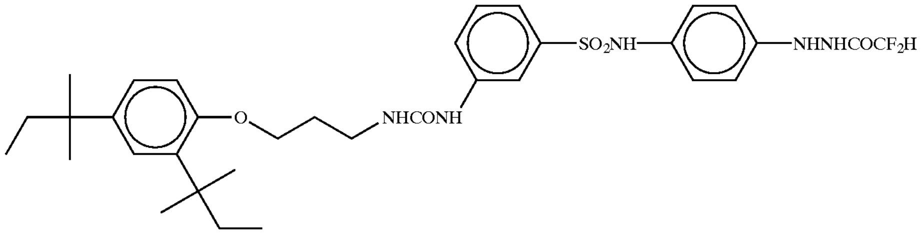

As the hydrazine derivatives used in the present invention, in addition to the above, the following hydrazine derivatives can also preferably be used. The hydrazine derivatives used in the present invention can be synthesized by various methods described in the following patent documents.

Compounds represented by (Chemical formula 1) described in Japanese Patent Publication (Kokoku, hence forth referred to as "JP-B") No. 6-77138, specifically, compounds described on pages 3 and 4 of the same; compounds represented by formula (I) described in JP-B-693082, specifically, Compounds 1 to 38 described on pages 8 to 18 of the same; compounds represented by formulas (4), (5), and (6) described in JP-A-6-230497, specifically, Compound 4-1 to Compound 4-10 described on pages 25 and 26, Compound 5-1 to Compound 5-42 described on pages 28 to 36 and Compound 6-1 to Compound 6-7 described on pages 39 and 40 of the same, respectively; compounds represented by formulas (1) and (2) described in JP-A-6-289520, specifically, Compounds 1-1) to 1-17) and 2-1) described on pages 5 to 7 of the same; compounds represented by (Chemical formula 2) and (Chemical formula 3) described in JP-A-6-313936, specifically, compounds described on pages 6 to 19 of the same; compounds represented by (Chemical formula 1) described in JP-A-6-313951, specifically, compounds described on pages 3 to 5 of the same; compounds represented by formula (I) described in JP-A-7-5610, specifically, Compounds I-1 to I-38 described on pages 5 to 10 of the same; compounds represented by formula (II) described in JP-A-7-77783, specifically, Compounds II-1 to II-102 described on pages 10 to 27 of the same; compounds represented by formulas (H) and (Ha) described in JP-A-7-104426, specifically, Compounds H-1 to H-44 described on pages 8 to 15 of the same; compounds that have an anionic or nonionic group for forming an intramolecular hydrogen bond with the hydrogen atom of the hydrazine in the vicinity of the hydrazine group described in JP-A-9-22082, especially compounds represented by formulas (A), (B), (C), (D), (E) and (F), specifically, Compounds N-1 to N-30 described in the same; compounds represented by formula (1) described in JP-A-9-22082, specifically, Compounds D-1 to D-55 described in the same as well as the hydrazine derivatives described in WO95/32452, WO95/32453, JP-A-9-179229, JP-A-9-235264, JP-A-9-235265, JP-A-9-235266, JP-A-9-235267, JP-A-9-319019, JP-A-9-319020, JP-A-10-130275, JP-A-11-7093, JP-A-6-332096, JP-A-7-209789, JP-A-8-6193, JP-A-8-248549, JP-A-8-248550, JP-A-8-262609, JP-A-8-314044, JP-A-8-328184, JP-A-9-80667, JP-A-9-127632, JP-A-9-146208, JP-A-9-160156, JP-A-10-161260, JP-A-10-221800, JP-A-10-213871, JP-A-10-254082, JP-A-10-254088, JP-A-7-120864, JP-A-7-244348, JP-A-7-333773, JP-A-8-36232, JP-A-8-36233, JP-A-8-36234, JP-A-8-36235, JP-A-8-272022, JP-A-9-22083, JP-A-9-22084, JP-A-9-54381 and JP-A-10-175946.

The hydrazine compounds used in the present invention characterized by being a dimer formed by binding monomers containing both of an acylhydrazide moiety and a nicotinamide moiety with a bridging group will be explained. They are used as a nucleating agent (high contrast agent), and specifically represented by the following formula (1) or (2).

Formula (1)

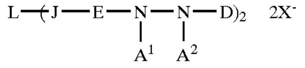

Formula (2)

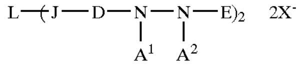

In the formulas, the monomers bonded through a bridging group L may be identical to or different from each other, J represents a nicotinamido residue, E represents a substituted aryl or a heterocyclic ring, either $A^1$ or $A^2$ represents a hydrogen atom and the other represents a hydrogen atom, or an acyl group, an alkylsulfonyl group or an arylsulfonyl group, which may be substituted, D represents a blocking group, L represents a bridging group, and $X^-$ represents an anionic counter ion.

The compounds represented by the following formula (3), (4) or (5) are more preferred, and the compounds of the formula (3) are especially preferred.

Formula (3)

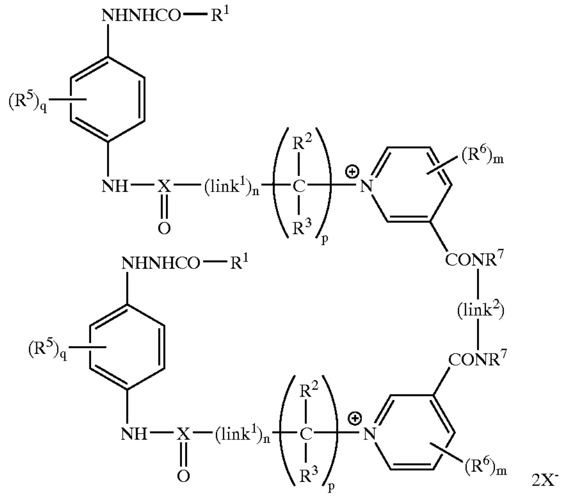

Formula (4)

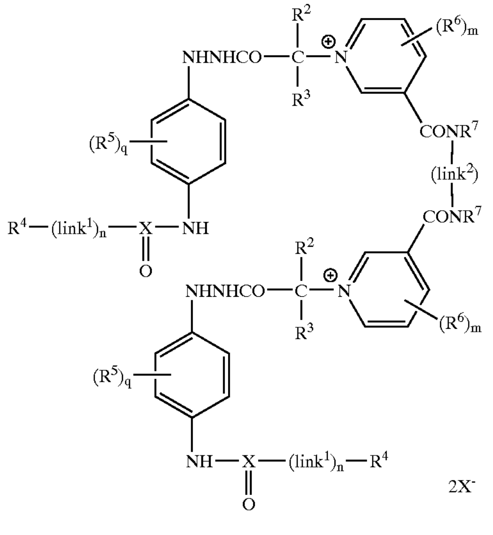

-continued

Formula (5)

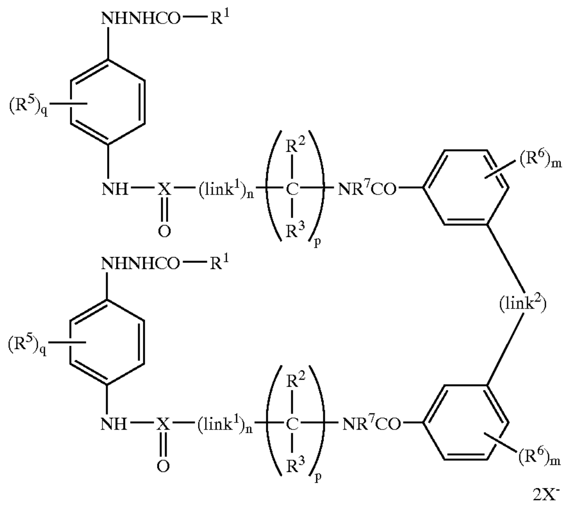

In these compounds, each $R^1CO$ comprises a blocking group, and $R^1$ in each compound may be identical to or different from each other, and selected from a hydrogen atom, an unsubstituted or substituted alkyl group, an aryl group, an alkoxycarbonyl group or an aryloxycarbonyl group and an alkylaminocarbonyl group or an arylaminocarbonyl group, or each $R^1$ may be an unsubstituted or substituted heterocyclic group having a 5- or 6-membered ring containing at least one nitrogen atom, oxygen atom or sulfur atom or contains such a heterocyclic group. The ring may be bonded directly or via an alkyl group, an alkoxy group, a carbonyl group or an aminocarbonyl group to the carbonyl group, and the ring may be condensed to the benzene ring. $R^2$, $R^3$ and $R^7$ in each compound may be identical to or different from each other, and selected from a hydrogen atom, an unsubstituted or substituted alkyl group and aryl group, and p is 0 or 1. $R^4$, $R^5$ and $R^6$ in each compound may be identical to or different from each other, and individually or collectively selected from a hydrogen atom, a halogen atom, a hydroxy group, a cyano group, an unsubstituted or substituted alkyl group, an aryl group, a heterocyclic group, an alkoxy group, an acyloxy group, an aryloxy group, a carbonamido group, a sulfonamido group, a ureido group, a thioureido group, a semicarbazido group, a thiosemicarbazido group, a urethane group, a quaternary ammonium group, an alkylthio group, an arylthio group, an alkylsulfonyl group, an arylsulfonyl group, an alkylsulfinyl group, an arylsulfinyl group, a carboxyl group, an alkoxycarbonyl group, an aryloxycarbonyl group, a carbamoyl group, a sulfamoyl group, a phosphonamido group, a diacylamino group, an imido group, an acylurea group, a group containing a selenium atom or tellurium atom and a group having a tertiary sulfonium structure, q and m in each compound may be identical to or different from each other, q is an integer of 0–4, and m is an integer of 0–3. X in each compound may be identical to or different from each other, and selected from C, S═O and C—NH. ($link^1$) in each compound may be identical to or different from each other, and selected from an unsubstituted or substituted alkylene group, a polyalkylene group, an aryl group, an arylaminocarbonyl group and a heterocyclic group, and n in each compound is 0 or 1. ($link^2$) in each compound is a bridging group selected from an unsubstituted or substituted polyalkylene group, a polyalkylene oxide group, a polyalkylene group containing one or more hetero atoms selected from a nitrogen atom, oxygen atom and sulfur atom, which are separated by an alkylene group, and an unsubstituted or substituted polyalkylene group in which alkylene groups are separated by an unsubstituted or substituted aryl group or a heterocyclic group, and $X^-$ is an anionic counter ion.

The term "alkyl" used herein means a linear or branched, unsubstituted or substituted alkyl group (including an alkenyl group) having 1–20 atoms, and it includes a cycloalkyl group having 3–8 carbon atoms. The term "aryl" includes an aralkyl group (and a specific condensed aryl group) in the scope thereof. The term "heterocyclic ring" specifically includes a condensed heterocyclic ring in the scope thereof. The term "polyalkylene group" is defined as a group of $(CH_2)_n$ (n is an integer of 2–50). Further, the term "blocking group" refers to a group that is suitable for protecting a hydrazine group, but can be readily removed, if required.

$R^1$ may be a hydrogen atom or an unsubstituted or substituted alkyl group (e.g., methyl group, trifluoromethyl group, 1,3-methylsulfonamidopropyl group, methylsulfonylmethyl group, phenylsulfonylmethyl group, carboxytetrafluoroethyl group), an unsubstituted or substituted aryl group (e.g., phenyl, 3,5-dichlorophenyl, o-methanesulfonamidophenyl, 4-methanesul-fonylphenyl, 2-(2'-hydroxyethyl)phenyl, 2-hydroxy-4-methyl-phenyl, o-hydroxybenzyl group) or a carbonyl-containing group (e.g., an alkylaminocarbonyl group, an alkoxycarbonyl group, an aryloxycarbonyl group or a hydroxyalkylaminocarbonyl group), or contain imidazolyl group, pyrazolyl group, triazolyl group, tetrazolyl group, pyridyl group, pyridinium group, piperidinyl group, morpholino group, quinolinium group or quinolinyl group, or $R^1$ may contain a group cleaving a photographically useful group, such as phenylmercaptotetrazole group or 5- or 6-nitroindazole group. Some examples of these are disclosed in U.S. Pat. No. 5,328,801. R2 and $R^3$ preferably represent a hydrogen atom or an alkyl group for which p is preferably 1, and $R^4$, $R^5$ and $R^6$ preferably represent a hydrogen atom or an alkyl group or alkoxy group for which q is preferably 0 or 1 and m is preferably 0. $R^7$ preferably represents a hydrogen atom or an alkyl group optionally substituted with, for example, a dialkylamino group.

When X is S═O, it is preferred that n is 1 and ($link^1$) contains an arylamino group or an arylaminocarbonyl group, preferably a phenylaminocarbonyl group of which ring may be substituted with one or more kinds of alkyl groups, carbonyl group or halogen atoms. When X is C or C—NH, it is preferred that n is 0 and the group ($link^1$) does not exist.

The ($link^2$) group preferably contains an alkylene group, preferably a polyalkylene group generally containing 4-6 methylene groups (they may be separated by one or more 0 atoms or S atoms). For example, ($link^2$) may be $(CH_2)_4$, $(CH_2)_6$, $(CH_2)_2S\ (CH_2)_2$ or $(CH_2)_2O(CH_2)_2O(CH_2)_2$. Alternatively, ($link_2$) be an polyalkylene oxide chain extended with methylene groups of an even number, for example, $(CH_2CH_2O)_{14}CH_2CH$, or it may contain, for example, $CH_2C_6H_4CH_2$ group.

The anionic counter ion may be any of those well known in the field, and may be generally selected from $Cl^-$, $Br^-$, $I^-$, $CF_3COO^-$, $CH_3SO_3^-$ and $TsO^-$.

Unless otherwise indicated, substituents that can exist on the aforementioned compounds include any substituted or unsubstituted groups that do not degrade characteristics required for photographic practicality. The substituents include those substituted with any one (or two or more) of the groups mentioned in the present specification.

The substituent may preferably be a halogen atom, or may be bonded to the other moiety of the molecule via a carbon, silicon, oxygen, nitrogen, phosphorus or sulfur atom. Examples of the substituent include, for example, a halogen such as chlorine, bromine or fluorine; nitro; hydroxyl; cyano; carboxyl; and groups including an alkyl group including linear or branched alkyl (e.g., methyl group, trifluoromethyl group, ethyl group, tert-butyl group, 3-(2,4-di-tert-amylphenoxy)propyl group and tetradecyl group); an alkenyl group such as ethylene group and 2-butene group; an alkoxy group such as methoxy group, ethoxy group, propoxy group, butoxy group, 2-methoxyethoxy group, sec-butoxy group, hexyloxy group, 2-ethylhexyloxy group, tetradecyloxy group, 2-(2,4-di-tert-pentylphenoxy)ethoxy group and 2-dodecyloxyethoxy group; an aryl group such as phenyl group, 4-tert-butylphenyl group, 2,4,6-trimethylphenyl group and naphthyl group; an aryloxy group such as phenoxy group, 2-methylphenoxy group, a- or β-naphthyloxy group and 4-tolyloxy group; a carbonamido group such as acetamido group, benzamido group, butylamido group, tetradecanamido group, a-(2,4-di-tert-pentylphenoxy) acetamido group, a-(2,4-di-tert-pentylphenoxy)butylamido group, a-(3-pentadecylphenoxy)hexanamido group, a-(4-hydroxy-3-tert-butylphenoxy)tetradecanamido group, 2-oxo-pyrrolidin-1-yl group, 2-oxo-5-tetradecylpyrrolidin-1-yl group, N-methyl-tetradecanamido group, N-succinimido group, N-phthalimido group, 2,5-dioxo-1-oxazolidinyl group, 3-dodecyl-2,5-dioxo-1-imidazolyl group, N-acetyl-N-dodecylamino group, ethoxy-carbonylamino group, phenoxycarbonylamino group, benzyloxy-carbonylamino group, hexadecyloxycarbonylamino group, 2,4-di-tert-butylphenoxycarbonylamino group, phenylcarbonyl-amino group, 2,5-(di-tert-pentylphenyl)carbonylamino group, p-dodecylphenylcarbonylamino group, p-toluylcarbonylamino group, N-methylureido group, N,N-dimethylureido group, N-methyl-N-dodecylureido group, N-hexadecylureido group, N,N-dioctadecylureido group, N,N-dioctyl-N'-ethylureido group, N-phenylureido group, N,N-diphenylureido group, N-phenyl-N-p-toluylureido group, N-(m-hexadecylphenyl) ureido group, N,N-(2,5-di-tert-pentylphenyl)-N'-ethylureido group and tert-butylcarbonamide group; a sulfonamido group such as methylsulfonamido group, benzenesulfonamido group, p-toluyl-sulfonamido group, p-dodecylbenzenesulfonamido group, N-methyltetradecylsulfonamido group, N,N-dipropylsulfamoylamino group and hexadecylsulfonamido group; a sulfamoyl group such as N-methylsulfamoyl group, N-ethylsulfamoyl group, N,N-dipropylsulfamoyl group, N-hexadecylsulfamoyl group, N,N-dimethylsulfamoyl group, N-[3-(dodecyloxy)propyl]sulfamoyl group, N-[4-(2, 4-di-tert-pentylphenoxy)butyl]sulfamoyl group, N-methyl-N-tetradecylsulfamoyl group and N-dodecylsulfamoyl group; a carbamoyl group such as N-methylcarbamoyl group, N,N-dibutylcarbamoyl group, N-octadecylcarbamoyl group, N-[4-(2,4-di-tert-pentylphenoxy)butyl]carbamoyl group, N-methyl-N-tetradecylcarbamoyl group and N,N-dioctylcarbamoyl group; an acyl group such as acetyl group, (2,4-di-tert-amylphenoxy)acetyl group, phenoxycarbonyl group, p-dodecyloxyphenoxycarbonyl group, methoxycarbonyl group, butoxycarbonyl group, tetradecyloxycarbonyl group, ethoxycarbonyl group, benzyloxycarbonyl group, 3-pentadecyloxycarbonyl group and dodecyloxycarbonyl group; a sulfonyl group such as methoxysulfonyl group, octyloxysulfonyl group, tetradecyl-oxysulfonyl group, 2-ethylhexyloxysulfonyl group, phenoxy-sulfonyl group, 2,4-di-tert-pentylphenoxysulfonyl group, methylsulfonyl group, octylsulfonyl group, 2-ethylhexylsul-fonyl group, dodecylsulfonyl group, hexadecylsulfonyl group, phenylsulfonyl group, 4-nonylphenylsulfonyl group and p-toluylsulfonyl group; a sulfonyloxy group such as dodecylsulfonyloxy group and hexadecylsulfonyloxy group; a sulfinyl group such as methylsulfinyl group, octylsulfinyl group, 2-ethylhexylsulfinyl group, dodecylsulfinyl group, hexadecylsulfinyl group, phenylsulfinyl group, 4-nonylphenylsulfinyl group and p-toluylsulfinyl group; a thio group such as ethylthio group, octylthio group, benzylthio group, tetradecylthio group, 2-(2,4-di-tert-pentylphenoxy)ethylthio group, phenylthio group, 2-butoxy-5-tert-octylphenylthio group, and p-tolylthio group; an acyloxy group such as acetyloxy group, benzoyloxy group, octadecanoyloxy group, p-dodecylamidobenzoyloxy group, N-phenylcarbamoyloxy group, N-ethylcarbamoyloxy group and cyclohexylcarbonyloxy group; an amine group such as phenylanilino group, 2-chloroanilino group, diethylamine group and dodecylamine group; an imido group such as 1-(N-phenylimido)ethyl group, N-succinimido group and 3-benzylhydantoinyl group; a phosphate group such as dimethylphosphate group and ethylbutylphosphate group; a phosphite group such as diethylphosphite group and dihexylphosphite group; a heterocyclic group, a heterocyclyloxy group or heterocyclylthio group (each may be substituted and may have a 3- to 7-membered heterocyclic ring constituted by carbon atoms and at least one hetero atom selected from the group consisting of oxygen atom, nitrogen atom and sulfur atom) such as 2-furyl group, 2-thienyl group, 2-benzoimidazolyloxy group and 2-benzothiazolyl group; a quaternary ammonium group such as triethylammonium group; and silyloxy group such as trimethylsilyloxy group, which may be further substituted. If desired, these substituents themselves may be further substituted with any of the aforementioned substituents once or more times. Individual substituents used can be selected by those skilled in the art so as to achieve photographic characteristics desired for a particular purpose, and they may contain, for example, a hydrophobic group, solubilizing group, blocking group, releasing or releasable group and a group that can adsorb on silver halide. The aforementioned groups and the substituents thereof generally have 48 carbon atoms at most, typically 1–36 carbon atoms, usually less than 24 carbon atoms. However, depending on specific substituents to be selected, they may have further larger number of carbon atoms.

Specific examples of the nucleating agent are illustrated below. However, nucleating agents that can be used for the present invention are not limited to these.

(H-1)
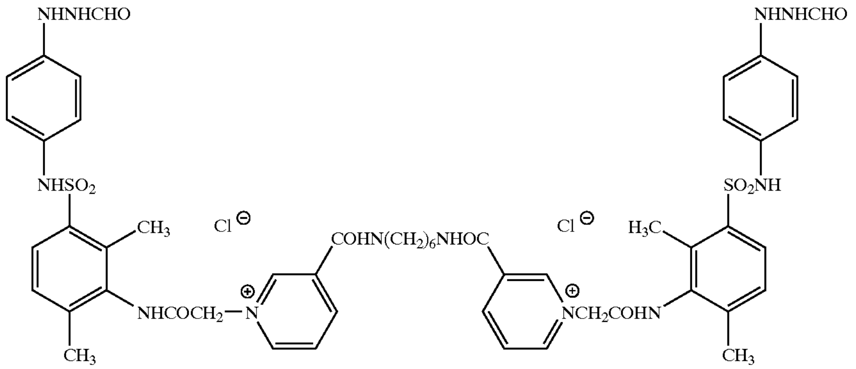
(H-2)
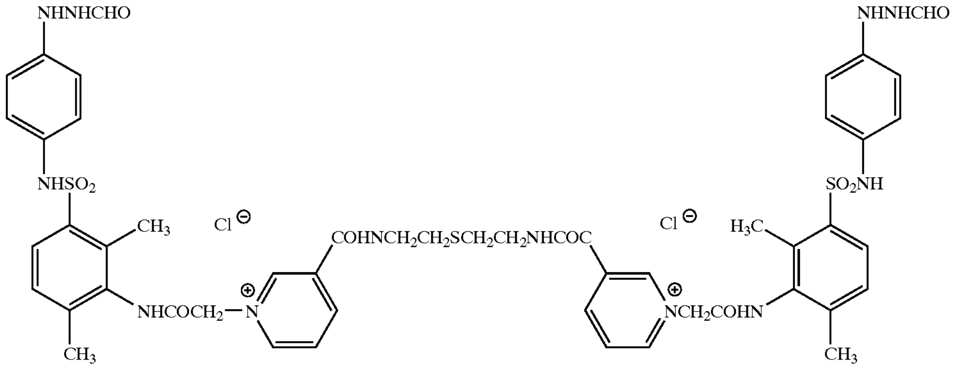
(H-3)
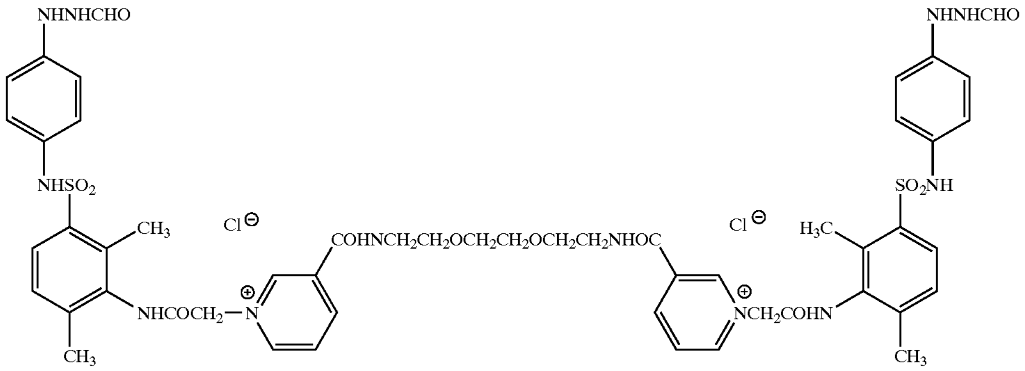
(H-4)
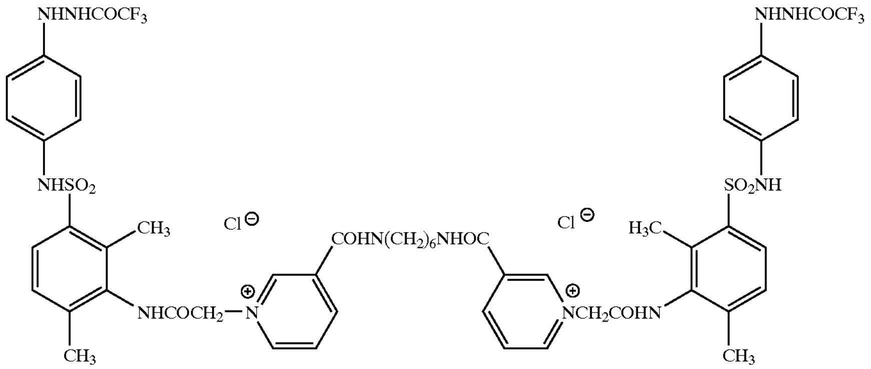

-continued
(H-5)
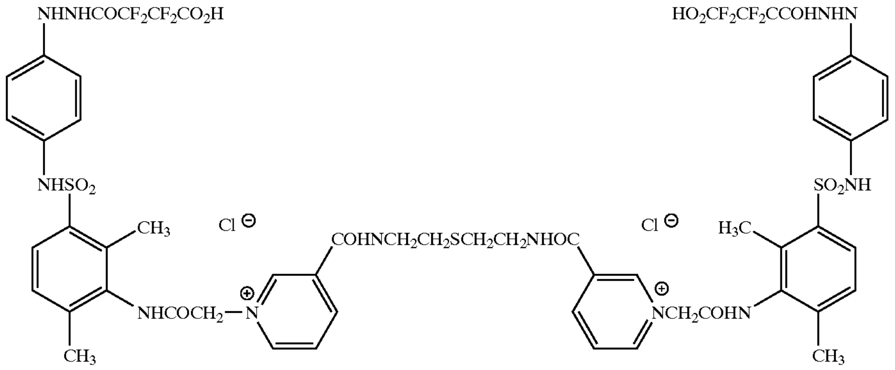
(H-6)
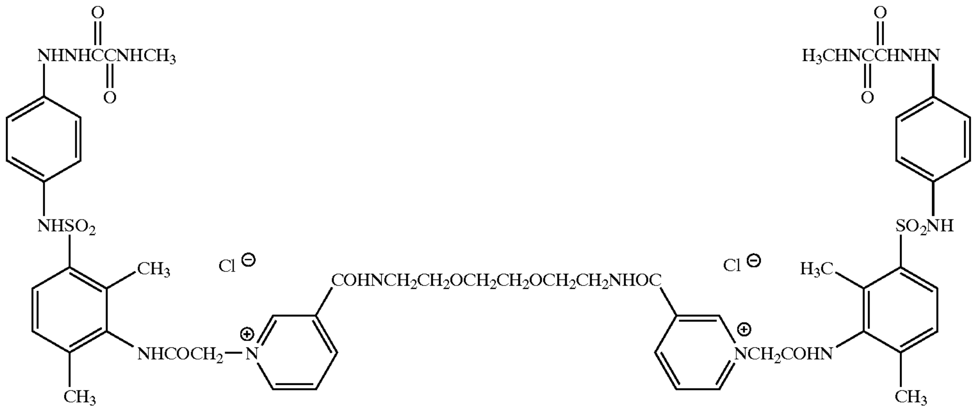
(H-7)
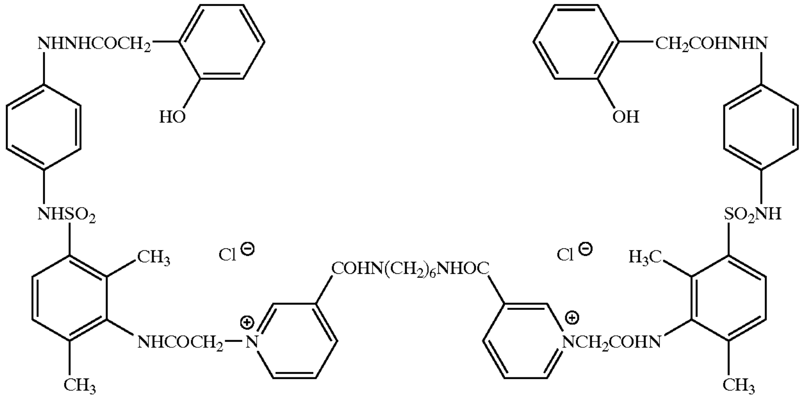
(H-8)
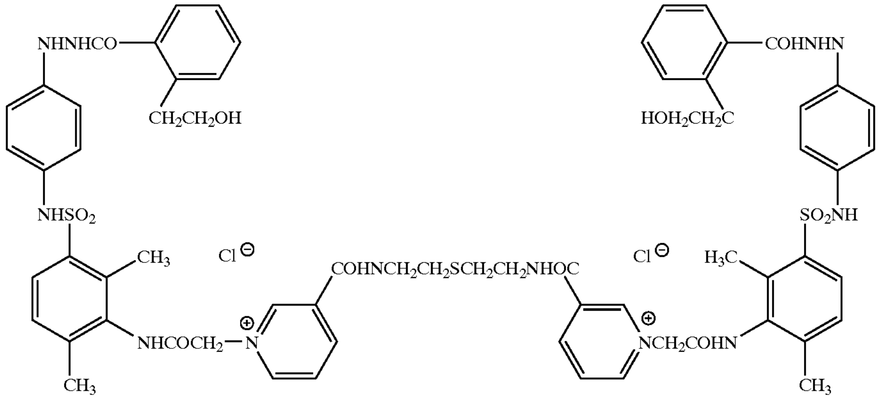

-continued
(H-9)
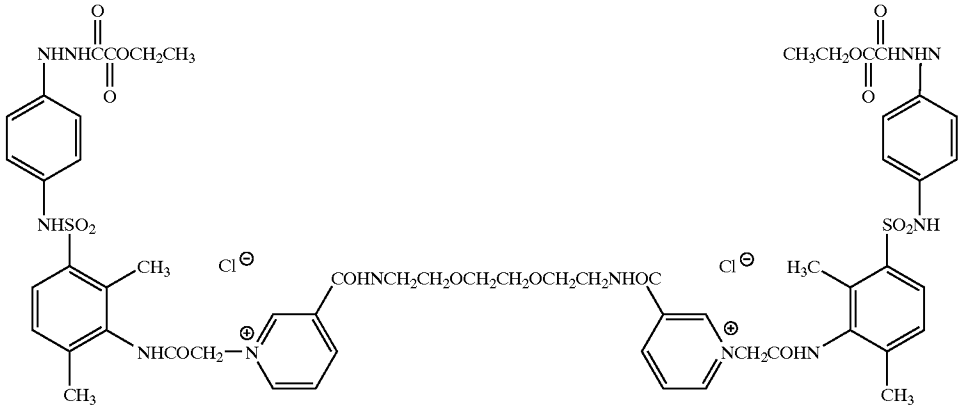
(H-10)
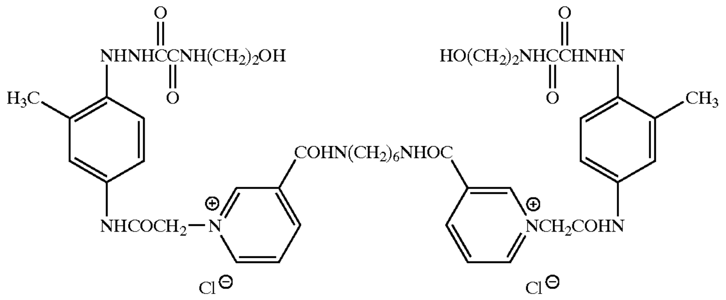
(H-11)
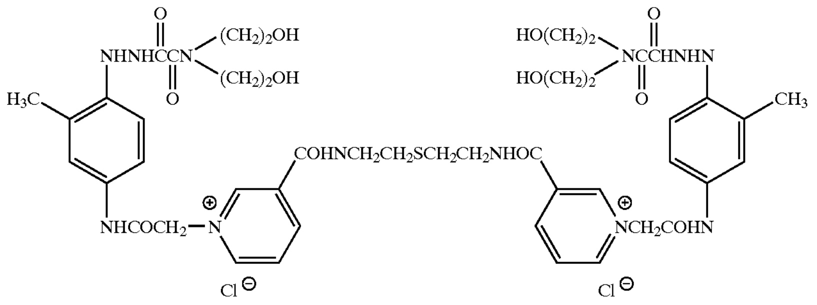
(H-12)
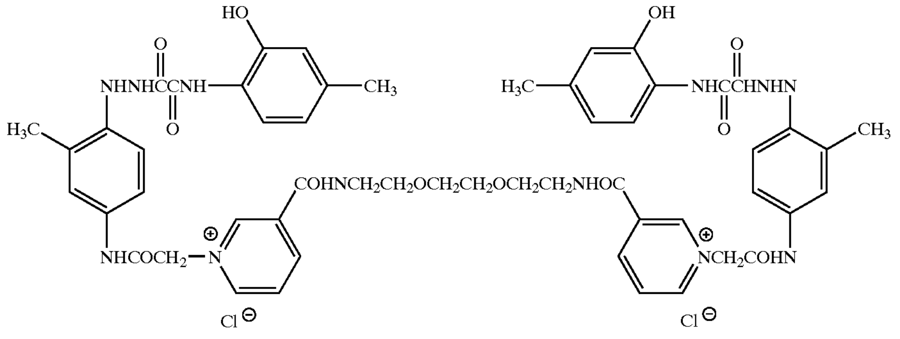

-continued
(H-13)
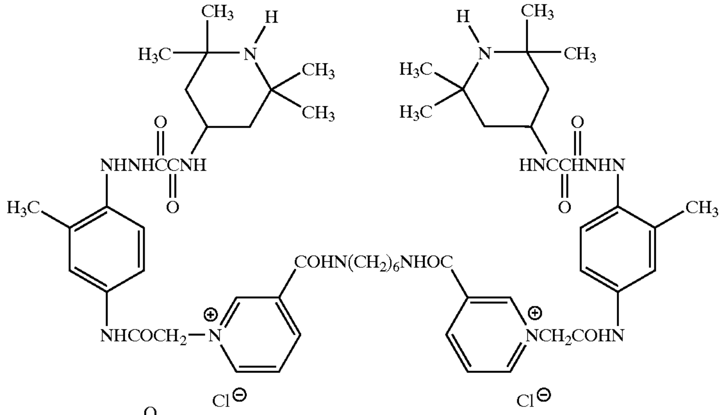
(H-14)
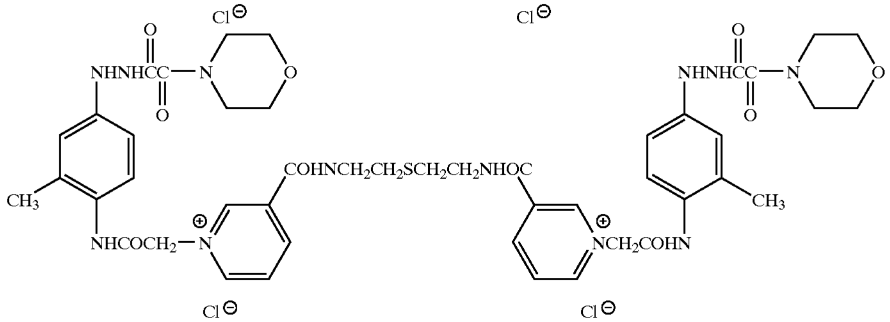
(H-15)
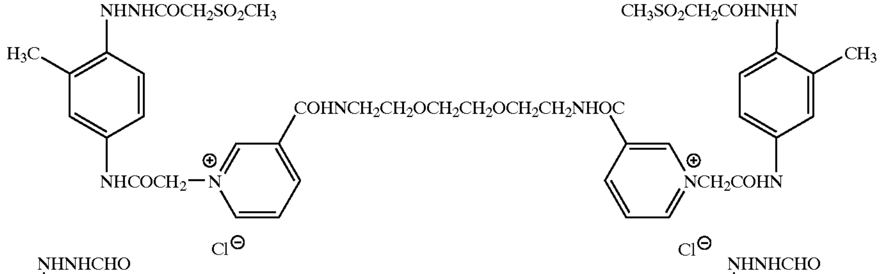
(H-16)
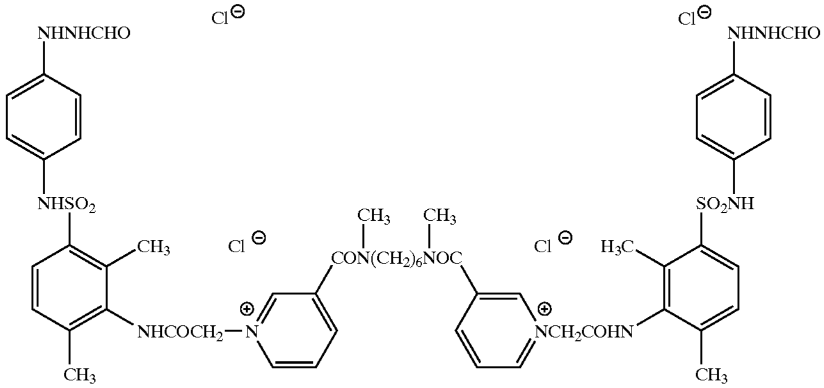
(H-17)
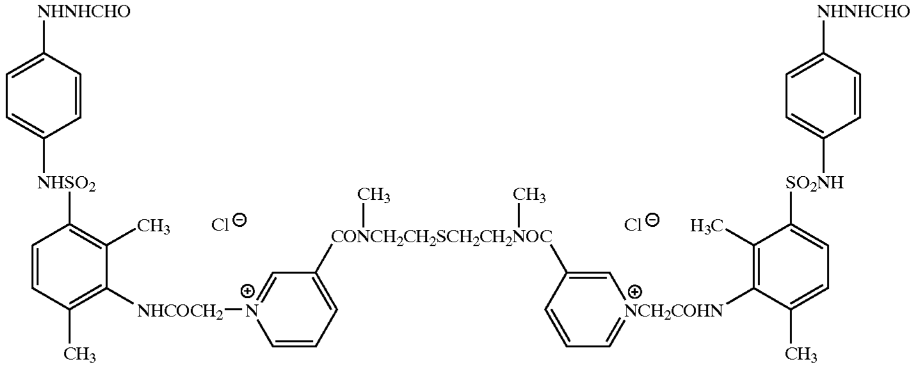

-continued
(H-18)
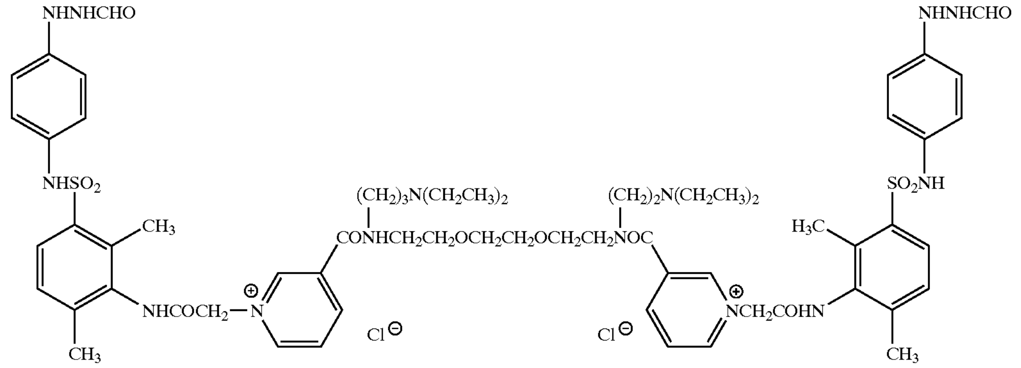
(H-19)
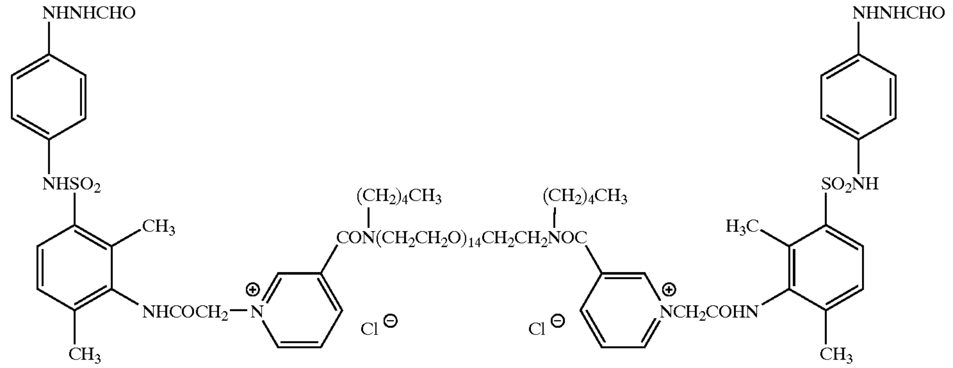
(H-20)
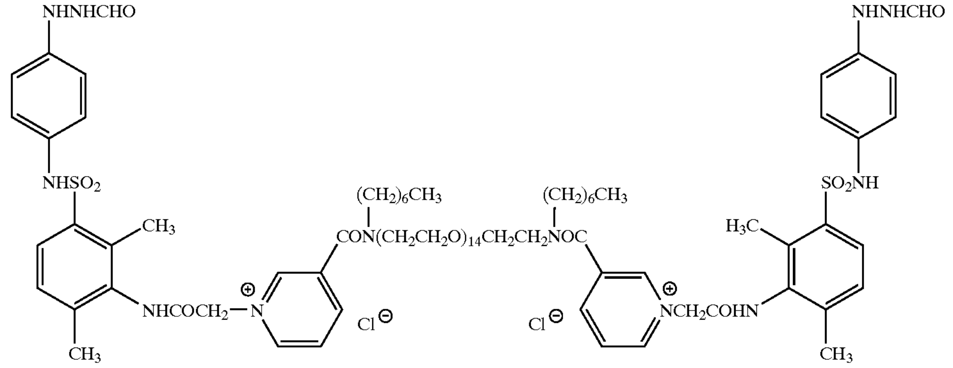
(H-21)
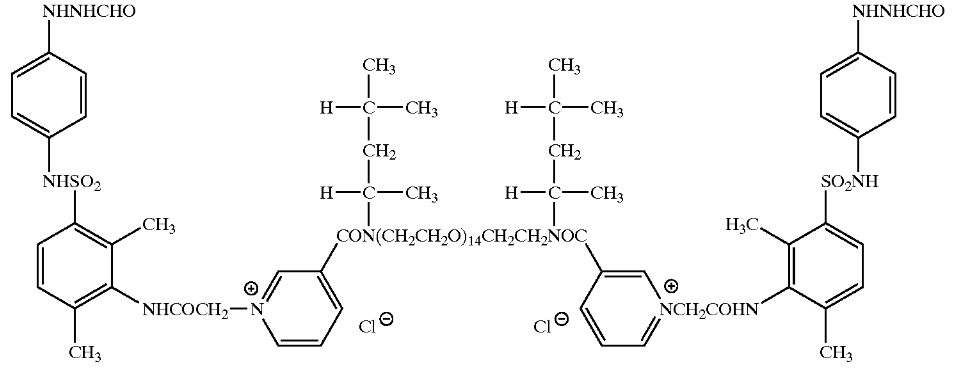

-continued
(H-22)
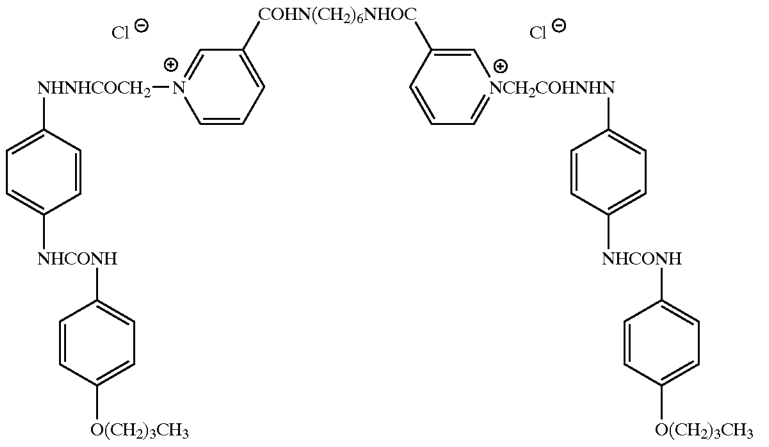
(H-23)
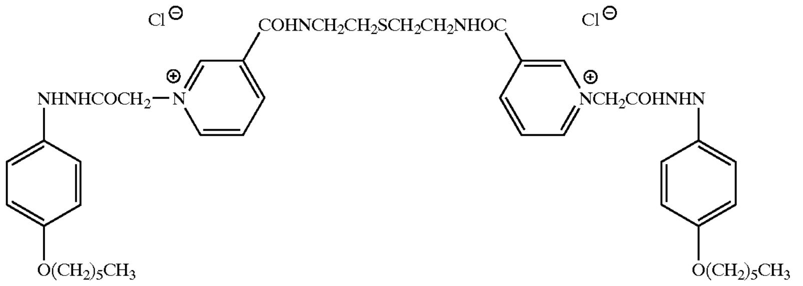
(H-24)
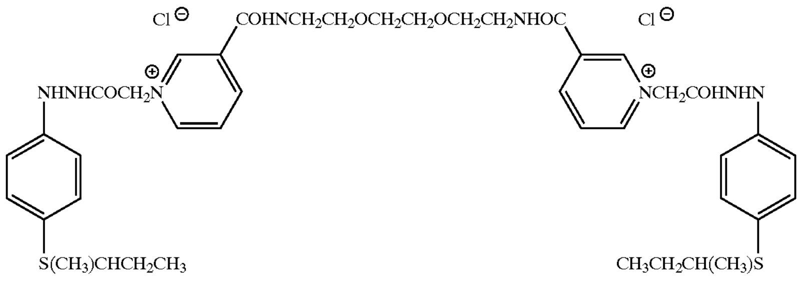
(H-25)
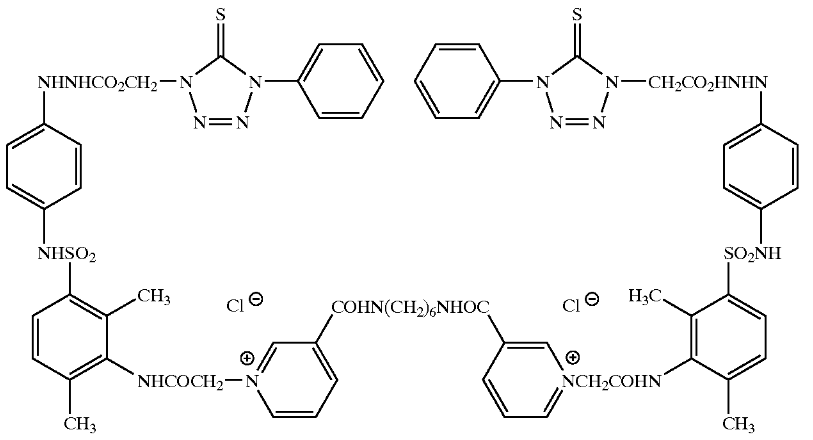

-continued
(H-26)
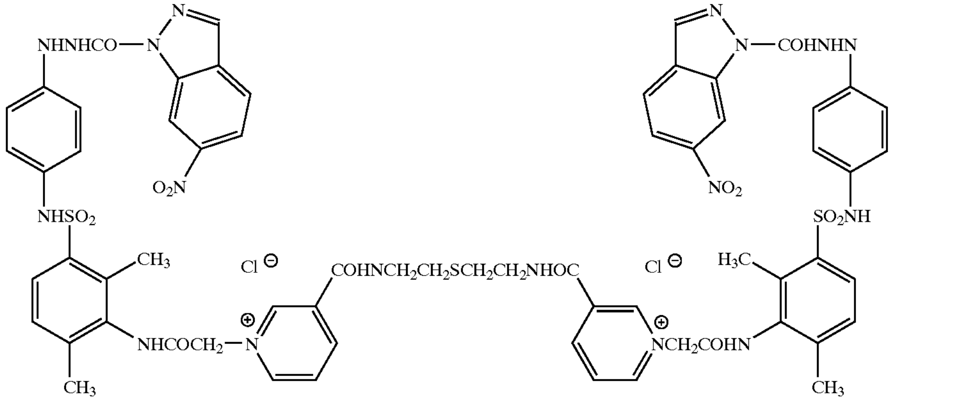
(H-27)
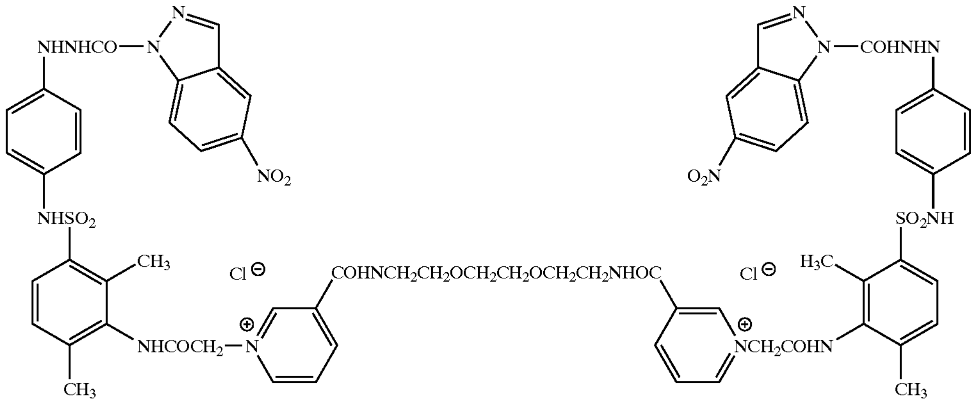
(H-28)
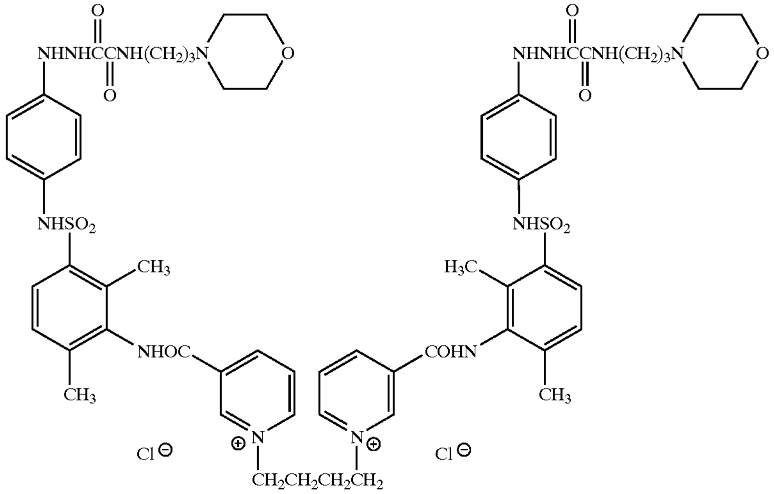

-continued
(H-29)
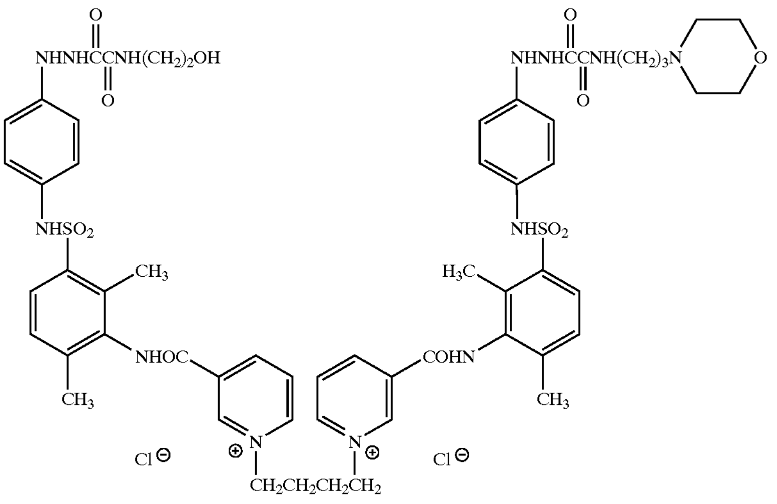
(H-30)
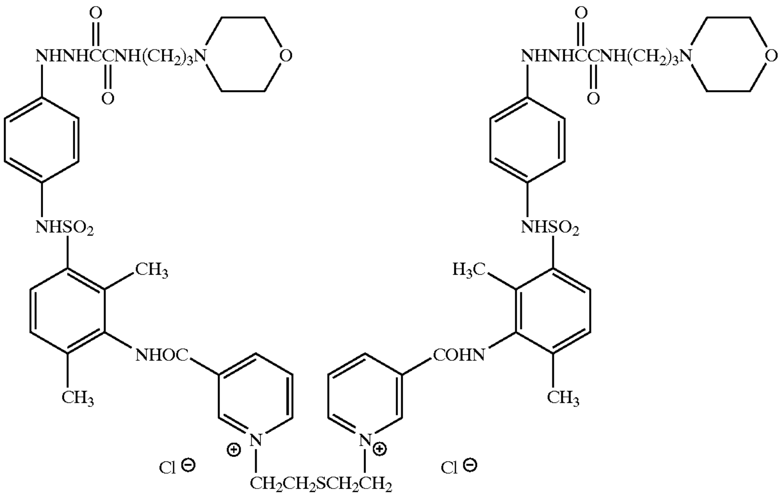
(H-31)
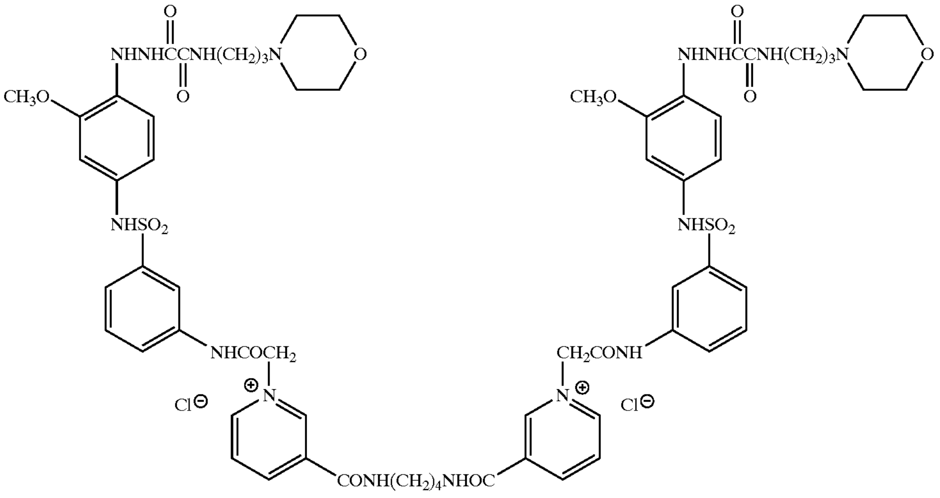

-continued
(H-32)
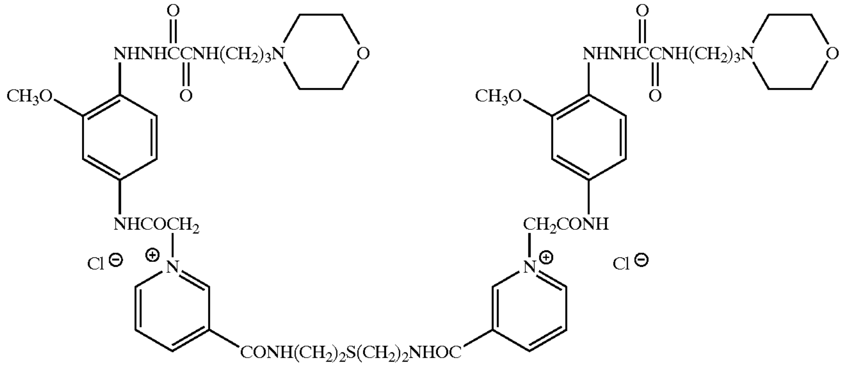
(H-33)
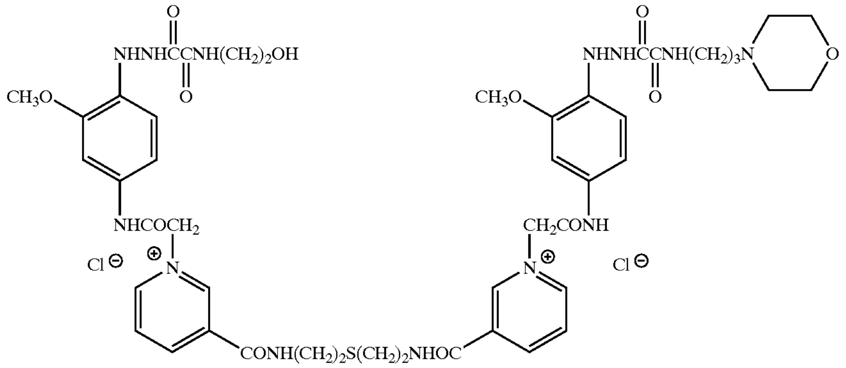
(H-34)
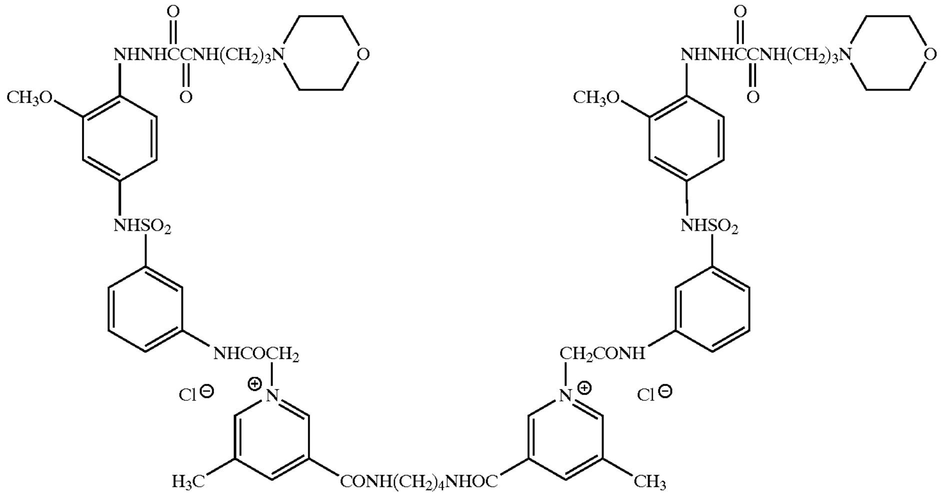
(H-35)
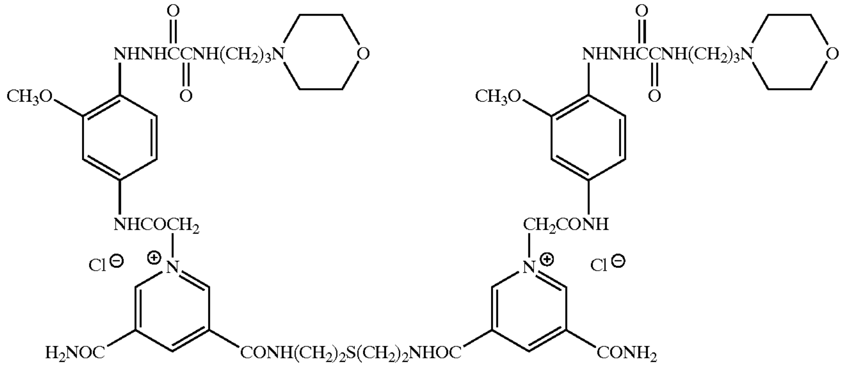

-continued
(H-36)
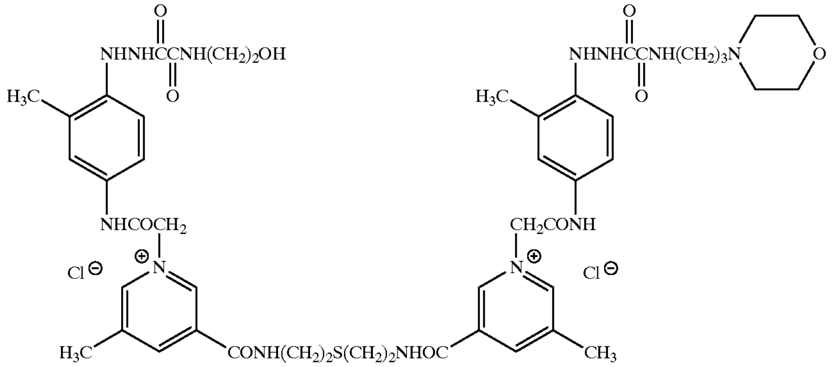
(H-37)
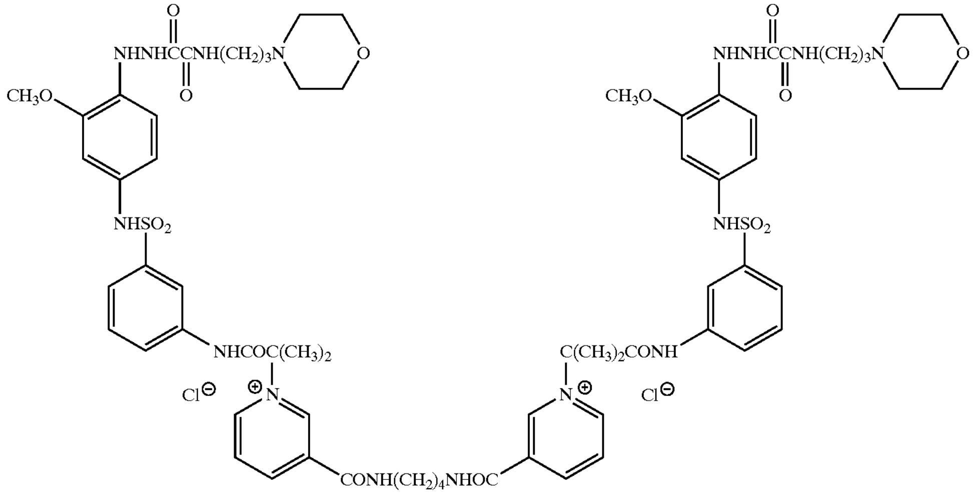
(H-38)
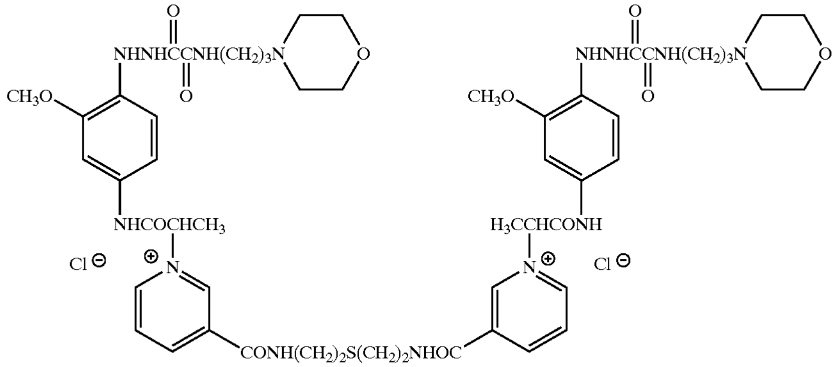
(H-39)
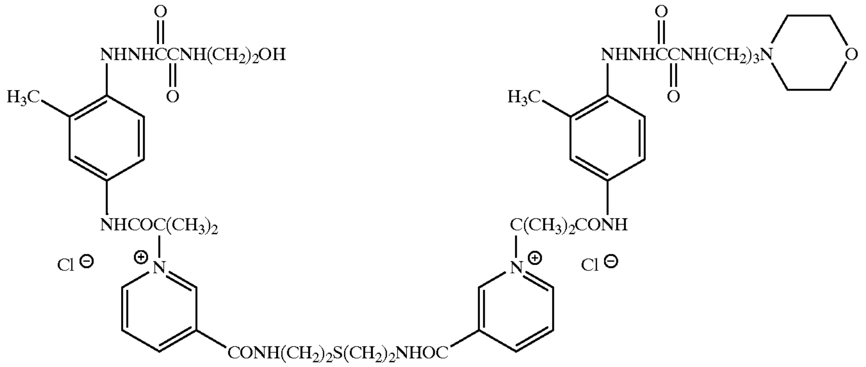

-continued (H-40)

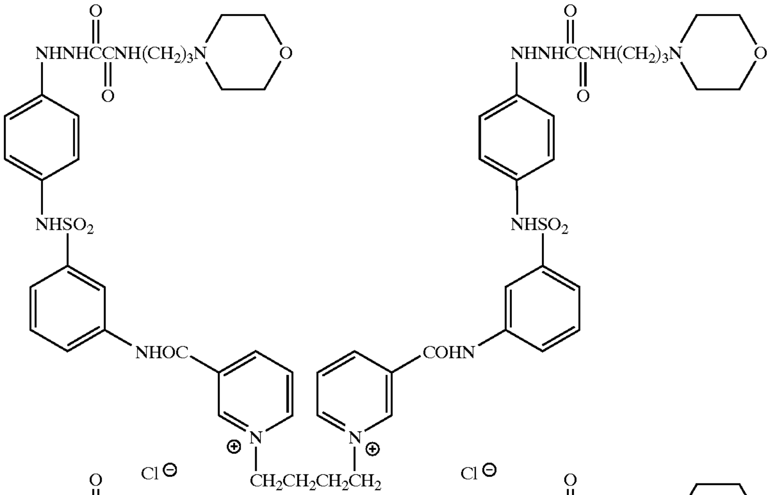

(H-41)

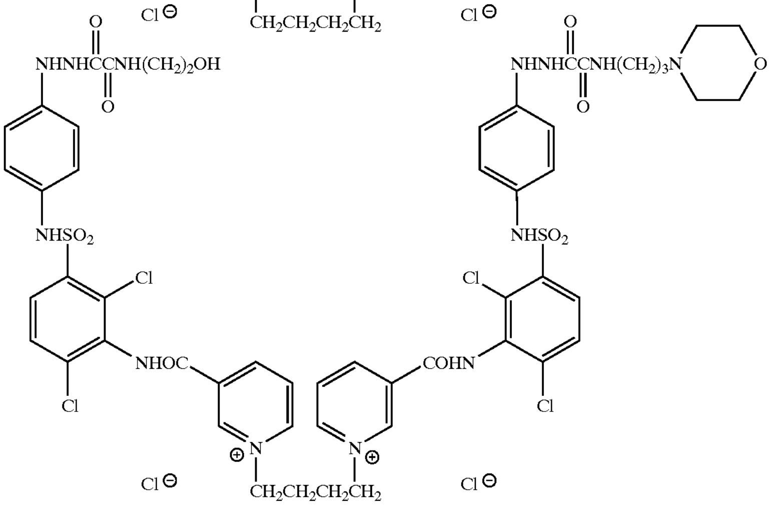

(H-42)

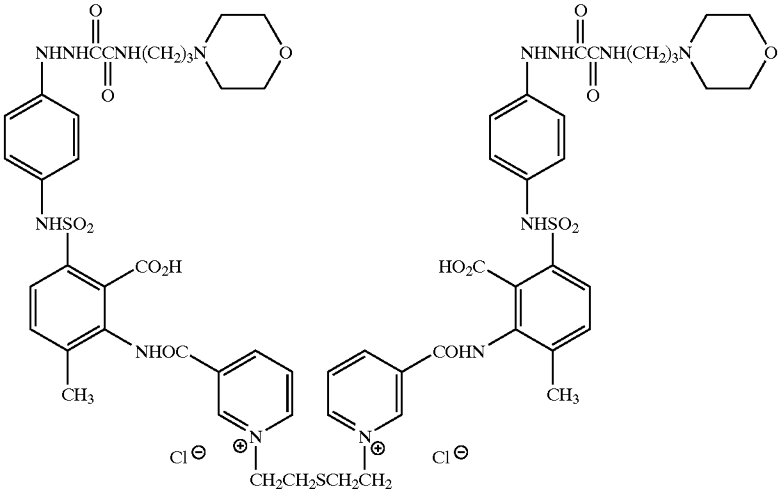

In the present invention, the hydrazine nucleating agents ay be dissolved in an appropriate water-miscible organic solvent, such as an alcohol (e.g., methanol, ethanol, propanol, fluorinated alcohol), ketone (e.g., acetone, methyl ethyl ketone), dimethylformamide, dimethylsulfoxide, methyl cellosolve or the like, before use.

The hydrazine nucleating agents may also be dissolved in an oil such as dibutyl phthalate, tricresyl phosphate, glyceryl triacetate or diethyl phthalate using an auxiliary solvent such as ethyl acetate or cyclohexanone and mechanically processed into an emulsion dispersion by a conventionally well-known emulsion dispersion method before use. Alternatively, powder of hydrazine derivative may be dispersed in water by means of ball mill, colloid mill or ultrasonic waves according to a method known as solid dispersion method, and used.

In the present invention, the hydrazine nucleating agent may be added to a silver halide emulsion layer or any of other hydrophilic colloid layers on the silver halide emulsion layer side of the support, but it is preferably added to the silver halide emulsion layer or a hydrophilic colloid layer adjacent thereto. Two or more kinds of hydrazine nucleating agents may be used in combination.

The addition amount of the nucleating agent in the present invention is preferably from $1\times10^{-5}$ to $1\times10^{-2}$ mol, more preferably from $1\times10^{-5}$ to $5\times10^{-3}$ mol, most preferably from $2\times10^{-5}$ to $5\times10^{-3}$ mol, per mol of silver halide.

The silver halide photographic light-sensitive material may contain a nucleation accelerator.

Examples of the nucleation accelerator used in the present invention include amine derivatives, onium salts, disulfide derivatives, hydroxymethyl derivatives and so forth. Specific examples thereof include compounds described in JP-A-7-77783, page 48, lines 2 to 37, specifically, Compounds A-1) to A-73) described on pages 49 to 58 of the same; compounds represented by (Chemical formula 21), (Chemical formula 22) and (Chemical formula 23) described in JP-A-7-84331, specifically, compounds described on pages 6 to 8 of the same; compounds represented by formulas [Na] and [Nb] described in JP-A-7-104426, specifically, Compounds Na-1 to Na-22 and Compounds Nb-1 to Nb-12 described on pages 16 to 20 of the same; compounds represented by the formulas (1), (2), (3), (4), (5), (6) and (7) described in JP-A-8-272023, specifically, compounds of 1-1 to 1-19, compounds of 2-1 to 2-22, compounds of 3-1 to 3-36, compounds of 4-1 to 4-5, compounds of 5-1 to 5-41, compounds of 6-1 to 6-58 and compound of 7-1 to 7-38 mentioned in the same; and nucleation accelerators described in JP-A-9-297377,, p.55, column 108, line 8 to p.69, column 136, line 44.

As the nucleation accelerator used for the present invention, the quaternary salt compounds represented by the formulas (a) to (f) are preferred, and the compounds represented by the formula (b) are most preferred.

Formula (a)

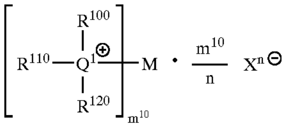

Formula (b)

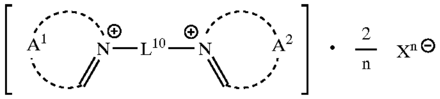

Formula (c)

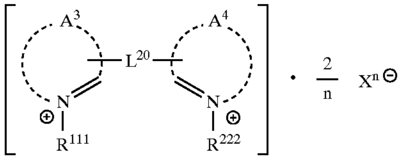

Formula (d)

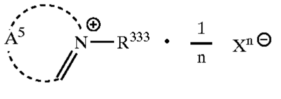

In the formula (a), $Q^1$ represents a nitrogen atom or a phosphorus atom, $R^{100}$, $R^{110}$ and $R^{120}$ each represent an aliphatic group, an aromatic group or a heterocyclic group, and these may bond to each other to form a ring structure. M represents an $m^{10}$-valent organic group bonding to $Q^{1+}$ at a carbon atom contained in M, and $m^{20}$ represents an integer of 1–4.

In the formulas (b), (c) and (d), $A^1$, $A^2$, $A^3$, $A^4$ and $A^5$ each represent an organic residue for completing an unsaturated heterocyclic ring containing a quaternized nitrogen atom, $L^{10}$ and $L^{20}$ represent a divalent bridging group, and $R^{111}$, $R^{222}$ and $R^{333}$ represent a substituent.

The quaternary salt compounds represented by the formula (a), (b), (c) or (d) have 20 or more in total of repeating units of ethyleneoxy group or propyleneoxy group in the molecule, and they may contain the units at two or more sites.

Formula (e)

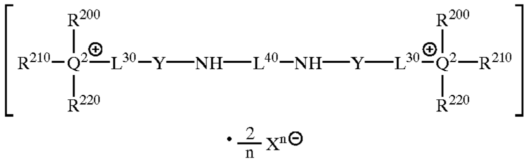

Formula (f)

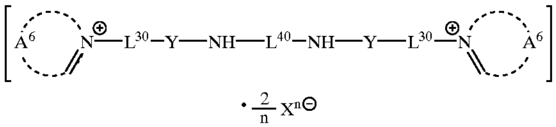

In the formula (e), $Q^2$ represents a nitrogen atom or a phosphorus atom. $R^{200}$, $R^{210}$ and $R^{220}$ represent a group selected from the groups defined for $R^{100}$, $R^{110}$, $R^{120}$ in the formula (a).

In the formula (f), $A^6$ represents a group selected from the groups defined for $A^1$ or $A^2$ in the formula (b). However, the nitrogen-containing unsaturated heterocyclic ring formed with $A^6$ may have a substituent, but it does not have a primary hydroxyl group on the substituent. In the formulas (e) and (f), $L^{30}$ represents an alkylene group, Y represents —C (=O)— or —$SO_2$—, and $L^{40}$ represents a divalent bridging group containing at least one hydrophilic group.

In the formulas (a) to (f), $X^{n-}$ represents an n-valent counter anion, and n represents an integer of 1–3. However, when another anionic group is present in the molecule and it forms an intramolecular salt with $Q^{1+}$, $Q^{2+}$ or $N^+$, $X^{n-}$ is not required.

Examples of the aliphatic group represented by $R^{100}$, $R^{110}$ and $R^{120}$ in the formula (a) include a linear or branched alkyl group such as methyl group, ethyl group, propyl group, isopropyl group, butyl group, isobutyl group, sec-butyl group, tert-butyl group, octyl group, 2-ethylhexyl group, dodecyl group, hexadecyl group and octadecyl group; an aralkyl group such as a substituted or unsubstituted benzyl group; a cycloalkyl group such as cyclopropyl groups, cyclopentyl group and cyclohexyl group; an alkenyl group such as allyl group, vinyl group and 5-hexenyl group; a cycloalkenyl group such as cyclopentenyl group and cyclohexenyl group; an alkynyl group such as phenylethynyl group and so forth. Examples of the aromatic group include an aryl group such as phenyl group, naphthyl group and phenanthoryl group, and examples of the heterocyclic group include pyridyl group, quinolyl group, furyl group, imidazolyl group, thiazolyl group, thiadiazolyl group, benzotriazolyl group, benzothiazolyl group, morpholyl group, pyrimidyl group, pyrrolidyl group and so forth.

Examples of the substituent substituting these groups include, besides the groups represented by $R^{100}$, $R^{110}$ and $R^{120}$ , a halogen atom such as fluorine atom, chlorine atom, bromine atom and iodine atom, a nitro group, an (alkyl or aryl)amino group, an alkoxy group, an aryloxy group, an (alkyl or aryl)thio group, a carbonamido group, a carbamoyl group, a ureido group, a thioureido group, a sulfonylureido group, a sulfonamido group, a sulfamoyl group, a hydroxyl group, a sulfonyl group, a carboxyl group (including a carboxylate), a sulfo group (including a sulfonate), a cyano group, an oxycarbonyl group, an acyl group, a heterocyclic group (including a heterocyclic group containing a quaternized nitrogen atom) and so forth. These substituents may be further substituted with any of these substituents.

The groups represented by $R^{100}$, $R^{110}$ and $R^{120}$ in the formula (a) may bond to each other to form a ring structure.

Example of the group represented by M in the formula (a) include, when $m^{10}$ represents 1, the same groups as the groups defined for $R^{100}$, $R^{110}$ and $R^{120}$. When $m^{10}$ represents an integer of 2 or more, M represents an $m^{10}$-valent bridging group bonding to $(Q^1)^+$ at a carbon atom contained in M. Specifically, it represents an $m^{10}$-valent bridging group formed with an alkylene group, an arylene group, a heterocyclic group or a group formed from any of these groups in combination with any of —CO— group, —O— group, —N($R^N$)— group, —S— group, —$SO_2$— group, —$SO_2$— group and —P═O— group (RN represents a hydrogen atom or a group selected from the groups defined for $R^{100}$, $R^{110}$, $R^{120}$, and when a plurality of $R^N$ exist in the molecule, they may be identical to or different from each other or one another, and may bond to each other or one another). M may have an arbitrary substituent, and examples of the substituent include the substituents that can be possessed by the groups represented by $R^{100}$, $R^{110}$ and $R^{120}$.

In the formula (a), $R^{100}$, $R^{110}$ and $R^{120}$ preferably represent a group having 20 or less carbon atoms. When $Q^1$ represents a phosphorus atom, an aryl group having 15 or less carbon atoms is particularly preferred, and when $Q^1$ represents a nitrogen atom, an alkyl group, aralkyl group and aryl group having 15 or less carbon atoms are particularly preferred $m^{10}$ is preferably 1 or 2. When $m^{10}$ represents 1, M is preferably a group having 20 or less carbon atoms, and an alkyl group, aralkyl group and aryl group having 15 or less carbon atoms are particularly preferred. When $m^{10}$ represents 2, the divalent organic group represented by M is preferably a group formed with an alkylene group or an arylene group, or a group formed from either of these groups in combination with any of —CO— group, —O— group, —N ($R^N$)— group, —S— group and —$SO_2$— group. When $m^{10}$ represents 2, M is preferably a divalent group having 20 or less carbon atoms and bonding to $(Q^1)^+$ at a carbon atom contained in M. When M or $R^{100}$, $R^{110}$ or $R^{120}$ contains a plurality of repeating units of ethyleneoxy group or propyleneoxy group, the preferred ranges for the total carbon numbers mentioned above may not be applied. Further, when $m^{10}$ represents an integer of 2 or more, a plurality of $R^{100}$, $R^{110}$ or $R^{120}$ exist in the molecule. In this case, a plurality of $R^{100}$, $R^{110}$,and $R^{120}$ may be identical to or different from each other or one another.

The quaternary salt compounds represented by the formula (a) contain 20 or more in total of repeating units of ethyleneoxy group or propyleneoxy group in the molecule, and they may exist at one site or two or more site. When $m^{10}$ represents an integer of 2 or more, it is more preferred that 20 or more in total of repeating units of ethyleneoxy group or propyleneoxy group should be contained in the bridging group represented by M.

In the formulas (b), (c) and (d), $A^1$, $A^2$, $A^3$, $A^4$ and $A^5$ represent an organic residue for completing a substituted or unsubstituted unsaturated heterocyclic ring containing a quaternized nitrogen atom, and it may contain a carbon atom, an oxygen atom, a nitrogen atom, a sulfur atom and a hydrogen atom and may be condensed with a benzene ring.

Examples of the unsaturated heterocyclic ring formed by $A^1$, $A^2$, $A^3$, $A^4$ or $A^5$ include a pyridine ring, quinoline ring, isoquinoline ring, imidazole ring, thiazole ring, thiadiazole ring, benzotriazol ring, benzothiazole ring, pyrimidine ring, pyrazole ring and so forth. A pyridine ring, quinoline ring and isoquinoline ring are particularly preferred.

The unsaturated heterocyclic ring formed by $A^1$, $A^2$, $A^3$, $A^4$ or $A^5$ together with a quaternized nitrogen atom may have a substituent. Examples of the substituent include the same groups as the substituents that may be possessed by the groups represented by $R^{100}$, $R^{110}$ and $R^{120}$ in the formula (a). The substituent is preferably a halogen atom (in particular, chlorine atom), an aryl group having 20 or less carbon atoms (phenyl group is particularly preferred), an alkyl group, an alkynyl group, a carbamoyl group, an (alkyl or aryl) amino group, an (alkyl or aryl) oxycarbonyl group, an alkoxy group, an aryloxy group, an (alkyl or aryl)thio group, hydroxyl group, a mercapto group, a carbonamido group, a sulfonamido group, a sulfo group (including a sulfonate), a carboxyl group (including a carboxylate), a cyano group or the like, particularly preferably a phenyl group, an alkylamino group, a carbonamido group, a chlorine atom or an alkylthio group, most preferably a phenyl group.

The divalent bridging group represented by $L^{10}$ or $L^{20}$ is preferably an alkylene group, an arylene group, an alkenylene group, an alkynylene group, a divalent heterocyclic group, —$SO^2$—, —SO—, —O—, —S—, —N($R^{N'}$), —C(═O)—, —PO— or a group formed by a combination of any of these. $R^{N'}$ represents an alkyl group, an aralkyl group, an aryl group or a hydrogen atom. The divalent bridging group represented by $L^{10}$ or $L^{20}$ may have an arbitrary substituent. Examples of the substituent include the substituents that may be possessed by the groups represented by $R^{100}$, $R^{110}$ and $R^{120}$ in the formula (a). Particularly preferred examples of the divalent bridging group represented by $L^{10}$ or $L^{20}$ are an alkylene group, an arylene group, —C(═O)—, —O—, —S—, —$SO_2$—, —N($R^{N'}$)— and a group formed by a combination of any of these.

$R^{111}$, $R^{222}$ and $R^{333}$ preferably represent an alkyl group or aralkyl group having 1–20 carbon atoms, and they may be identical to or different from each other or one another. $R^{111}$, $R^{222}$ and $R^{333}$ may have a substituent, and examples of the substituent include the substituents that may be possessed by the groups represented by $R^{100}$ , $R^{110}$ and $R^{120}$ in the formula (a). $R^{111}$, $R^{222}$ and $R^{333}$ each particularly preferably represent an alkyl group or aralkyl group having 1–10 carbon atoms. Preferred examples of the substituent thereof include a carbamoyl group, an oxycarbonyl group, an acyl group, an aryl group, a sulfo group (including a sulfonate), a carboxyl group (including a carboxylate), a hydroxyl group, an (alkyl or aryl)amino group and an alkoxy group.

However, when a plurality of repeating units of ethyleneoxy group or propyleneoxy group are included in $R^{111}$, $R^{222}$ or $R^{333}$, the preferred ranges for the total carbon numbers mentioned above for $R^{111}$, $R^{222}$ and $R^{333}$ may not be applied.

The quaternary salt compounds represented by the formula (b) or (c) contain 20 or more in total of repeating units of ethyleneoxy group or propyleneoxy group in the molecule, and they may exist at one site or two or more site and may be contained any of $A^1$, $A^2$, $A^3$, $A^4$, $R^{111}$, $R^{222}$, $L^{10}$ and $L^{20}$. However, it is preferred that 20 or more in total of repeating units of ethyleneoxy group or propyleneoxy group should be contained in the bridging group represented by $L^{10}$ or $L^{20}$.

The quaternary salt compounds represented by the formula (d) contain 20 or more in total of repeating units of ethyleneoxy group or propyleneoxy group in the molecule, and they may exist at one site or two or more site and may be contained any of $A^5$ and $R^{333}$. However, it is preferred that 20 or more in total of repeating units of ethyleneoxy group or propyleneoxy group should be contained in the bridging group represented by $R^{333}$ The quaternary salt compounds represented by the formulas (a), (b), (c) or (d) may contain both of a repeating unit of ethyleneoxy group and a repeating unit of propyleneoxy group. Further, when a plurality of repeating units of ethyleneoxy group or propyleneoxy group are contained, number of the repeating units may be defined strictly as one number or as an average number. In the latter case, each quaternary salt compound consists of a mixture having a certain degree of molecular weight distribution.

In the present invention, preferably 20 or more, more preferably 20–67, in total of repeating units of ethyleneoxy group should be contained.

In the formula (e), $Q^2$, $R^{200}$, $R^{210}$ and $R^{220}$ represent any of the groups defined for $Q^1$, $R^{100}$, $R^{110}$ and $R^{120}$ in the formula (a) respectively, and the preferred ranges thereof are also the same.

In the formula (f), $A^6$ represents any of the groups defined for $A^1$ or $A^2$ in the formula (b), and the preferred range thereof is also the same. However, the nitrogen-containing unsaturated heterocyclic ring formed with $A^6$ together with a quaternized nitrogen atom may have a substituent, provided that it does not have a substituent containing a primary hydroxyl group.

In the formulas (e) and (f), $L^{30}$ represents an alkylene group. The alkylene group is preferably a linear, branched or cyclic substituted or unsubstituted alkylene group having 1–20 carbon atoms. Moreover, it includes not only a saturated alkylene group, of which typical example is ethylene group, but also an alkylene group containing an unsaturated group, of which typical examples are $—CH_2C_6H_4CH_2—$ and $—CH_2CH{=}CHCH_2—$. Further, when $L^{30}$ has a substituent, examples of the substituent include the examples of the substituent that may be possessed by the groups represented by $R^{100}$, $R^{110}$ and $R^{120}$ in the formula (a).

$L^{30}$ is preferably a linear or branched saturated group having 1–10 carbon atoms. More preferably, it is a substituted or unsubstituted methylene group, ethylene group or trimethylene group, particularly preferably a substituted or unsubstituted methylene group or ethylene group, most preferably a substituted or unsubstituted methylene group.

In the formulas (e) and (f), $L^{40}$ represents a divalent bridging group having at least one hydrophilic group. The hydrophilic group used herein represents each of $—SO_2—$, —SO—, —O—, —P(=O)=, —C(=O)—, —CONH—, $—SO_2NH—$, $—NHSO_2NH—$, —NHCONH—, an amino group, a guanidino group, an ammonio group and a heterocyclic group containing a quaternized nitrogen atom or a group consisting of a combination of these groups. $L^{40}$ is formed by an arbitrary combination of any of these hydrophilic groups and an alkylene group, an alkenylene group, an arylene group or a heterocyclic group.

The groups constituting $L^{40}$ such as an alkylene group, an arylene group, an alkenylene group and a heterocyclic group may have a substituent. Examples of the substituent include the substituents that can be possessed by the groups represented by $R^{100}$, $R^{110}$ and $R^{120}$ in the formula (a).

Although the hydrophilic group in $L^{40}$ may exist so as to interrupt $L^{40}$ or as a part of a substituent on $L^{40}$, it is more preferably exist so as to interrupt $L^{40}$. For example, there can be mentioned a case where any one of —C(=O)—, $—SO_2—$, —SO—, —O—, —P(=O)=, —CONH—, $—SO_2NH—$, $—NHSO_2NH—$, —NHCONH—, a cationic group (specifically, a quaternary salt structure of nitrogen or phosphorus or a nitrogen-containing heterocyclic ring containing a quaternized nitrogen atom), an amino group and a guanidine group or a divalent group consisting of an arbitrary combination of these groups exists so as to interrupt $L^{40}$.

One of preferred examples of the hydrophilic group of $L^{40}$ is a group having a plurality of repeating units of ethyleneoxy group or propyleneoxy group consisting of a combination of ether bonds and alkylene groups. The polymerization degree or average polymerization degree of such a group is preferably 2–67.

The hydrophilic group of $L^{40}$ also preferably contains a dissociating group obtained as a result of combination of groups such as $—SO_2—$, —SO—, —O—, —P(=O)=, —C(=O)—, —CONH—, $—SO_2NH—$, $—NHSO_2NH—$, —NHCONH—, an amino group, a guanidino group, an ammonio group and a heterocyclic group containing a quaternized nitrogen atom, or as a substituent on $L^{40}$. The dissociating group referred to herein means a group or partial structure having a proton of low acidity that can be dissociated with an alkaline developer, or a salt thereof. Specifically, it means, for example, a carboxy group/—COOH, a sulfo group/$—SO_3H$, a phosphonic acid group/$—PO_3H$, a phosphoric acid group/$—OPO_3H$, a hydroxy group/—OH, a mercapto group/—SH, $—SO_2NH_2$ group, N-substituted sulfonamido group/$—SO_2NH—$, $—CONHSO_2—$ group, $—SO_2NHSO_2—$ group, —CONHCO— group, an active methylene group, —NH—group contained in a nitrogen-containing heterocyclic group, salts thereof etc.

$L^{40}$ consisting of a suitable combination of an alkylene group or arylene group with —C (=O)—, $—SO_2—$, —O—, —CONH—, $—SO_2NH—$, $—NHSO_2NH—$, —NHCONH— or an amino group is preferably used. More preferably, $L^{40}$ consisting of a suitable combination of an alkylene group having 2–5 carbon atoms with —C(=O)—, $—SO_2—$, —O—, —CONH—, $—SO_2NH—$, $—NHSO_2NH—$ or —NHCONH— is used.

Y represents —C(=O)— or $—SO_2—$. —C(=O)— is preferably used.

Example of the counter anion represented by $X^{n-}$ in the formulas (a) to formula (f) include a halide ion such as chloride ion, bromide ion and iodide ion, a carboxylate ion such as acetate ion, oxalate ion, fumarate ion and benzoate ion, a sulfonate ion such as p-toluenesulfonate ion, methanesulfonate: ion, butanesulfonate ion and benzenesulfonate ion, a sulfate ion, a perchlorate ion, a carbonate ion, a nitrate ion and so forth.

As the counter anion represented by $X^{n-}$n, a halide ion, a carboxylate ion, a sulfonate ion and a sulfate ion are preferred, and n is preferably 1 or 2. As $X^{n-}$, a chloride ion or a bromide ion is particularly preferred, and a chloride ion is the most preferred.

However, when another anionic group is present in the molecule and it forms an intramolecular salt with $Q^{1+}$, $Q^{2+}$or $N^+$, $X^{n-}$ is not required.

In the present invention, as the quaternary salt compound, the quaternary salt compounds represented by the formula (b), (c) or (f) are more preferred, and the quaternary salt compounds represented by the formula (b) or (f) are particularly preferred. Further, in the formula (b), preferably 20 or more, particularly preferably 20–67, in total of repeating units of ethyleneoxy group should be contained in the bridging group represented by $L^{10}$. Further, in the formula (f), the unsaturated heterocyclic compound formed with $A^6$ particularly preferably represents 4-phenylpyridine, isoquinoline or quinoline.

Specific examples of the quaternary salt compounds represented by any of the formulas (a) to (f) are listed below (in the formulas, Ph represents a phenyl group). However, the present invention is not limited by the following exemplary compounds.

$Q^{30}$—$L_0$—$Q^+ \cdot 2X^-$
| No. | $Q^+$ = | $L_0$ = | $X^-$ = |
|---|---|---|---|
| 1 | 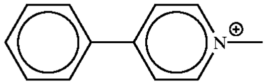 | $—C_2H_4—(OC_2H_4)_n—OC_2H_4—$ n = 20 | $Cl^\ominus$ |
| 2 | 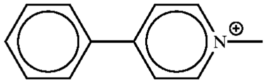 | $—C_2H_4—(OC_2H_4)_n—OC_2H_4—$ n ≈ 32 | $Cl^\ominus$ |
| 3 | 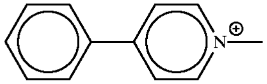 | $—C_2H_4—(OC_2H_4)_n—OC_2H_4—$ n ≈ 43 | $Cl^\ominus$ |
| 4 | 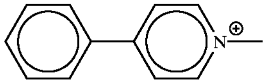 | $—C_2H_4—(OC_2H_4)_n—OC_2H_4—$ n ≈ 62 | $Cl^\ominus$ |
| 5 | 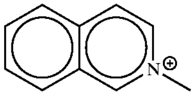 | $—C_2H_4—(OC_2H_4)_n—OC_2H_4—$ n ≈ 21 | $Cl^\ominus$ |
| 6 | 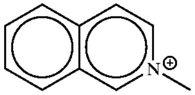 | $—C_2H_4—(OC_2H_4)_n—OC_2H_4—$ n ≈ 43 | $Cl^\ominus$ |
| 7 | 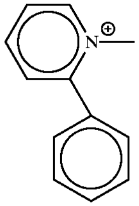 | $—C_2H_4—(OC_2H_4)_n—OC_2H_4—$ n = 20 | $Cl^\ominus$ |
| 8 | 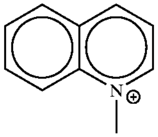 | $—C_2H_4—(OC_2H_4)_n—OC_2H_4—$ n ≈ 43 | $Cl^\ominus$ |

-continued
| | | | |
|---|---|---|---|
| 9 | 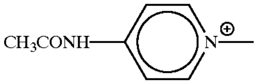 | $-C_2H_4-(OC_2H_4)_n-OC_2H_4-$<br>$n \approx 21$ | $Cl^{\ominus}$ |
| 10 | 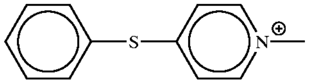 | $-C_2H_4-(OC_2H_4)_n-OC_2H_4-$<br>$n \approx 43$ | $Cl^{\ominus}$ |
| 11 | 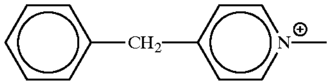 | $-C_2H_4-(OC_2H_4)_n-OC_2H_4-$<br>$n \approx 67$ | $Cl^{\ominus}$ |
| 12 | 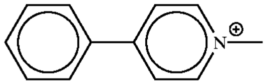 |  | $Cl^{\ominus}$ |
| 13 | 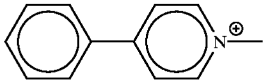 | 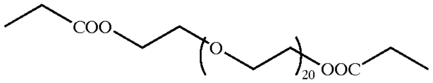 | $Cl^{\ominus}$ |
| 14 | 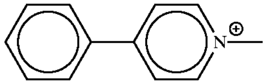 | 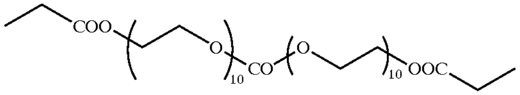 | $Cl^{\ominus}$ |
| 15 | 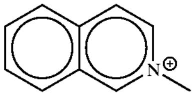 | 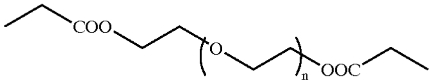<br>$n \fallingdotseq 43$ | $Cl^{\ominus}$ |
| 16 | 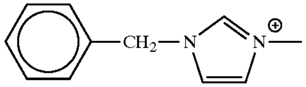 | $-C_2H_4-(OC_2H_4)_n-OC_2H_4-$<br>$n \approx 42$ | $Cl^{\ominus}$ |
| 17 | 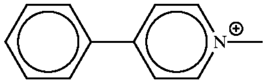 | $-C_2H_4-(OC_2H_4)_n-OC_2H_4-$<br>$n \approx 62$ | $Cl^{\ominus}$ |
| 18 | 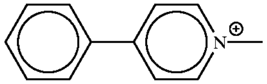 | $-C_2H_4-(OC_2H_4)_n-OC_2H_4-$<br>$n \approx 43$ | $Cl^{\ominus}$ |

-continued
| | | | |
|---|---|---|---|
| 19 | 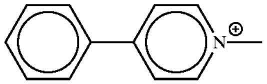 | $—C_2H_4—(OC_2H_4)_n—OC_2H_4—$<br>n = 20 | $Cl^{\ominus}$ |
| 20 | 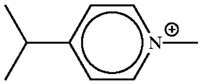 | $—C_2H_4—(OC_2H_4)_n—OC_2H_4—$<br>n ≈ 34 | $Cl^{\ominus}$ |
| 21 | 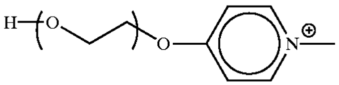 | $—(CH_2)_5—$ | $Cl^{\ominus}$ |
| 22 | 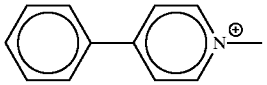 | 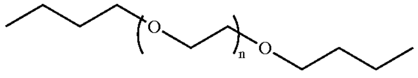<br>n ≐ 43 | $Cl^{\ominus}$ |
| 23 | 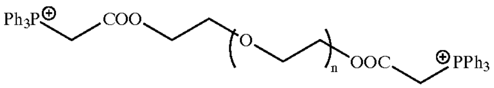 •2Br⊖<br>n ≐ 43 | | |
| 24 | 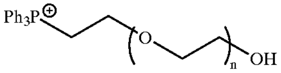 •Br⊖<br>n ≐ 33 | | |
| 25 | 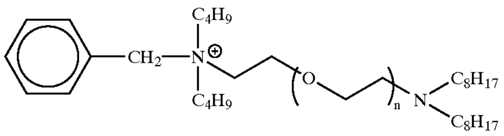 •Cl⊖<br>n ≐ 33 | | |
| 26 | 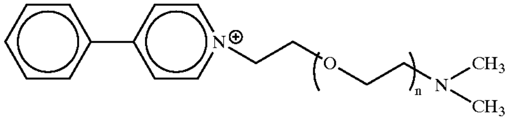 •Cl⊖<br>n ≐ 43 | | |

-continued
| | |
|---|---|
| 27 | 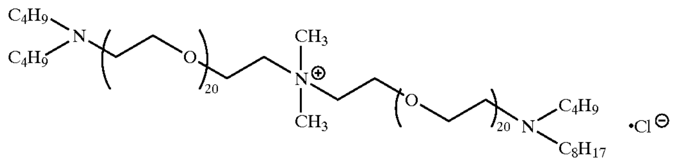 |
| 28 | 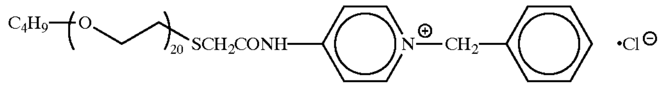 |
| 29 | 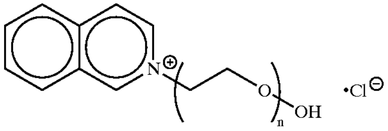 n ≒ 67 |
| 30 | 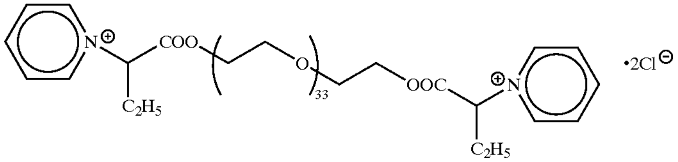 |
| 31 | 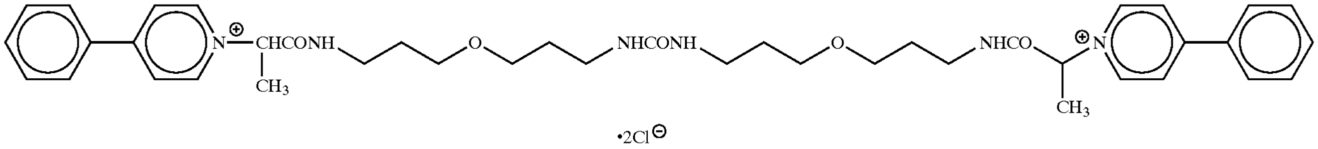 |
$Q^+—L_0—Q^+\cdot 2X^-$
| No. | $Q^+$ = | $L_0$ = | $X^-$ = |
|---|---|---|---|
| 32 | 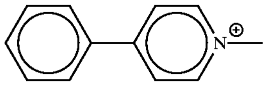 | 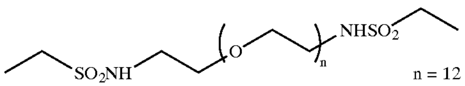 n = 12 | $Cl^\ominus$ |

-continued
| | | | |
|---|---|---|---|
| 33 | 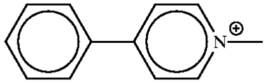 | 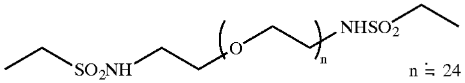 n ≒ 24 | Br⊖ |
| 34 | 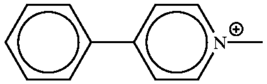 | 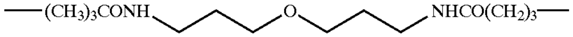 | Cl⊖ |
| 35 | 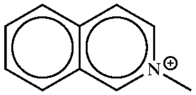 | 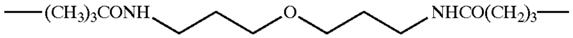 | Cl⊖ |
| 36 | 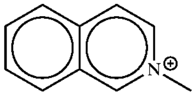 | 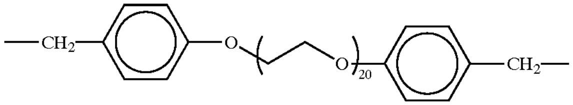 | Cl⊖ |
| 37 | 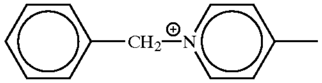 | 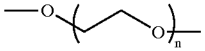 n ≒ 33 | Cl⊖ |
| 38 | 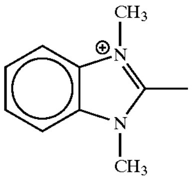 | 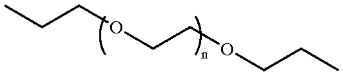 n ≒ 43 | Cl⊖ |
| 39 | $(C_4H_9)_3N^{61}$ — |  n = 20 | Cl⊖ |
| 40 | 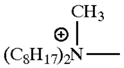 |  n ≒ 43 | Cl⊖ |
| 41 | $Ph_3P^{\oplus}$— |  n = 20 | Cl⊖ |

-continued

| | | | |
|---|---|---|---|
| 42 | $Ph_3P^{\oplus}$— | 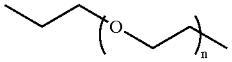 n ≐ 33 | $Br^{\ominus}$ |

$Q^+—CH_2CONH—L—NHCOCH_2—Q^+ \cdot 2X^-$

| No. | $Q^+$ = | L = | $X^-$ = |
|---|---|---|---|
| 43 | $Ph_3P^{\oplus}$— | $—C_2H_4—(OC_2H_4)_n—$ n = 3 | $Cl^{\oplus}$ |
| 44 | $Ph_3P^{\oplus}$— | $—C_2H_4—(OC_2H_4)_n—$ n = 20 | $Br^{\oplus}$ |
| 45 | $Ph_3P^{\oplus}$— | $—C_2H_4—(OC_2H_4)_n—$ n ≈ 34 | $Cl^{\oplus}$ |
| 46 | $Ph_3P^{\oplus}$— | $—C_2H_4—(OC_2H_4)_n—$ n ≈ 67 | $Cl^{\oplus}$ |
| 47 | 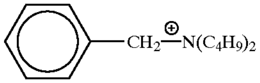 | $—C_2H_4—(OC_2H_4)_n—$ n = 12 | $Cl^{\oplus}$ |
| 48 | 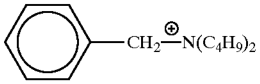 | $—C_2H_4—(OC_2H_4)_n—$ n = 30 | $Br^{\oplus}$ |
| 49 | 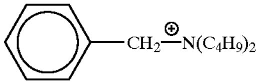 | $—C_2H_4—(OC_2H_4)_n—$ n ≈ 43 | 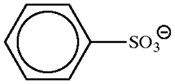 |
| 50 | 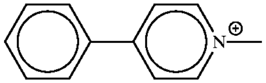 | $—C_2H_4—(OC_2H_4)_n—$ n = 3 | $Cl^{\oplus}$ |
| 51 | 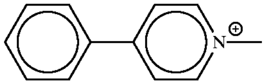 | $—C_2H_4—(OC_2H_4)_n—$ n = 12 | $Cl^{\oplus}$ |
| 52 | 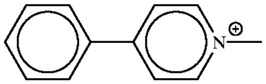 | $—C_2H_4—(OC_2H_4)_n—$ n = 20 | $Cl^{\oplus}$ |

-continued
| | | | |
|---|---|---|---|
| 53 | 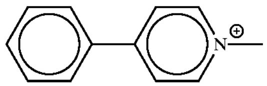 | $—C_2H_4—(OC_2H_4)_n—$<br>n ≈ 43 | $Cl^{\ominus}$ |
| 54 | 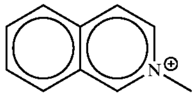 | $—C_2H_4—(OC_2H_4)_n—$<br>n = 2 | $Cl^{\ominus}$ |
| 55 | 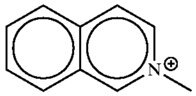 | $—C_2H_4—(OC_2H_4)_n—$<br>n = 12 | $Br^{\ominus}$ |
| 56 | 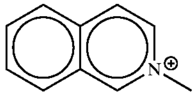 | $—C_2H_4—(OC_2H_4)_n—$<br>n = 30 | 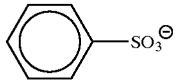 |
| 57 | 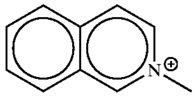 | $—C_2H_4—(OC_2H_4)_n—$<br>n ≈ 67 | $(COO)_2^{2\ominus}$ |
| 58 | 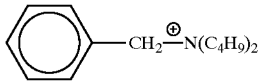 | $—C_2H_4—(OC_2H_4)_n—$<br>n = 12 | $Cl^{\ominus}$ |
| 59 | 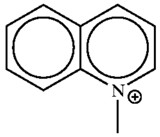 | $—C_2H_4—(OC_2H_4)_n—$<br>n = 20 | $Cl^{\ominus}$ |
| 60 | 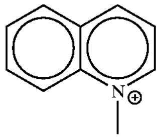 | $—C_2H_4—(OC_2H_4)_n—$<br>n = 30 | $Cl^{\ominus}$ |

-continued

| | | | |
|---|---|---|---|
| 61 | 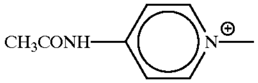 | $-C_2H_4-(OC_2H_4)_n-$<br>n ≈ 67 | $Cl^{\ominus}$ |
| 62 | 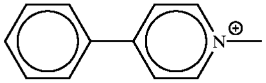 | $-C_3H_6-(OC_2H_4)_n-OC_3H_6-$<br>n = 2 | $Cl^{\ominus}$ |
| 63 | 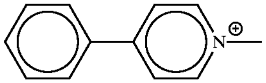 | $-C_3H_6-(OC_2H_4)_n-OC_3H_6-$<br>n = 20 | $Cl^{\ominus}$ |
| 64 | 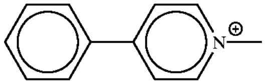 | $-C_3H_6-(OC_2H_4)_n-OC_3H_6-$<br>n ≈ 43 | $Cl^{\ominus}$ |
| 65 | $Ph_3P^{\oplus}-$ | $-C_3H_6-(OC_2H_4)_n-OC_3H_6-$<br>n = 2 | $Cl^{\ominus}$ |
| 66 | $Ph_3P^{\oplus}-$ | $-C_3H_6-(OC_2H_4)_n-OC_3H_6-$<br>n = 12 | $Cl^{\ominus}$ |
| 67 | 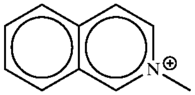 | $-C_3H_6-(OC_2H_4)_n-OC_3H_6-$<br>n = 20 | $Cl^{\ominus}$ |
| 68 | 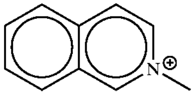 | $-C_3H_6-(OC_2H_4)_n-OC_3H_6-$<br>n ≈ 43 | $Cl^{\ominus}$ |
| 69 | $(C_3H_7)_3N^{\oplus}-$ | $-C_3H_6-(OC_2H_4)_n-OC_3H_6-$<br>n ≈ 67 | $Cl^{\ominus}$ |
| 70 | $(C_3H_7)_3N^{\oplus}-$ | 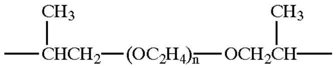<br>n = 12 | $Cl^{\ominus}$ |
| 71 | 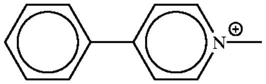 | 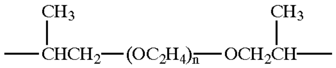<br>n ≑ 18 | $Cl^{\ominus}$ |

-continued
| | | | |
|---|---|---|---|
| 72 | 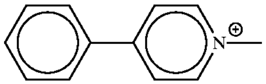 | 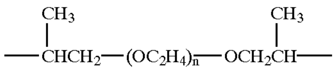<br>n = 20 | Cl⊕ |
| 73 | 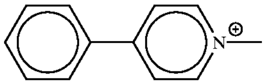 | 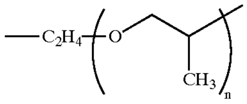<br>n = 4 | Cl⊕ |
| 74 | 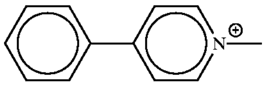 | 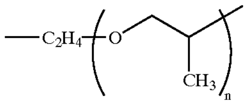<br>n ≐ 13 | Cl⊕ |
| 75 | 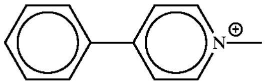 | 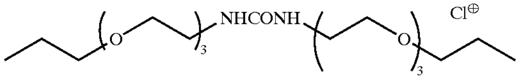 | Cl⊕ |
| 76 | 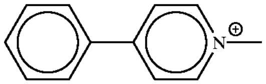 | 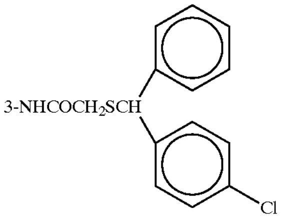 | Cl⊕ |
| 77 | 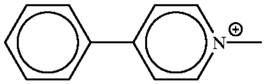 | 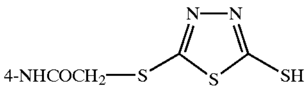 | Cl⊕ |
| 78 | 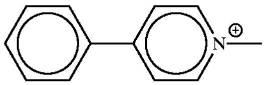 | 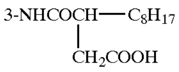 | Cl⊕ |
| 79 | 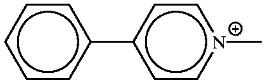 |  | Cl⊕ |

-continued
| | | | |
|---|---|---|---|
| 80 | 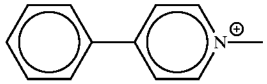 | 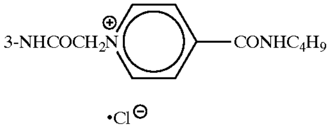 | $Cl^{\oplus}$ |
| 81 | 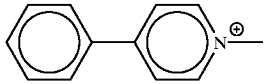 | 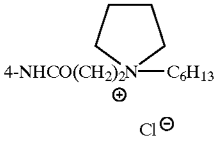 | $Cl^{\oplus}$ |
| 82 | 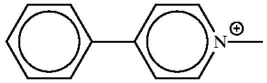 | 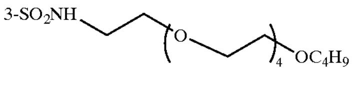 | $Cl^{\oplus}$ |
| 83 | 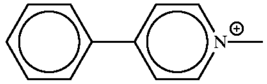 | 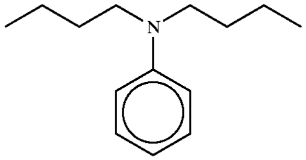 | $Cl^{\oplus}$ |
| 84 | 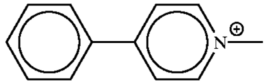 | 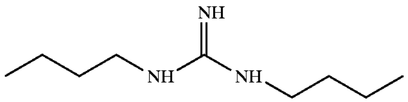 | $Cl^{\oplus}$ |
| 85 | 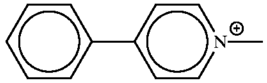 |  | $Cl^{\oplus}$ |
| 86 | 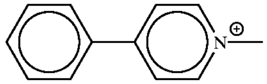 | 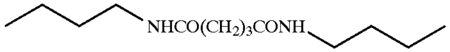 | $Cl^{\oplus}$ |

The quaternary salt compounds represented by the formulas (a) to (f) can be easily synthesized by known methods. As for specific synthesis prescriptions, one can refer to Synthesis Examples 1–6 mentioned later.

The nucleation accelerator that can be used in the present invention may be dissolved in an appropriate water-miscible organic solvent such as an alcohol (e.g., methanol, ethanol, propanol or a fluorinated alcohol), a ketone (e.g., acetone or methyl ethyl ketone), dimethylformamide, dimethylsulfoxide or methyl cellosolve and used.

Alternatively, the nucleation accelerator may also be dissolved in an oil such as dibutyl phthalate, tricresyl phosphate, glyceryl triacetate or diethyl phthalate using an auxiliary solvent such as ethyl acetate or cyclohexanone and mechanically processed into an emulsion dispersion by a conventionally well-known emulsion dispersion method before use. Alternatively, powder of the nucleation accelerator may be dispersed in water by means of ball mill, colloid mill or ultrasonic waves according to a method known as solid dispersion method, and used.

The nucleation accelerator that can be used in the present invention is preferably added to a non-photosensitive layer consisting of a hydrophilic colloid layer not containing silver halide emulsion provided on the silver halide emulsion layer side of the support, particularly preferably to a hydrophilic colloid layer between a silver halide emulsion layer and the support.

In the present invention, the nucleation accelerator is preferably used in an amount of from $1\times10^{-6}$ to $2\times10^{-2}$ mol, more preferably from $1\times10^{-5}$ to $2\times10^{-2}$ mol, most preferably from $2\times10^{-5}$ to $1\times10^{-2}$ mol, per mol of silver halide. It is also possible to use two or more kinds of nucleation accelerators in combination.

Silver halide of the silver halide emulsion used for the silver halide photographic light-sensitive material of the present invention is not particularly limited as for silver halide, and any of silver chloride, silver chlorobromide, silver bromide, silver chloroiodobromide and silver iodobromide may be used. However, silver chlorobromide and silver chloroiodobromide having a silver chloride content of not less than 50 mol % are preferred. The form of silver halide grain may be any of a cubic, tetradecahedral, octahedral, variable and tabular forms, but a cubic form is preferred. The silver halide preferably has a mean grain size of 0.1–0.7 $\mu$m, more preferably 0.1–0.5 $\mu$m, and preferably has a narrow grain size distribution in terms of a variation coefficient, which is represented as {(Standard deviation of grain size)/(mean grain size)}×100, of preferably 15% or less, more preferably 10% or less.

The silver halide grains may have uniform or different phases for the inside and the surface layer. Further, they may have a localized layer having a different halogen composition inside the grains or as surface layers of the grains.

The photographic emulsion used for the present invention can be prepared using the methods described in P. Glafkides, Chimie et Physique Photographique, Paul Montel (1967); G. F. Duffin, Photographic Emulsion Chemistry, The Focal Press (1966); V. L. Zelikman et al, Making and Coating Photographic Emulsion, The Focal Press (1964) and so forth.

Specifically, any of an acidic process and a neutral process may be used. In addition, a soluble silver salt may be reacted with a soluble halogen salt by any of the single jet method, double jet method and a combination thereof. A method of forming grains in the presence of excessive silver ions (so-called reverse mixing method) may also be used.

As one of the simultaneous mixing methods, a method of maintaining the pAg constant in the liquid phase where silver halide is produced, that is, the so-called controlled double jet method may also be used. Further, it is preferable to form grains using the so-called silver halide solvent such as ammonia, thioether or tetra-substituted thiourea, more preferably using a tetra-substituted thiourea compound as described in JP-A-53-82408 and JP-A-55-77737. Preferred examples of the thiourea compound include tetramethylthiourea and 1,3-dimethyl-2-imidazolidinethione. While the amount of the silver halide solvent to be added may vary depending on the kind of the silver halide solvent used, the desired grain size and halide composition of silver halide to be desired, a range of from $10^{-5}$ to $10^{-2}$ mol per mol of silver halide is preferred.

According to the controlled double jet method or the method of forming grains using a silver halide solvent, a silver halide emulsion comprising regular crystal form grains and having a narrow grain size distribution can be easily prepared, and these methods are useful for preparing the silver halide emulsion used for the present invention.

In order to achieve a uniform grain size, it is preferable to rapidly grow grains within the range of not exceeding the critical saturation degree by using a method of changing the addition rate of silver nitrate or alkali halide according to the grain growth rate as described in British Patent No. 1,535,016, JP-B-48-36890 and JP-B-52-16364, or a method of changing the concentration of the aqueous solution as described in U.S. Pat. No. 4,242,445 and JP-A-55-158124.

The silver halide emulsion used for the present invention may contain a metal belonging to Group VIII. In particular, it is preferable to add a rhodium compound, iridium compound or ruthenium compound in order to achieve high contrast and low fog. Further, a hexacyanide metal complex such as $K_4[Fe(CN)_6]$, $K_4[Ru(CN)_6]$ and $K_3[Cr(CN)_6]$ is advantageously doped to attain higher sensitivity.

As the rhodium compound used for the present invention, a water-soluble rhodium compound can be used. Examples thereof include rhodium (III) halide compounds and rhodium complex salts having a halogen, amine, oxalato, aquo or the like as a ligand, such as hexachlororhodium(III) complex salt, pentachloroaquorhodium complex salt, tetrachlorodiaquorhodium complex salt, hexabromorhodium(III) complex salt, hexaaminerhodium(III) complex salt and trioxalatorhodium(III) complex salt. The rhodium compound is dissolved in water or an appropriate solvent prior to use and a method commonly used for stabilizing the rhodium compound solution, that is, a method of adding an aqueous solution of hydrogen halide (e.g., hydrochloric acid, hydrobromic acid or hydrofluoric acid) or an alkali halide (e.g., KCl, NaCl, KBr or NaBr) may be used. In place of using a water-soluble rhodium, separate silver halide grains that have been previously doped with rhodium may be added and dissolved at the time of preparation of silver halide.

The rhenium, ruthenium or osmium used for the present invention is added in the form of a water-soluble complex salt described in JP-A-63-72042, JP-A-1-285941, JP-A-2-20852, JP-A-2-20855 and so forth. Particularly preferred examples are six-coordinate complex salts represented by the following formula:

$$[ML_6]^{n-}$$

In the formula, M represents Ru, Re or Os, L represents a ligand, and n represents 0, 1, 2, 3 or 4. In this case, the counter ion plays no important role and an ammonium or alkali metal may be used. Preferred examples of the ligand include a halide ligand, a cyanide ligand, a cyan oxide ligand, a nitrosyl ligand, a thionitrosyl ligand and so forth. Specific examples of the complex that can be used for the present invention are shown below. However, the scope of the present invention is not limited to these examples.

$[ReCl_6]^{3-}$ $[ReBr_6]^{3-}$ $[ReCl_5(NO)]^{2-}$ $[Re(NS)Br_5]^{2-}$ $[Re(NO)(CN)_5]^{2-}$ $[Re(O)_2(CN)_4]^{3-}$ $[RuCl_6]^{3-}$ $[RuCl_4(H_2O)_2]^{-}$ $[RuCl_5(H_2O)]^{2-}$ $[RuBr_5(NS)]^{2-}$ $[Ru(CO)_3Cl_3]^{2-}$ $[Ru(CO)Cl_5]^{2-}$ $[Ru(CO)Br_5]^{2-}$ $[OsCl_6]^{3-}$ $[OsCl_5(NO)]^{2-}$ $[Os(NO)(CN)_5]^{2-}$ $[Os(NS)Br_5]^{2-}$ $[Os(CN)_6]^{4-}$ $[OS(O)_2(CN)_4]^{4-}$

The amount of these compounds is preferably from $1\times10^{-9}$ to $1\times10^{-5}$ mol, particularly preferably from $1\times10^{-8}$ to $1\times10^{-6}$ mol, per mole of silver halide.

The iridium compounds used in the present invention include hexachloroiridium, hexabromoiridium, hexaammineiridium, pentachloronitrosyliridium and so forth. The iron compounds used in the present invention include potassium hexacyanoferrate(II) and ferrous thiocyanate.

The silver halide emulsion used for the present invention is preferably subjected to chemical sensitization. The chemical sensitization may be performed by using a known method such as sulfur sensitization, selenium sensitization, tellurium sensitization, noble metal sensitization or the like. These sensitization methods may be used alone or in any combination. When these sensitization methods are used in combination, preferable combinations include sulfur and gold sensitizations, sulfur, selenium and gold sensitizations, sulfur, tellurium and gold sensitizations and so forth.

The sulfur sensitization used in the present invention is usually performed by adding a sulfur sensitizer and stirring the emulsion at a high temperature of 40° C. or above for a predetermined time. The sulfur sensitizer may be a known compound and examples thereof include, in addition to the sulfur compounds contained in gelatin, various sulfur compounds such as thiosulfates, thioureas, thiazoles and rhodanines, among which thiosulfates and thioureas are preferred. As the thiourea compounds, the specifically tetra-substituted thiourea compounds described in U.S. Pat. No. 4,810,626 are particularly preferred. Although the amount of the sulfur sensitizer to be added varies depending on various conditions such as pH, temperature and grain size of silver halide at the time of chemical ripening, it is preferably from $10^{-7}$ to $10^{-2}$ mol, more preferably from $10^{-5}$ to $10^{-3}$ mol, per mol of silver halide.

The selenium sensitizer used for the present invention may be a known selenium compound. That is, the selenium sensitization is usually performed by adding a labile and/or non-labile selenium compound and stirring the emulsion at a high temperature of 40° C. or above for a predetermined time. Examples of the labile selenium compound include those described in JP-B-44-15748, JP-B-43-13489, JP-A-4-109240 and JP-A-4-324855. Among these, particularly preferred are those compounds represented by formulas (VIII) and (IX) of JP-A-4-324855.

The tellurium sensitizer that can be used for the present invention is a compound capable of producing silver telluride, presumably serve as a sensitization nucleus, on the surface or inside of silver halide grains. The rate of the formation of silver telluride in a silver halide emulsion can be examined according to the method described in JP-A-5-313284.

Examples of the tellurium sensitizer that can be used include the compounds described in U.S. Pat. Nos. 1,623,499, 3,320,069 and 3,772,031; British Patents Nos. 235,211, 1,121,496, 1,295,462 and 1,396,696; Canadian Patent No. 800,958; JP-A-4-204640, JP-A-4-271341, JP-A-4-333043, JP-A-5-303157; J. Chem. Soc. Chem. Commun., 635 (1980); ibid., 1102 (1979); ibid., 645 (1979); J. Chem. Soc. Perkin. Trans., 1, 2191 (1980); S. Patal (compiler), The Chemistry of Organic Selenium and Tellurium Compounds, Vol. 1 (1986); and ibid., Vol. 2 (1987). The compounds represented by the formulas (II), (III) and (IV) of JP-A-4-324855 are preferred.

The amount of the selenium or tellurium sensitizer used for the present invention varies depending on silver halide grains used or chemical ripening conditions. However, it is generally from about $10^{-8}$ to about $10^{-2}$ mol, preferably from about $10^{-7}$ to about $10^{-3}$ mol, per mol of silver halide. The conditions for chemical sensitization in the present invention are not particularly restricted. However, in general, pH is 5–8, pAg is 6–11, preferably 7–10 and temperature is 40–95° C., preferably 45–85° C.

Noble metal sensitizers that can be used for the present invention include gold, platinum, palladium and iridium, and gold sensitization is particularly preferred. Specific examples of the gold sensitizers used for the present invention include chloroauric acid, potassium chloroaurate, potassium aurithiocyanate, gold sulfide and so forth, which can be used in an amount of about $10^{-7}$ to about $10^{-2}$ mol per mol of silver halide.

As for the silver halide emulsion used for the present invention, production or physical ripening process for the silver halide grain may be performed in the presence of a cadmium salt, sulfite, lead salt, thallium salt or the like.

In the present invention, reduction sensitization may be used. Examples of the reduction sensitizer that can be used include a stannous salt, amine, formamidinesulfinic acid, silane compound and so forth.

To the silver halide emulsion, a thiosulfonic acid compound may be added according to the method described in European Unexamined Patent Publication EP293917A.

In the photographic light-sensitive material used for the present invention, one kind of silver halide emulsion may be used or two or more kinds of silver halide emulsions (for example, those having different average grain sizes, different halogen compositions, different crystal habits, those subjected to chemical sensitizations with different conditions or those having different sensitivities) may be used in combination. In order to obtain high contrast, it is preferable to provide an emulsion layer having higher sensitivity as it becomes closer to a support as described in JP-A-6-324426.

The photosensitive silver halide emulsion may be spectrally sensitized with a sensitizing dye for comparatively long wavelength, i.e., blue light, green light, red light or infrared light. The compounds of the formula [I] mentioned in JP-A-55-45015 and the compounds of a formula [I] mentioned in JP-A-9-160185 are preferred, and the compounds of the formula [I] mentioned in JP-A-9-160185 are particularly preferred. Specifically, the compounds of (1) to (19) mentioned in JP-A-55-45015, the compounds of I-1 to I-40 and the compounds of I-56 to I-85 mentioned in JP-A-9-160185 and so forth can be mentioned.

Examples of the other sensitizing dyes include a cyanine dye, merocyanine dye, complex cyanine dye, complex merocyanine dye, holopolar cyanine dye, styryl dye, hemicyanine dye, oxonol dye, hemioxonol dye and so forth.

Other useful sensitizing dyes that can be used for the present invention are described in, for example, Research Disclosure, Item 17643, IV-A, page 23 (December, 1978); ibid., Item 18341X, page 437 (August, 1979) and publications cited in the same.

In particular, sensitizing dyes having spectral sensitivity suitable for spectral characteristics of light sources in various scanners, image setters or photomechanical cameras can be advantageously selected.

For example, A) for an argon laser light source, Compounds (I)-1 to (I)-8 described in JP-A-60-162247, Compounds I-1 to I-28 described in JP-A-2-48653, Compounds I-1 to I-13 described in JP-A-4-330434, compounds of Examples 1 to 14 described in U.S. Pat. No. 2,161,331, and Compounds 1 to 7 described in West Germany Patent No. 936,071; B) for a helium-neon laser light source, Compounds I-1 to I-38 described in JP-A-54-18726, Compounds I-1 to I-35 described in JP-A-6-75322, and Compounds I-1 to I-34 described in JP-A-7-287338; C) for an LED light source, Dyes 1 to 20 described in JP-B-55-39818, Compounds I-1 to I-37 described in JP-A-62-284343, and Compounds I-1 to I-34 described in JP-A-7-287338; D) for a semiconductor laser light source, Compounds I-1 to I-12 described in JP-A-59-191032, Compounds I-1 to I-22 described in JP-A-60-80841, Compounds I-1 to I-29 described in JP-A-4-335342, and Compounds I-1 to I-18 described in JP-A-59-192242; and E) for a tungsten or xenon light source of a photomechanical camera, besides the aforementioned compounds, Compounds I-41 to I-55 and Compounds I-86 to I-97 described in JP-A-9-160185, and Compounds 4-A to 4-S, Compounds 5-A to 5-Q, and Compounds 6-A to 6-T described in JP-A-6-242547 and so forth may be advantageously selected.

These sensitizing dyes may be used individually or in combination, and a combination of sensitizing dyes is often used for the purpose of, in particular, supersensitization. In combination with a sensitizing dye, a dye which itself has no spectral sensitization effect, or a material that absorbs substantially no visible light, but exhibits supersensitization may be incorporated into the emulsion.

Useful sensitizing dyes, combinations of dyes that exhibit supersensitization, and materials that show supersensitization are described in, for example, Research Disclosure, Vol. 176, 17643, page 23, Item IV-J (December 1978); JP-B-49-25500, JP-B-43-4933, JP-A-59-19032, JP-A-59-192242 mentioned above and so forth.

The sensitizing dyes used for the present invention may be used in a combination of two or more of them. The sensitizing dye may be added to a silver halide emulsion by dispersing it directly in the emulsion, or by dissolving it in a sole or mixed solvent of such solvents as water, methanol, ethanol, propanol, acetone, methyl cellosolve, 2,2,3,3-tetrafluoropropanol, 2,2,2-trifluoroethanol, 3-methoxy-1-propanol, 3-methoxy-1-butanol, 1-methoxy-2-propanol or N,N-dimethylformamide, and then adding the solution to the emulsion.

Alternatively, the sensitizing dye may be added to the emulsion by the method disclosed in U.S. Pat. No. 3,469,987, in which a dye is dissolved in a volatile organic solvent, the solution is dispersed in water or a hydrophilic colloid and the dispersion is added to the emulsion; a method disclosed in, for example, JP-B-44-23389, JP-B-44-27555, JP-B-57-22091 and so forth, in which a dye is dissolved in an acid and the solution is added to the emulsion, or a dye is made into an aqueous solution in the presence of an acid or base and the solution is added to the emulsion; a method disclosed in, for example, U.S. Pat. Nos. 3,822,135 and 4,006,025, in which a dye is made into an aqueous solution or a colloid dispersion in the presence of a surfactant, and the solution or dispersion is added to the emulsion; the method disclosed in JP-A-53-102733 and JP-A-58-105141, in which a dye is directly dispersed in a hydrophilic colloid and the dispersion is added to the emulsion; or the method disclosed in JP-A-51-74624, in which a dye is dissolved by using a compound capable of red-shift and the solution is added to the emulsion. Ultrasonic waves may also be used for the preparation of the solution.

The sensitizing dye used for the present invention may be added to a silver halide emulsion that at any step known to be useful during the preparation of emulsion. For example, the dye may be added at a step of formation of silver halide grains and/or in a period before desalting or at a step of desalting, and/or in a period after desalting and before initiation of chemical ripening, as disclosed in, for example, U.S. Pat. Nos. 2,735,766, 3,628,960, 4,183,756, 4,225,666, JP-A-58-184142, JP-A-60-196749 etc., or the dye may be added in any period or at any step before coating of the emulsion, such as immediately before or during chemical ripening, or in a period after chemical ripening but before coating, as disclosed in, for example, JP-A-58-113920. Further, a sole kind of compound alone or compounds different in structure in combination may be added as divided portions, for example, a part is added during grain formation, and the remaining during chemical ripening or after completion of the chemical ripening, or a part is added before or during chemical ripening and the remaining after completion of the chemical ripening, as disclosed in, for example, U.S. Pat. No. 4,225,666 and JP-A-58-7629. The kind of compound or the kind of the combination of compounds added as divided portions may be changed.

The addition amount of the sensitizing dye used for the present invention varies depending on the shape, size, halogen composition of silver halide grains, method and degree of chemical sensitization, kind of antifoggant and so forth, but the addition amount may be from $4\times10^{-6}$ to $8\times10^{-3}$ mo, per mol of silver halide. For example, when the silver halide grain size is from 0.2–1.3 $\mu$m, the addition amount is preferably from $2\times10^{-7}$ to $3.5\times10^{-6}$, more preferably from $6.5\times10^{-7}$ to $2.0\times10^{-6}$ mol, per $m^2$ of the surface area of silver halide grains.

There are no particular limitations on various additives used in the photographic light-sensitive material of the present invention and, for example, those described in the following can preferably be used.

Polyhydroxybenzene compounds described from line 11, right lower column, page 10 to line 5, left lower column, page 12 of JP-A-3-39948, specifically, Compounds (III)-1 to (III)-25 described in the same.

Compounds that substantially do not have an absorption maximum in the visible region represented by the formula (I) described in JP-A-1-118832, specifically, Compounds I-1 to I-26 described in the same.

Antifoggants described from line 19, right lower column, page 17 to line 4, right upper column, page 18 of JP-A-2-103536.

Polymer latexes described from line 12, left lower column, page 18 to line 20, left lower column, the same page of JP-A-2-103536, polymer latexes having an active methylene group represented by formula (I) described in JP-A-9-179228, specifically, Compounds I-1 to I-16 described in the same, polymer latexes having core/shell structure described in JP-A-9-179228, specifically, Compounds P-1 to P-55 described in the same, and acidic polymer latexes described from line 1, left column, page 14 to line 30, right column, the same page of JP-A-7-104413, specifically, Compounds II-1) to II-9) described on page 15 of the same.

Matting agents, lubricants and plasticizers described from line 15, left upper column, page 19 to line 15, right upper column, the same page of JP-A-2-103536.

Hardening agents described from line 5, right upper column, page 18 to line 17, right upper column, the same page of JP-A-2-103536.

Compounds having an acid radical described from line 6, right lower column, page 18 to line 1, left upper column, page 19 of JP-A-2-103536.

Conductive materials described from line 13, left lower column, page 2 to line 7, right upper column, page 3 of JP-A-2-18542, specifically, metal oxides described from line 2, right lower column, page 2 to line 10, right lower column, the same page of the same, and conductive polymer compounds P-1 to P-7 described in the same.

Water-soluble dyes described from line 1, right lower column, page 17 to line 18, right upper column, the same page of JP-A-2-103536.

Solid dispersion dyes represented by the formulas (FA), (FA1), (FA2) and (FA3) described in JP-A-9-179243, specifically, Compounds F1 to F34 described in the same, Compounds (II-2) to (II-24), Compounds (III-5) to (III-18) and Compounds (IV-2) to (IV-7) described in JP-A-7-152112, and solid dispersion dyes described in JP-A-2-294638 and JP-A-5-11382.

Redox compounds capable of releasing a development inhibitor by oxidation described in JP-A-5-274816, preferably redox compounds represented by the formulas (R-1), (R-2) and (R-3) described in the same, specifically, Compounds R-1 to R-68 described in the same.

Binders described from line 1 to line 20, right lower column, page 3 of JP-A-2-18542.

The swelling ratio of the hydrophilic colloid layers including the emulsion layers and protective layers of the silver halide photographic light-sensitive materials of the present invention is preferably in the range of 80–150%, more preferably 90–140%. The swelling ratio of the hydrophilic colloid layer can be determined in the following manner. The thickness ($d_0$) of the hydrophilic colloid layers including the emulsion layers and protective layers of the silver halide photographic light-sensitive material is measured and the thickness (Pd) of the swollen hydrophilic colloid layers is measured after the silver halide photographic material is immersed in distilled water at 25° C. for one minute. The swelling ratio is calculated from the following equation: Swelling ratio (%)=(ûd/$d_0$)×100.

The silver halide photographic light-sensitive material of the present invention has a film surface pH of 4.0–7.5, preferably 4.2–6.0, for the side on which silver halide emulsion layers are coated.

As supports that can be used for practicing the present invention, for example, baryta paper, polyethylene-laminated paper, polypropylene synthetic paper, glass plate, cellulose acetate, cellulose nitrate, and polyester film, e.g., polyethylene terephthalate can be exemplified. The support is appropriately selected depending on the intended use of the silver halide photographic light-sensitive material.

Further, supports comprising a styrene polymer having syndiotactic structure described in JP-A-7-234478 and U.S. Pat. No. 5,558,979 are also preferably used.

Processing chemicals such as developing solution (developer) and fixing solution (fixer) and processing methods that can be used for the silver halide photographic light-sensitive material according to the present invention are described below, but of course the present invention should not be construed as being limited to the following description and specific examples.

For the development of the silver halide photographic light-sensitive material of the present invention, any of known methods can be used, and known developers can be used.

A developing agent for use in developer (hereinafter, starter developer and replenisher developer are collectively referred to as developer) used for the present invention is not particularly limited, but it is preferable to contain a dihydroxybenzene compound, ascorbic acid derivative or hydroquinonemonosulfonate, and they can be used each alone or in combination. In particular, a dihydroxybenzene type developing agent and an auxiliary developing agent exhibiting superadditivity are preferably contained in combination, and combinations of a dihydroxybenzene compound or an ascorbic acid derivative with a 1-phenyl-3-pyrazolidone compound, or combinations of a dihydroxybenzene compound or ascorbic acid compound with a p-aminophenol compound can be mentioned.

Examples of the dihydroxybenzene developing agent;as a developing agent used for the present invention includes hydroquinone, chlorohydroquinone, isopropylhydroquinone, methylhydroquinone and so forth, and hydroquinone is particularly preferred. Examples of the ascorbic acid derivative developing agent include ascorbic acid, isoascorbic acid and salts thereof. Sodium erythorbate is particularly preferred in view of material cost.

Examples of the 1-phenyl-3-pyrazolidones or derivatives thereof as the developing agent used for the present invention include 1-phenyl-3-pyrazolidone, 1phenyl-4,4-dimethyl-3-pyrazolidone, 1-phenyl-4-methyl-4-hydroxymethyl-3-pyrazolidone and so forth.

Examples of the p-aminophenol type developing agent that can be used for the present invention include N-methyl-p-aminophenol, p-aminophenol, N-(B-hydroxyphenyl)-p-aminophenol, N-(4-hydroxyphenyl)glycine, o-methoxy-p-(N,N-dimethylamino)phenol, o-methoxy-p-(N-methylamino)phenol etc., : and N-methyl-p-aminophenol and aminophenols described in JP-A-9-297377 and JP-A-9-297378 are preferred.

The dihydroxybenzene type developing agent is preferably used in an amount of generally 0.05–0.8 mol/L. When a dihydroxybenzene compound and a 1-phenyl-3-pyrazolidone compound or a p-aminophenol compound are used in combination, the former is preferably used in an amount of 0.05–0.6 mol/L, more preferably 0.10–0.5 mol/L, and the latter is preferably used in an amount of 0.06 mol/L or less, more preferably 0.003–0.03 mol/L.

The ascorbic acid derivative developing agent is preferably used in an amount of generally 0.01–0.5 mol/L, more preferably 0.05–0.3 mol/L. When an ascorbic acid derivative and a 1-phenyl-3-pyrazolidone compound or a p-aminophenol compound are used in combination, the ascorbic acid derivative is preferably used in an amount of from 0.01–0.5 mol/L, and the 1-phenyl-3-pyrazolidone compound or p-aminophenol compound is preferably used in an amount of 0.005–0.2 mol/L.

The developer used in processing the light-sensitive material of the present invention may contain additives (e.g., a developing agent, alkali agent, pH buffer, preservative, chelating agent etc.) that are commonly used. Specific examples thereof are described below, but the present invention is by no means limited to them.

Examples of the buffer for use in the developer used in development of the light-sensitive material of the present invention include carbonates, boric acids described in JP-A-62-186259, saccharides (e.g., saccharose) described in JP-A-60-93433, oximes (e.g., acetoxime), phenols (e.g., 5-sulfosalicylic acid), tertiary phosphates (e.g., sodium salt and potassium salt) ect., and carbonates and boric acids are preferably used. The buffer, in particular the carbonate, is preferably used in an amount of 0.05 mol/L or more, particularly preferably 0.08–1.0 mol/L.

In the present invention, both the starter developer and the replenisher developer preferably have a property that "the solution shows pH increase of 0.2–1.5 when 0.1 mol of sodium hydroxide is added to 1 L of the solution". As for the method of confirming whether the starter developer or replenisher developer used has the property, pH of the starter developer or replenisher developer to be tested is adjusted to 10.5, 0.1 mol of sodium hydroxide is added to 1 L of the solution, then pH of the solution is measured, and if increase of pH value is in the range of 0.2–1.5, the solution is determined to have the property defined above. In the present invention, it is particularly preferable to use a starter developer and replenisher developer showing pH increase of 0.3–1.0 in the aforementioned test.

Examples of the preservative that can be used for the present invention include sodium sulfite, potassium sulfite, lithium sulfite, ammonium sulfite, sodium bisulfite, sodium methabisulfite, formaldehyde-sodium bisulfite and so forth. A sulfite is used in an amount of preferably 0.2 mol/L or more, particularly preferably 0.3 mol/L or more, but if it is added too excessively, silver staining in the developer is caused. Accordingly, the upper limit is preferably 1.2 mol/L. The amount is particularly preferably 0.35–0.7 mol/L.

As the preservative for a dihydroxybenzene type developing agent, a small amount of the aforementioned ascorbic acid derivative may be used together with the sulfite. Sodium erythorbate is particularly preferably used in view of material cost. It is preferably added in an amount of 0.03–0.12, particularly preferably 0.05–0.10, in terms of molar ratio with respect to the dihydroxybenzene type developing agent. When an ascorbic acid derivative is used as the preservative, the developer preferably does not contain a boron compound.

Examples of additives to be used other than those described above include a development inhibitor such as sodium bromide and potassium bromide, an organic solvent such as ethylene glycol, diethylene glycol, triethylene glycol, and dimethylformamide, a development accelerator such as an alkanolamine including diethanolamine, triethanolamine etc., and an imidazole and derivatives thereof and an agent for preventing uneven physical development such as a heterocyclic mercapto compound (e.g., sodium 3-(5-mercaptotetrazol-1-yl)benzenesulfonate, 1-phenyl-5-mercaptotetrazole) and the compounds described in JP-A-62-212651.

Further, a mercapto compound, indazole compound, benzotriazole compound or benzimidazole compound may be added as an antifoggant or a black spot (black pepper) inhibitor. Specific examples thereof include 5-nitroindazole, 5-p-nitrobenzoylaminoindazole, 1-methyl-5-nitroindazole, 6-nitroindazole, 3-methyl-5-nitroindazole, 5-nitrobenzimidazole, 2-isopropyl-5-nitrobenzimidazole, 5-nitrobenzotriazole, sodium 4-((2-mercapto-1,3,4-thiadiazol-2-yl)thio)butanesulfonate, 5-amino-1,3,4-thiadiazole-2-thiol, methylbenzotriazole, 5-methylbenzotriazole, 2-mercaptobenzotriazole and so forth. The addition amount thereof is generally 0.01–10 mmol, preferably 0.1–2 mmol, per liter of the developer.

Further, various kinds of organic or inorganic chelating agents can be used individually or in combination in the developer.

Examples of the inorganic chelating agents include sodium tetrapolyphosphate and sodium hexametaphosphate.

Examples of the organic chelating agents include organic carboxylic acid, aminopolycarboxylic acid, organic phosphonic acid, aminophosphonic acid, and organic phosphonocarboxylic acid.

Examples of the organic carboxylic acid include acrylic acid, oxalic acid, malonic acid, succinic acid, glutaric acid, gluconic acid, adipic acid, pimelic acid, azelaic acid, sebacic acid, nonanedicarboxylic acid, decanedicarboxylic acid, undecanedicarboxylic acid, maleic acid, itaconic acid, malic acid, citric acid, tartaric acid etc.

Examples of the aminopolycarboxylic acid include iminodiacetic acid, nitrilotriacetic acid, nitrilotripropionic acid, ethylenediaminemonohydroxyethyltriacetic acid, ethylenediaminetetraacetic acid, glycol ether-tetraacetic acid, 1,2-diaminopropanetetraacetic acid, diethylenetriaminepentaacetic acid, triethylenetetraminehexaacetic acid, 1,3-diamino-2-propanoltetraacetic acid, glycol ether-diaminetetraacetic acid, and compounds described in JP-A-52-25632, JP-A-55-67747, JP-A-57-102624 and JP-B-53-40900.

Examples of the organic phosphonic acid include hydroxyalkylidene-diphosphonic acids described in U.S. Pat. Nos. 3,214,454 and 3,794,591 and West German Patent Publication No. 2,227,369, and the compounds described in Research Disclosure, Vol. 181, Item 18170 (May, 1979) and so forth.

Examples of the aminophosphonic acid include amino-tris(methylenephosphonic acid), ethylenediaminetetramethylenephosphonic acid, aminotrimethylenephosphonic acid, and the compounds described in Research Disclosure, No. 18170 (supra), JP-A-57-208554, JP-A-54-61125, JP-A-55-29883, JP-A-56-97347 and so forth.

Examples of the organic phosphonocarboxylic acid include the compounds described in JP-A-52-102726, JP-A-53-42730, JP-A-54-121127, JP-A-55-4024, JP-A-55-4025, JP-A-55-126241, JP-A-55-65955, JP-A-55-65956, and Research Disclosure, No. 18170 (supra).

The organic and/or inorganic chelating agents are not limited to those described above. The organic and/or inorganic chelating agents may be used in the form of an alkali metal salt or an ammonium salt. The amount of the chelating agent added is preferably from $1\times10^{-4}$ to $1\times10^{-1}$ mol, more preferably from $1\times10^{-3}$ to $1\times10^{-2}$ mol, per liter of the developer.

Further, a silver stain inhibitor may be added to the developer, and examples thereof include, for example, the compounds described in JP-A-56-24347, JP-B-56-46585, JP-B-62-2849, JP-A-4-362942 and JP-A-8-6215; triazines having one or more mercapto groups (for example, the compounds described in JP-B-6-23830, JP-A-3-282457, and JP-A-7-175178); pyrimidines having one or more mercapto groups (e.g., 2-mercaptopyrimidine, 2,6-dimercaptopyrimidine, 2,4-dimercaptopyrimidine, 5,6-diamino-2,4-dimercaptopyrimidine, 2,4,6-trimercaptopyrimidine, the compounds described in JP-A-9-274289 etc.); pyridines having one or more mercapto groups (e.g., 2-mercaptopyridine, 2,6-dimercaptopyridine, 3,5-dimercaptopyridine, 2,4,6-trimercaptopyridine, compounds described in JP-A-7-248587 etc.); pyrazines having one or more mercapto groups (e.g., 2-mercaptopyrazine, 2,6-dimercaptopyrazine, 2,3-dimercaptopyrazine, 2,3,5-trimercaptopyrazine etc.); pyridazines having one or more mercapto groups (e.g., 3-mercaptopyridazine, 3,4-dimercaptopyridazine, 3,5-dimercaptopyridazine, 3,4,6-trimercaptopyridazine etc.); the compounds described in JP-A-7-175177, polyoxyalkylphosphates described in U.S. Pat. No. 5,457,011 and so forth. These silver stain inhibitors may be used individually or in combination of two or more of these. The addition amount thereof is preferably 0.05–10 mmol, more preferably 0.1–5 mmol, per liter of the developer.

The developer may also contain the compounds described in JP-A-61-267759 as a dissolution aid.

Further, the developer may also contain a toning agent, surfactant, defoaming agent, hardening agent or the like, if necessary.

The developer preferably has a pH of 9.0–12.0, more preferably 9.0–11.0, particularly preferably 9.5–11.0. The alkali agent used for adjusting pH may be a usual water-soluble inorganic alkali metal salt (e.g., sodium hydroxide, potassium hydroxide, sodium carbonate, potassium carbonate etc.).

With respect to the cation of the developer, potassium ion less inhibit development and causes less indentations, called fringes, on peripheries of blacked portions, compared with sodium ion. When the developer is stored as a concentrated solution, potassium salt is generally preferred, because of its higher solubility. However, since, in the fixer, potassium ion causes fixing inhibition on the same level as silver ion, a high potassium ion concentration in the developer disadvantageously causes increase the potassium ion concentration in the fixer because of carrying over of the developer by the light-sensitive material. In view of the above, the molar ratio of potassium ion to sodium ion in the developer is preferably between 20:80 and 80:20. The ratio of potassium ion to sodium ion can be freely controlled within the above-described range by a counter cation such as those derived from a pH buffer, pH adjusting agent, preservative, chelating agent or the like.

The replenishing amount of the developer is generally 390 mL or less, preferably 325–30 mL, most preferably 250–120 mL, per $m^2$ of the light-sensitive material. The developer replenisher may have the same composition and/or concentration as the starter developer, or it may have a different composition and/or concentration from the starter developer.

Examples of the fixing agent in the fixing processing agent that can be used for the present invention include ammonium thiosulfate, sodium thiosulfate and ammonium sodium thiosulfate. The amount of the fixing agent may be varied appropriately, but it is generally about 0.7–3.0 mol/L.

The fixer that can be used for the present invention may contain a water-soluble aluminum salt or a water-soluble chromium salt, which acts as a hardening agent, and of these salts, a water-soluble aluminum salt is preferred. Examples thereof include aluminum chloride, aluminum sulfate, potassium alum, ammonium aluminum sulfate, aluminum nitrate, aluminum lactate and so forth. These are preferably contained in an amount of from 0.01–0.15 mol/L in terms of an aluminum ion concentration in the used solution.

When the fixer is stored as a concentrated solution or a solid agent, it may be constituted by a plurality of parts including a hardening agent or the like as a separate part, or it may be constituted as a one-part agent containing all components.

The fixing processing agent may contain, if desired, a preservative (e.g., sulfite, bisulfite, metabisulfite etc. in an amount of generally 0.015 mol/L or more, preferably 0.02–0.3 mol/L), a pH buffer (e.g., acetic acid, sodium acetate, sodium carbonate, sodium hydrogencarbonate, phosphoric acid, succinic acid, adipic acid etc. in an amount of generally 0.1–1 mol/L, preferably 0.2–0.7 mol/L), or a compound having aluminum-stabilizing ability or hard water-softening ability (e.g., gluconic acid, iminodiacetic acid, 5-sulfosalicylic acid, glucoheptanoic acid, malic acid, tartaric acid, citric acid, oxalic acid, maleic acid, glycolic acid, benzoic acid, salicylic acid, Tiron, ascorbic acid, glutaric acid, aspartic acid, glycine, cysteine, ethylenediaminetetraacetic acid, nitrilotriacetic acid, a derivative and salt thereof, saccharides etc. in an amount of generally 0.001–0.5 mol/L, preferably 0.005–0.3 mol/L). However, in view of environmental protection recently concerned, it is preferred that a boron compound is not contained.

In addition, the fixing processing agent may contain a compound described in JP-A-62-78551, apH adjusting agent. (e.g., sodium hydroxide, ammonia, sulfuric acid), a surfactant, a wetting agent, a fixing accelerator etc. Examples of the surfactant include anionic surfactants such as sulfated products and sulfonated products, polyethylene surfactants and amphoteric surfactants described in JP-A-57-6840. A known deforming agent may also be used. Examples of the wetting agent include alkanolamines and alkylene glycols. Examples of the fixing accelerator include alkyl- or aryl-substituted thiosulfonic acids and salts thereof described in JP-A-6-308681; thiourea derivatives described in JP-B-45-35754, JP-B-58-122535 and JP-B-58-122536; alcohols having a triple bond within the molecule; thioether compounds described in U.S. Pat. No. 4,126,459; mercapto compounds described in JP-A-64-4739, JP-A-1-4739, JP-A-1-159645 and JP-A-3-101728; mesoionic compounds and thiocyanates described in JP-A-4-170539.

pH of the fixer that can be used for the present invention is preferably 4.0 or more, more preferably 4.5–6.0. pH of the fixer rises with processing by the contamination of a developer. In such a case, pH of a hardening fixer is 6.0 or less, preferably 5.7 or less, and that of a non-hardening fixer is 7.0 or less, preferably 6.7 or less.

The replenishing rate of the fixer is preferably 500 mL or less, more preferably 390 mL or less, still more preferably 320–80 mL, per $m^2$ of the photographic material processed. The composition and/or the concentration of the fixer replenisher may be the same as or different from those of the starter fixer.

The fixer can be reclaimed for reuse according to known fixer reclaiming methods such as electrolytic silver recovery. As reclaiming apparatuses, there are FS-2000 produced by Fuji Photo Film Co., Ltd. and so forth.

Further, the removal of dyes and so forth using an adsorptive filter such as those comprising activated carbon is also preferred.

When the developing and fixing processing chemicals used in the present invention are solutions, they are preferably preserved in packaging materials of low oxygen permeation as disclosed in JP-A-61-73147. Further, when these solutions are concentrated solutions, they are diluted with water to a predetermined concentration in the ratio of 0.2–3 parts of water to one part of the concentrated solutions.

Even if the developing processing chemicals and fixing processing chemicals used in the present invention are made as solids, the same effects as solutions can be obtained. Solid processing chemicals are described below.

Solid chemicals that can be used for the present invention may be made into known shapes such as powders, granular powders, granules, lumps, tablets, compactors, briquettes, sheets, bars, paste or the like. These solid chemicals may be covered with water-soluble coating agents or films to separate components that react with each other on contact, or they may have a multilayer structure to separate components that react with each other, or both types may be used in combination.

Known coating agents and auxiliary granulating agents can be used, but polyvinylpyrrolidone, polyethylene glycol, polystyrenesulfonic acid and vinyl compounds are preferred. Line 48, column 2 to line 13, column 3 of JP-A-5-45805 can be referred to.

When a multilayer structure is used, components that do not react with each other on contact may be sandwiched with components that react with each other and made into tablets and briquettes, or components of known shapes may be made into a similar layer structure and packaged. Methods therefor are disclosed in JP-A-61-259921, JP-A-4-16841, JP-A-4-78848, JP-A-5-93991 and so forth.

The bulk density of the solid processing chemicals is preferably 0.5–6.0 g/cm$^3$, in particular, the bulk density of tablets is preferably 1.0–5.0 g/cm$^3$ and that of granules is preferably 0.5–1.5 g/cm$^3$.

Solid processing chemicals can be produced by using any known method, and for example, one can refer to JP-A-61-259921, JP-A-4-15641, JP-A-4-16841, JP-A-4-32837, JP-A-4-78848, JP-A-5-93991, JP-A-4-85533, JP-A-4-85534, JP-A-4-85535, JP-A-5-134362, JP-A-5-197070, JP-A-5-204098, JP-A-5-224361, JP-A-6-138604, JP-A-6-138605, JP-A-8-286329 and so forth.

Specifically, the rolling granulating method, extrusion granulating method, compression granulating method, cracking granulating method, stirring granulating method, spray drying method, dissolution coagulation method, briquetting method, roller compacting method and so forth can be used.

The solubility of the solid chemicals used in the present invention can be adjusted by changing the state of the surface (smooth, porous, etc.) or partially changing the thickness, or making the shape into a hollow doughnut type. Further, it is also possible to provide different solubilities to a plurality of granulated products, or it is also possible for materials having different solubilities to use various shapes to obtain the same solubilities. Multilayer granulated products having different compositions between the inside and the surface can also be used.

Packaging materials of solid chemicals preferably have low oxygen and water permeabilities, and those of known shapes such as bag-like, cylindrical and box-like shapes can be used. Packaging materials of foldable shapes are preferred for saving storage space of waste packaging materials as disclosed in JP-A-6-242585 to JP-A-6-242588, JP-A-6-247432, JP-A-6-247448, JP-A-6-301189, JP-A-7-5664, and JP-A-7-5666 to JP-A-7-5669. Takeout ports of processing chemicals of these packaging materials may be provided with a screw cap, pull-top or aluminum seal, or packaging materials may be heat-sealed, or other known types may be used, and there are no particular limitations. Waste packaging materials are preferably recycled or reused in view of environmental protection.

Methods of dissolution and replenishment of the solid processing chemicals are not particularly limited and known methods can be used. Examples of these known methods include a method in which a certain amount of processing chemicals are dissolved and replenished by a dissolving device having a stirring function, a method in which processing chemicals are dissolved by a dissolving device having a dissolving zone and a zone where a finished solution is stocked and the solution is replenished from the stock zone as disclosed in JP-A-9-80718, and methods in which processing chemicals are fed to a circulating system of an automatic processor and dissolved and replenished, or processing chemicals are fed to a dissolving tank provided in an automatic processor with progress of the processing of light-sensitive materials as disclosed in JP-A-5-119454, JP-A-6-19102 and JP-A-7-261357. In addition to the above methods, any of known methods can be used. The charge of processing chemicals may be conducted manually, or automatic opening and automatic charge may be conducted by a dissolving device provided with an opening mechanism as disclosed in JP-A-9-138495 or an automatic processor. The latter is preferred in view of the working environment. Specifically, there are methods of pushing through, unsealing, cutting off and bursting the takeout port of a package, and methods disclosed in JP-A-6-19102 and JP-A-6-95331.

A light-sensitive material is subjected to washing or stabilizing processing after being developed and fixed (hereinafter washing includes stabilization processing and the solution used therefor is called water or washing water unless otherwise indicated). The water used for washing may be any of tap water, ion exchange water, distilled water and stabilized solution. The replenishing rate therefor is, in general, about 8–17 liters per m$^2$ of the light-sensitive material, but washing can be carried out with a replenishing rate less than the above. In particular, with a replenishing rate of 3 liters or less (including zero, i.e., washing in a reservoir), not only water saving processing can be carried out but also piping for installation of an automatic processor becomes unnecessary. When washing is carried out with a reduced replenishing amount of water, it is more preferable to use a washing tank equipped with a squeegee roller or a crossover roller disclosed in JP-A-63-18350, JP-A-62-287252 or the like. The addition of various kinds of oxidizing agents (e.g., ozone, hydrogen peroxide, sodium hypochlorite, activated halogen, chlorine dioxide, sodium carbonate hydrogen peroxide salt etc.) and filtration through filters may be combined to reduce load in environmental pollution which becomes a problem when washing is carried out with a small amount of water and to prevent generation of scale.

As a method of reducing the replenishing amount of the washing water, a multistage countercurrent system (e.g., two stages or three stages) has been known for a long time. The replenishing amount of the washing water in this system is preferably 50–200 mL per m$^2$ of the light-sensitive material. This effect can also similarly be obtained in an independent multistage system (a method in which a countercurrent is not used and fresh solution is separately replenished to multistage washing tanks).

Further, means of preventing generation of scale may be included in a washing process. Means for preventing generation of scale is not particularly limited and known methods can be used, and there are, for example, a method of adding an antifungal agent (so-called scale preventive), a method of using electroconduction, a method of irradiating ultraviolet ray, infrared ray or far infrared ray, a method of applying a magnetic field, a method of using ultrasonic wave processing, a method of applying heat, a method of emptying tanks when they are not used and so forth. These scale preventing means may be conducted with progress of the processing of light-sensitive materials, may be conducted at regular intervals irrespective of usage conditions, or may be conducted only during the time when processing is not conducted, for example, during night. In addition, washing water previously subjected to a treatment with such means may be replenished. It is also preferable to use different scale preventing means for every given period of time for inhibiting proliferation of resistant fungi.

As a water-saving and scale preventing apparatus, an apparatus AC-1000 produced by Fuji Photo Film Co., Ltd.

and a scale preventing agent AB-5 produced by Fuji Photo Film Co., Ltd. may be used, and the method disclosed in JP-A-11-231485 may also be used.

The antifungal agent is not particularly restricted, and a known antifungal agent may be used. Examples thereof include, in addition to the above-described oxidizing agents, glutaraldehyde, chelating agent such as aminopolycarboxylic acid, cationic surfactant, mercaptopyridine oxide (e.g., 2-mercaptopyridine-N-oxide) and so forth, and a sole antifungal agent may be used or a plurality of antifungal agents may be used in combination.

The electricity may be applied according to the method described in JP-A-3-224685, JP-A-3-224687, JP-A-4-16280, JP-A-4-18980 or so forth.

In addition, a known water-soluble surfactant or defoaming agent may be added, so as to prevent uneven processing due to bubbling, or to prevent transfer of stains. Further, the dye adsorbent described in JP-A-63-163456 may be provided in the washing with water system, so as to prevent stains due to a dye dissolved out from the light-sensitive material.

The overflow solution from the washing with water step may be partly or wholly used by mixing it with the processing solution having fixing ability, as described in JP-A-60-235133. It is also preferable, in view of protection of the natural environment, to reduce the biochemical oxygen demand (BOD), chemical oxygen demand (COD), iodine consumption or the like before discharge by subjecting the solution to microbial treatment (for example, sulfur-oxidizing bacteria or activated sludge treatment, treatment with a filter comprising a porous carrier, such as activated carbon or ceramic, carrying microorganisms thereon) or oxidation treatment with electrification or an oxidizing agent, or to reduce the silver concentration in waste water by passing the solution through a filter using a polymer having affinity for silver, or by adding a compound that forms a hardly soluble silver complex, such as trimercaptotriazine, to precipitate silver, and then passing the solution through a filter.

In some cases, stabilization may be performed subsequent to the washing with water, and as an example thereof, a bath containing the compounds described in JP-A-2-201357, JP-A-2-132435, JP-A-1-102553 and JP-A-46-44446 may be used as a final bath of the light-sensitive material. This stabilization bath may also contain, if desired, an ammonium compound, metal compound such as Bi or Al, fluorescent brightening agent, various chelating agents, layer pH-adjusting agent, hardening agent, bactericide, antifungal agent, alkanolamine or a surfactant.

The additives such as antifungal agent and the stabilizing agent added to the washing with water or stabilization bath may be formed into a solid agent like the aforementioned development and fixing processing agents.

Waste solutions of the developer, fixer, washing water or stabilizing solution used for the present invention is preferably burned for disposal. The waste solutions can also be concentrated or solidified by a concentrating apparatus such as those described in JP-B-7-83867 and U.S. Pat. No. 5,439,560, and then disposed.

When the replenishing amount of the processing agents is reduced, it is preferable to prevent evaporation or air oxidation of the solution by reducing the opening area of the processing tank. A roller transportation-type automatic developing machine is described in, for example, U.S. Pat. Nos. 3,025,779 and 3,545,971, and in the present specification, it is simply referred to as a roller transportation-type automatic processor. This automatic processor performs four steps of development, fixing, washing with water and drying, and it is most preferable to follow this four-step processing also in the present invention, though other steps (e.g., stopping step) are not excluded. Further, a rinsing bath may be provided between development and fixing and/or between fixing and washing with water.

In the development of the silver halide photographic light-sensitive material of the present invention, the dry-to-dry time from the start of processing to finish of drying is preferably 25–160 seconds, the development time and the fixing time are each generally 40 seconds or less, preferably 6–35 seconds, and the temperature of each solution is preferably 25–50° C., more preferably 30–40° C. The temperature and the time of washing with water are preferably 0–50° C. and 40 seconds or less, respectively. According to such a method, the light-sensitive material after development, fixing and washing with water may be passed through squeeze rollers, for squeezing washing water, and then dried. The drying is generally performed at a temperature of from about 40° C. to about 100° C. The drying time may be appropriately varied depending on the ambient conditions. The drying method is not particularly limited, and any known method may be used. Hot-air drying and drying by a heat roller or far infrared rays as described in JP-A-4-15534, JP-A-5-2256 and JP-A-5-289294 may be used, and a plurality of drying methods may also be used in combination.

EXAMPLES

The present invention will be specifically explained with reference to the following synthesis examples, working examples and comparative examples. The materials, amounts, ratios, types and procedures of processes and so forth shown in the following examples can be optionally changed so long as such change does not depart from the spirit of the present invention. Therefore, the scope of the present invention should not be construed in a limitative way based on the following examples.

Synthesis Example 1

Synthesis of Quaternary Salt Compound 3

In an amount of 800 g of polyethylene glycol (average molecular weight: 2000), 584 mL of thionyl chloride and 4 mL of dimethylformamide (DMF) were mixed at room temperature, then heated to 90° C. and stirred for 5 hours. After evaporating excessive thionyl chloride, the reaction mixture was added with 372 g of 4-phenylpyridine and allowed to react at 150° C. for 7 hours. The reaction mixture was made into a solution in ethyl acetate and 2-propanol (10/1) and cooled, and the deposited solid was taken by filtration and dried to obtain 584 g of the target Quaternary Salt Compound 3 (yield: 62%).

Synthesis Example 2

Synthesis of Quaternary Salt Compound 4

Quaternary Salt Compound 4 was obtained in the same manner as in Synthesis Example 1 mentioned above except that polyethylene glycol (average molecular weight: 3000) was used instead of the polyethylene glycol (average molecular weight: 2000).

(Synthesis Example 3

Synthesis of Quaternary Salt Compound 6

In an amount of 10 g of polyethylene glycol (average molecular weight: 2000), 7.3 mL of thionyl chloride and 0.1 mL of DMF were mixed at room temperature, then heated to 90° C. and stirred for 5 hours. After evaporating excessive thionyl chloride, the reaction mixture was added with 0.4 g of isoquinoline and allowed to react at 150° C. for 7 hours. The reaction mixture was made into a solution in ethyl acetate and 2-propanol (10/1) and cooled, and the deposited solid was taken by filtration and dried to obtain 7.1 g of the target Quaternary Salt Compound 6 (yield: 60%).

Synthesis Example 4

Synthesis of the Quaternary Salt Compound 65

In an amount of 17.6 g (0.1 mol) of 1,10-diamino-4,7-dioxadecane, 27.6 g (0.2 mol) of potassium carbonate, 100 mL of ethyl acetate and 50 mL of water were vigorously stirred at room temperature, and added dropwise with 34 g (0.3 mol) of chloroacetyl chloride. The reaction mixture was separated, and the ethyl acetate layer was dried over sodium sulfate and then concentrated to obtain 23 g of 1,10-bis (chloroacetylamino)-4,7-dioxadecane (yield: 70%). In an amount of 3.3 g of this compound and 7.9 g of triphenylphosphine were mixed and heated to 150° C. for 5 hours. The reaction mixture was cooled and then washed 3 times with ethyl acetate to obtain 5.4 g (yield: 63%) of Quaternary Salt Compound 65 as viscous brown liquid.

Synthesis Example 5

Synthesis of the Quaternary Salt Compound 62

Quaternary Salt Compound 62 was obtained by the same procedure as in Synthesis Example 4 except that 4-phenylpyridine was used instead of the triphenylphosphine.

Synthesis Example 6

Synthesis of the Quaternary Salt Compound 71

Quaternary Salt Compound 71 was obtained by the same procedure as in Synthesis Example 4 except that O,O'-bis (2-aminopropyl)polyethylene glycol 800 was used instead of the 1,10-diamino-4,7-dioxadecane and 4-phenylpyridine was used instead of the triphenylphosphine.

Example 1

| <Preparation of Emulsion A> | |
|---|---|
| Solution 1 | |
| Water | 750 mL |
| Gelatin | 20 g |
| Sodium chloride | 3 g |
| 1,3-Dimethylimidazolidine-2-thione | 20 mg |
| Sodium benzenethiosulfonate | 10 mg |
| Citric acid | 0.7 g |
| Solution 2 | |
| Water | 300 mL |
| Silver nitrate | 150 g |

-continued

| <Preparation of Emulsion A> | |
|---|---|
| Solution 3 | |
| Water | 300 mL |
| Sodium chloride | 34 g |
| Potassium bromide | 32 g |
| Potassium hexachloroiridate (III) (0.005%, KCl, 20% aqueous solution) | 5 mL |
| Ammonium hexachlororhodate (0.001%, NaCl, 20% aqueous solution) | 7 mL |

The potassium hexachloroiridate(III) (0.005%, KCl, 20% aqueous solution) and ammonium hexachlororhodate (0.001%, NaCl, 20% aqueous solution) used for Solution 3 were prepared by dissolving powder of each in 20% aqueous solution of KCl and 20% aqueous solution of NaCl, respectively, and heating each solution at 40° C. for 120 minutes.

Solution 2 and Solution 3 in amounts corresponding to 90% of each were simultaneously added to Solution 1 maintained at 38° C. and pH 4.5 over 20 minutes with stirring to form nucleus grains having a diameter of 0.16 $\mu$m. Subsequently, Solution 4 and Solution 5 shown below were added over 8 minutes. Further, the remaining 10% of Solution 2 and Solution 3 were added over 2 minutes to allow growth of the grains to a diameter of 0.21 $\mu$m. Further, 0.15 g of potassium iodide was added and ripening was allowed for 5 minutes to complete the grain formation.

| Solution 4 | |
|---|---|
| Water | 100 mL |
| Silver nitrate | 50 g |

| Solution 5 | |
|---|---|
| Water | 100 mL |
| Sodium chloride | 13 mg |
| Potassium bromide | 11 mg |
| Potassium ferrocyanide | 5 mg |

The resulting grains were washed according to a conventional flocculation method. Specifically, after the temperature of the mixture was lowered to 35° C., 3 g of Anionic precipitating agent 1 shown below was added to the mixture, and pH was lowered by using sulfuric acid until the silver halide was precipitated (lowered to the range of pH 3.2±0.2). Then, about 3 L of the supernatant was removed (first washing with water). Furthermore, the emulsion was added with 3 L of distilled water and then with sulfuric acid until the silver halide was precipitated. In a volume of 3 L of the supernatant was removed again (second washing with water). The same procedure as the second washing with water was repeated once more (third washing with water) to complete the washing with water and desalting processes. The emulsion after the washing with water and desalting was added with 45 g of gelatin, and after pH was adjusted to 5.6 and pAg was adjusted to 7.5, added with 10 mg of sodium benzenethiosulfonate, 3 mg of sodium benzenethiosulfinate, 15 mg of sodium thiosulfate and 10 mg of chloroauric acid to perform chemical sensitization at 55° C. for obtaining optimal sensitivity, and then added with 100 mg of 4-hydroxy-6-methyl-1,3,3a, 7-tetrazaindene as a stabilizer and 100 mg of Proxcel (trade name, ICI Co., Ltd.) as an antiseptic.

Finally, there was obtained an emulsion of cubic silver iodochlorobromide grains having an average grain size of 0.22 μm and a variation coefficient of 9%. The emulsion contained 70 mol % of silver chloride and 0.08 mol % of silver iodide. The emulsion finally showed pH of 5.7, pAg of 7.5, electric conductivity of 40 μS/m, density of 1.2–1.25×10$^3$ kg/m$^3$ and viscosity of 50 mPa·s.

Anionic precipitating agent 1

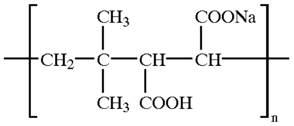

Average molecular weight: 120,000

| <Preparation of Emulsion B> | |
|---|---|
| Solution 1 | |
| Water | 750 mL |
| Gelatin | 20 g |
| Sodium chloride | 1 g |
| 1,3-Dimethylimidazolidine-2-thione | 20 mg |
| Sodium benzenthiosulfonate | 10 mg |
| Citric acid | 0.7 g |
| Solution 2 | |
| Water | 300 mL |
| Silver nitrate | 150 g |
| Solution 3 | |
| Water | 300 mL |
| Sodium chloride | 38 g |
| Potassium bromide | 32 g |
| Potassium hexachloroiridate (III) (0.005%, KCl, 20% aqueous solution) | 5 mL |
| Ammonium hexachlororhodate (0.001%, NaCl, 20% aqueous solution) | 15 mL |

The potassium hexachloroiridate(III) (0.005%, KCl, 20% aqueous solution) and ammonium hexachlororhodate (0.001%, NaCl, 20% aqueous solution) used for Solution 3 were prepared by dissolving powder of each in 20% aqueous solution of KCl and 20% aqueous solution of NaCl, respectively, and heating each solution at 40° C. for 120 minutes.

Solution 2 and Solution 3 in amounts corresponding to 90% of each were simultaneously added to Solution 1 maintained at 38° C. and pH 4.5 over 20 minutes with stirring to form nucleus grains having a diameter of 0.16 μm. Subsequently, 500 mg of 4-hydroxy-6-methyl-1,3,3*a*,7-tetrazaindene was added, and subsequently Solution 4 and Solution 5 shown below were added over 8 minutes. Further, the remaining 10% of Solution 2 and Solution 3 were added over 2 minutes to allow growth of the grains to a diameter of 0.18 μm. Further, 0.15 g of potassium iodide was added and ripening was allowed for 5 minutes to complete the grain formation.

| Solution 4 | |
|---|---|
| Water | 100 mL |
| Silver nitrate | 50 g |

| Solution 5 | |
|---|---|
| Water | 100 mL |
| Sodium chloride | 13 mg |
| Potassium bromide | 11 mg |
| Potassium ferrocyanide | 2 mg |

The resulting grains were washed according to a conventional flocculation method. Specifically, after the temperature of the mixture was lowered to 35° C., 3 g of Anionic precipitating agent 1 mentioned above was added to the mixture, and pH was lowered by using sulfuric acid until the silver halide was precipitated (lowered to the range of pH 3.2±0.2)t. Then, about 3 L of the supernatant was removed (first washing with water). Furthermore, the emulsion was added with 3 L of distilled water and then with sulfuric acid until the silver halide was precipitated. In an amount of 3 L of the supernatant was removed again (second washing with water). The same procedure as the second washing with water was repeated once more (third washing with water) to complete the washing with water and desalting processes. The emulsion after the washing with water and desalting was added with 45 g of gelatin, and after pH was adjusted to 5.6 and pAg was adjusted to 7.5, added with 10 mg of sodium benzenethiosulfonate, 3 mg of sodium benzenethiosulfinate, 2 mg of triphenylphosphine selenide and 1 mg of chloroauric acid to perform chemical sensitization at 55° C. for obtaining optimal sensitivity, and then added with 100 mg of 4-hydroxy-6-methyl-1,3,3*a*,7-tetrazaindene as a stabilizer and 100 mg of Proxcel as an antiseptic.

Finally, there was obtained an emulsion of cubic silver iodochlorobromide grains having an average grain size of 0.18 μm and a variation coefficient of 10%. The emulsion contained 70 mol % of silver chloride and 0.08 mol % of silver iodide. The emulsion finally showed pH of 5.7, pAg of 7.5, electric conductivity of 40 μS/m, density of 1.2×10$^3$ kg/m$^3$ and viscosity of 50 mPa·s.

| <Preparation of Non-photosensitive silver halide grains (i)> | |
|---|---|
| Solution 1 | |
| Water | 1 L |
| Gelatin | 20 g |
| Potassium bromide | 0.9 g |
| Citric acid | 0.2 g |
| $NH_4NO_3$ | 20 g |
| Hydrogen peroxide | 3.5 g |
| Sodium benzenethiosulfonate | 15 mg |
| Solution 2 | |
| Water | 400 mL |
| Silver nitrate | 200 g |
| Solution 3 | |
| Water | 400 mL |
| Potassium bromide | 140.0 g |
| Potassium hexachlororhodate (III) (0.001% aqueous solution) | 4000 mL |

Solution 1 was added, with stirring, with 40 mL of NaOH (1N) and with 0.7 g of a silver nitrate aqueous solution. Then, ½ each of Solution 2 and Solution 3 were added by the controlled double jet method over 20 minutes while the silver potential was maintained at +24 mV. After ripening for 2 minutes, the remaining ½ each of Solution 2 and Solution 3 were similarly added by the controlled double jet method over 20 minutes to attain grain formation.

Then, the resulting grains were washed according to a conventional flocculation method. Specifically, after the temperature of the mixture was lowered to 35° C., 3 g of Anionic precipitating agent 1 mentioned above was added to the mixture, and pH was lowered by using sulfuric acid until the silver halide was precipitated (lowered to the range of pH 3.1±0.2). Then, about 3 L of the supernatant was removed (first washing with water). Furthermore, the emulsion was added with 3 L of distilled water and then with sulfuric acid until the silver halide was precipitated. In an amount of 3 L of the supernatant was removed again (second washing with water). The same procedure as the second washing with water was repeated once more (third washing with water) to complete the washing with water and desalting processes. The emulsion after the washing with water and desalting was added with 45 g of gelatin, and after pH was adjusted to 5.7 and pAg was adjusted to 7.5, added with phenoxyethanol as an antiseptic to finally obtain a dispersion of non-post ripened tetradecahedral silver bromide grains (i) having an average grain size of 0.8 μm and a variation coefficient of 10%, which contained 30 mol % in average of silver chloride and 0.08 mol % of silver iodide. The emulsion finally showed pH of 5.7, pAg of 7.5, electric conductivity of 40 μS/m, density of $1.3\times10^3$ kg/$m^3$ and viscosity of 30 mPa·s.

Grain formation was performed by adding potassium hexachlororhodate(III) in an amount corresponding $1\times10^{-5}$ mol per 1 mol of KBr to each of Aqueous Solutions X-1 to X-4 mentioned below.

<Preparation of Non-photosensitive silver halide grains (ii)>

| | | |
|---|---|---|
| Solution 1 | | |
| Water | 1 | L |
| Gelatin | 20 | g |
| Sodium chloride | 3.0 | g |
| 1,3-Dimethylimidazolidine-2-thione | 20 | mg |
| Sodium benzenethiosulfonate | 8 | mg |
| Solution 2 | | |
| Water | 400 | mL |
| Silver nitrate | 100 | g |
| Solution 3 | | |
| Water | 400 | mL |
| Sodium chloride | 13.5 | g |
| Potassium bromide | 45.0 | g |
| Potassium hexachlororhodate (III) (0.001% aqueous solution) | 860 | mL |

Solutions 1 maintained at 70° C. and pH 4.5, and Solutions 2 and 3 were simultaneously added over 15 minutes with stirring to form nucleus grains. Subsequently, Solutions 4 and 5 mentioned below were added over 15 minutes. Further, 0.15 g of potassium iodide was added to complete the grain formation.

Then, the resulting grains were washed according to a conventional flocculation method. Specifically, after the temperature of the mixture was lowered to 35° C., 3 g of Anionic precipitating agent 1 mentioned above was added to the mixture, and pH was lowered by using sulfuric acid until the silver halide was precipitated (lowered to the range of pH 3.2±0.2). Then, about 3 L of the supernatant was removed (first washing with water). Furthermore, the emulsion was added with 3 L of distilled water and then with sulfuric acid until the silver halide was precipitated. In an amount of 3 L of the supernatant was removed again (second washing with water). The same procedure as the second washing with water was repeated once more (third washing with water) to complete the washing with water and desalting processes. The emulsion after the washing with water and desalting was added with 45 g of gelatin, and after pH was adjusted to 5.7 and pAg was adjusted to 7.5, added with phenoxyethanol as an antiseptic to finally obtain a dispersion of non-post ripened cubic silver iodochlorobromide grains (ii) having an average grain size of 0.45 μm and a variation coefficient of 10%, which contained 30 mol % in average of silver chloride and 0.08 mol % of silver iodide. The emulsion finally showed pH of 5.7, pAg of 7.5, electric conductivity of 40 μS/m, density of $1.3–1.35\times10^3$ kg/$M^3$ and viscosity of 50mPa·s.

PREPARATION OF NON-PHOTOSENSITIVE SILVER HALIDE GRAINS (iii)

Preparation of Solution 1

An aqueous solution in an amount of 1300 mL containing 0.6 g of KBr and 1.1 g of gelatin having an average molecular weight of 15,000 was kept at 35° C. with stirring.

(Addition 1)

Aqueous solution Ag-1 (24 mL, containing 4.9 g of $AgNO_3$ per 100 mL), 24 mL of Aqueous solution X-1 (containing 4.1 g of KBr per 100 mL) and 24 mL of Aqueous solution G-1 (containing 1.8 g of gelatin having an average molecular weight of 15,000 per 100 mL) were added over 30 seconds at constant flow rates by the triple jet method.

Then, 1.3 g of KBr was added and the temperature was increased to 75° C. A ripening period was provided for 12 minutes after the temperature increase, then 300 mL of Aqueous solution G-2 (containing 12.7 g of gelatin obtained by adding trimellitic acid anhydride to an aqueous solution of alkali-treatment osseine gelatin, allowing a reaction at 50° C. and pH 9.0 and removing remaining trimellitic acid, per 100 mL), and then 2.1 g of disodium 4,5-dihydroxy-1,3-disulfonate monohydrate and 0.002 g of thiourea dioxide were successively added with intervals of 1 minute.

(Addition 2)

Then, 157 mL of Aqueous Solution Ag-2 (containing 22.1 g of $AgNO_3$ per 100 mL) and Aqueous solution X-2 (containing 15.5 g of KBr per 100 mL) were added over 14 minutes by the double jet method. In this operation, as for the addition of Aqueous Solution Ag-2, the flow rate was increased so that the final flow rate could become 3.4 times the initial flow rate. The addition of Aqueous Solution X-2 was performed so that pAg of the bulk emulsion solution in the reaction vessel could be kept at 8.3.

(Addition 3)

Subsequently, 329 mL of Aqueous Solution Ag-3 (containing 32.0 g of $AgNO_3$ per 100 mL) and Aqueous Solution X-3 (containing 21.5 g of KBr and 1.6 g of KI per 100 mL) were added over 27 minutes by the double jet method. In this operation, as for the addition of Aqueous Solution Ag-3, the flow rate was increased so that the final flow rate could become 1.6 times the initial flow rate. The addition of Aqueous Solution X-3 was performed so that pAg of the bulk emulsion solution in the reaction vessel could be kept at 8.3.

(Addition 4)

Further, 156 mL of Aqueous Solution Ag-4 (containing 32.0 g of $AgNO_3$ per 100 mL) and Aqueous Solution X-4 (containing 22.4 g of KBr per 100 mL) were added over 17 minutes by the double jet method. In this operation, Aqueous Solution Ag-4 was added at a constant flow rate, and the addition of Aqueous Solution X-3 was performed so that pAg of the bulk emulsion solution in the reaction vessel could be kept at 8.3.

Then, 0.0025 g of sodium benzenethiosulfonate and 125 mL of Aqueous Solution G-3 (containing 12.0 g of alkali-treated osseine gelatin per 100 mL) were successively added with intervals of 1 minute.

Subsequently, 43.7 g of KBr was added, pAg of the bulk emulsion solution in the reaction vessel was adjusted to 9.0, and then 73.9 g of AgI fine grains (containing 13.0 g of AgI fine grains having a mean grain size of 0.047 μm per 100g) was added.

(Addition 5)

From 2 minutes after that, 249 mL of Aqueous Solution Ag-4 and Aqueous Solution X-4 were added by the double jet method. In this operation, Aqueous Solution Ag-4 was added at a constant flow rate over 16 minute, and the addition of Aqueous Solution X-4 was performed so that pAg could be kept at 9.10.

(Addition 6)

For subsequent 10 minutes, the addition was performed so that pAg of the bulk emulsion in the reaction vessel could be kept at 7.5.

Subsequently, the grains were desalted by a conventional flocculation method, and then added with water, NaOH and alkali-treated osseine gelatin with stirring, and pH and pAg were adjusted to 5.8 and 8.9, respectively, at 56° C.

The obtained grains consisted of tabular silver halide grains having a diameter of 1.0 μm as circle, grain thickness of 0.10 μm, average AgI content of 3.94 mol %, (111) faces as parallel main planes and variation coefficient of 24% for the average diameter as circle of the total grains.

Preparation of Coated Sample

On a polyethylene terephthalate film support having moisture proof layers comprising vinylidene chloride mentioned below on the both surfaces, UL layer, emulsion layer, lower protective layer and upper protective layer were coated in this order to prepare a sample.

The preparation methods, coated amounts and coating method of the layers are shown below.

EMULSION LAYER

Emulsion A and/or Emulsion B were mixed as shown in Table 1 and spectrally sensitized by addition of a sensitizing dye (SD-1) in an amount of $5.7\times10^{-4}$ mol/mol Ag.

The following components were mixed in the indicated amounts.

| | |
|---|---|
| KBr | $3.4 \times 10^{-4}$ mol/mol Ag |
| Compound (cpd-1) | $2.0 \times 10^{-4}$ mol/mol Ag |
| Compound (cpd-2) | $2.0 \times 10^{-4}$ mol/mol Ag |
| Compound (cpd-3) | $8.0 \times 10^{-4}$ mol/mol Ag |
| 4-Hydroxy-6-methyl-1,3,3a,7-tetrazaindene | $1.2 \times 10^{-4}$ mol/mol Ag |
| Hydroquinone | $1.2 \times 10^{-2}$ mol/mol Ag |
| Citric acid | $3.0 \times 10^{-4}$ mol/mol Ag |
| Hydrazine derivative (cpd-4) | Amount shown in Table 1 |
| Nucleation accelerator (cpd-5) | $6.0 \times 10^{-4}$ mol/mol Ag |
| 2,4-Dichloro-6-hydroxy-1,3,5-triazine sodium salt | 90 mg/m$^2$ |
| Colloidal silica (particle size: 10 nm) | 15 weight % as for gelatin |
| Aqueous latex (cpd-6) | 100 mg/m$^2$ |
| Polyethyl acrylate latex | 150 mg/m$^2$ |
| Latex of copolymer of methyl acrylate, 2-acrylamido-2-methypropanesulfonic acid sodium salt and 2-acetoxyethyl methacrylate (weight ratio = 88:5:7) | 150 mg/m$^2$ |
| Core/shell type latex (core: styrene/butadiene copolymer (weight ratio = 37/63) , shell: styrene/2-acetoxyethyl acrylate copolymer (weight ratio = 84/16), core/shell ratio = 50/50) | 150 mg/m$^2$ |

Further, Compound (cpd-7) was added in an amount of 4 weight % with respect to the total amount of gelatin on the side having the emulsion layer, and pH of the coating solution was adjusted to 5.6 by using citric acid.

The coating solution for emulsion layer was coated on the support mentioned below so that the theoretical coated silver amount and coated gelatin amount could become the amounts mentioned in Table 1.

| <Upper protective layer > | |
|---|---|
| Gelatin | 0.3 g/m$^2$ |
| Amorphous silica matting agent (average particle size: 3.5 μm) | 25 mg/m$^2$ |
| Compound (cpd-8) (gelatin dispersion) | 20 mg/m$^2$ |
| Colloidal silica (particle size: 10–20 nm, Snowtex C, Nissan Chemical) | 30 mg/m$^2$ |
| Compound (cpd-9) | 50 mg/m$^2$ |
| Sodium dodecylbenzenesulfonate | 20 mg/m$^2$ |
| Compound (cpd-10) | 20 mg/m$^2$ |
| Compound (cpd-11) | 20 mg/m$^2$ |
| Antiseptic (Proxcel, ICI Co., Ltd.) | 1 mg/m$^2$ |
| **<Lower protective layer >** | |
| Gelatin | 0.5 g/m$^2$ |
| Non-photosensitive silver halide grains (type shown in Table 1) | 0.1 g/m$^2$ |
| Compound (cpd-12) | 15 mg/m$^2$ |
| 1,5-Dihydroxy-2-benzaldoxime | 10 mg/m$^2$ |
| Polyethyl acrylate latex | 150 mg/m$^2$ |
| Compound (cpd-13) | 3 mg/m$^2$ |
| Antiseptic (Proxcel) | 1.5 mg/m$^2$ |
| **<UL layer>** | |
| Gelatin | 0.5 g/m$^2$ |
| Non-photosensitive silver halide grains | 0.3 g/m$^2$ |
| Polyethyl acrylate latex | 150 mg/m$^2$ |
| Compound (cpd-14) | 10 mg/m$^2$ |
| Compound (cpd-20) | 5 mg/m$^2$ |
| Antiseptic (Proxcel) | 1.5 mg/m$^2$ |

Viscosity of the coating solutions for the layers was adjusted by adding a thickener represented by the following structure (Z).

Thickener Z

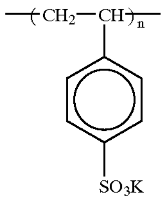

The samples used in the examples had a back layer and electroconductive layer having the following compositions.

| <Back layer> | |
|---|---|
| Gelatin | 3.3 g/m$^2$ |
| Non-photosensitive silver halide grains | 0.3 mg/m$^2$ |
| Compound (cpd-15) | 40 mg/m$^2$ |
| Compound (cpd-16) | 20 mg/m$^2$ |
| Compound (cpd-17) | 90 mg/m$^2$ |
| Compound (cpd-18) | 40 mg/m$^2$ |
| Compound (cpd-19) | 26 mg/m$^2$ |
| Compound (cpd-20) | 5 mg/m$^2$ |
| 1,3-Divinylsulfonyl-2-propanol | 60 mg/m$^2$ |
| Polymethyl methacrylate microparticles (mean particle sizes: 6.5 μm) | 30 mg/m$^2$ |
| Liquid paraffin | 78 mg/m$^2$ |
| Calcium nitrate | 20 mg/m$^2$ |
| Antiseptic (Proxcel) | 12 mg/m$^2$ |
| Compound (cpd-7) | 4 weight % with respect to the total gelatin on the side having back layer |

-continued

| <Electroconductive layer> | |
|---|---|
| Gelatin | 0.1 $g/m^2$ |
| Sodium dodecylbenzenesulfonate | 20 $mg/m^2$ |
| $SnO_2$/Sb (weight ratio = 9:1, average particle size: 0.25 $\mu$m) | 200 $mg/m^2$ |
| Antiseptic (Proxcel) | 0.3 $mg/m^2$ |

SUPPORT

On both surfaces of a biaxially stretched polyethylene terephthalate support (thickness: 100 $\mu$m), a first undercoat layer and second undercoat layer having the following compositions were coated.

| <First undercoat layer > | |
|---|---|
| Core/shell type vinylidene chloride copolymer (i) | 15 g |
| 2,4-Dichloro-6-hydroxy-s-triazine | 0.25 g |
| Polystyrene microparticles (mean particle size: 3 $\mu$m) | 0.05 g |
| Compound (Cpd-21) | 0.20 g |
| Colloidal silica (particle size: 70–100 nm Snowtex ZL, Nissan Chemical,) | 0.12 g |
| Water | Make to total amount of 100 g |

The coating solution further added with 10 weight % of KOH and adjusted to pH of 6 was coated so that a dry thickness of 0.9 $\mu$m could be obtained after drying at a drying temperature of 180° C. for 2 minutes.

| <Second undercoat layer> | |
|---|---|
| Gelatin | 1 g |
| Methylcellulose | 0.05 g |
| Compound (Cpd-22) | 0.02 g |
| $C_{12}H_{25}O(CH_2CH_2O)_{10}H$ | 0.03 g |
| Proxcel | 3.5 ×g |
| Acetic acid | 0.2 g |
| Water | Make to total amount of 100 g |

This coating solution was coated so that a dry thickness of 0.1 $\mu$m could be obtained. Drying was performed at a drying temperature of 170° C. for 2 minutes.

COATING METHOD

First, on the aforementioned support coated with the undercoat layers, as the emulsion layer side, four layers of UL layer, emulsion layer, lower protective layer and upper protective layer were simultaneously coated as stacked layers in this order from the support at 35° C by the slide bead coating method and passed through a cold wind setting zone (5° C.). On the side opposite to the emulsion layer side, an electroconductive layer and a back layer were simultaneously coated as stacked layers in this order from the support by the curtain coating method with adding a hardening agent solution, and passed through a cold wind setting zone (5° C.). When the coated support was passed through each setting zone, the coating solutions showed sufficient setting. Subsequently, the support coated with the layers was dried for the both surfaces in a drying zone of the drying conditions mentioned below. The coated support was transported without any contact with rollers and the other members after the coating of the back surface until it was rolled up. The coating speed was 200 m/min.

DRYING CONDITIONS

After the setting, the coated layers were dried with a drying wind at 30° C. until the water/gelatin weight ratio became 800%, and then with a drying wind at 35° C. and 30% for the period where the ratio became 200% from 800%. The coated layers were further blown with the same wind, and 30 second after the point where the surface temperature became 34° C. (regarded as completion of drying), the layers were dried with air at 48° C. and 2% for 1 minute. In this operation, the drying time was 50 seconds from the start to the water/gelatin ratio of 800%, 35 seconds from 800% to 200% of the ratio, and 5 seconds from 200% of the ratio to the end of the drying.

The light-sensitive layer was rolled up at 25° C. and 55% and subjected to a heat treatment at 35° C. and 30% for 72 hours. Subsequently, it was cut at 25° C. and 55% and a light-shielded light-sensitive material roll was produced as described below (Processed Shape I).

In addition, another light-shielded light-sensitive material roll was produced by using the package material used for the photographic light-sensitive material LL for image setters produced by Fuji Photo Film Co., Ltd. for comparison (Processed Shape II).

(Preparation of Light-shielding Leader)

Light shielding films (low density polyethylene sheets containing 5 weight % of carbon black and having a thickness of 30 $\mu$m) were adhered to both surfaces of a shrink film having a thickness of 30 $\mu$m (TNS, Gunze Ltd.) to prepare heat-shrinkable light-shielding film strips. The obtained heat-shrinkable light-shielding film strips showed heat shrinking ratios of 13.3% for the length direction and 11.9% for the width direction at 100° C., and Elmendorf tear strength of 0.43 N along the length direction. These heat-shrinkable light-shielding film strips were adhered on both sides of a light-shielding sheet, consisting of a PET sheet having a thickness of 100 $\mu$m and low density polyethylene sheets containing 5 weight % of carbon black and having a thickness of 40 $\mu$m adhered on the both surfaces of the PET sheet, along the side ends so that the strips each could extend from the light-shielding sheet in the transverse direction to produce a light-shielding leader.

(Production of Light-shielded Light-sensitive Material Roll)

The above light-shielding leader was adhered to an end of rolled light-sensitive material with an adhesive tape, and disk-shaped light-shielding members were attached to the both ends of the light-sensitive material roll. Subsequently, the light-shielding leader of the rolled light-sensitive material was wound around the light-sensitive material roll, while blowing the surfaces of the heat-shrinkable light-shielding film strips of the light-shielding leader with a hot wind at 270° C. so that the heat-shrinkable light-shielding film strips of the light-shielding leader could be contacted with the outside surfaces of the disk-shaped light-shielding members in a heat-shrunk state exceeding the outer peripheries thereof. Further, the end of the rolled light-shielding leader and the outside surface of light-shielding leader at position corresponding to the previous round of winding with an adhesive, and then heaters at 130° C. were pressed against the surfaces of the heat-shrinkable light-shielding film strips adhered to the outside surfaces of the disk-shaped light-shielding members to fuse the outside surfaces of the disk-shaped light-shielding members and the heat-shrinkable light-shielding film strips. The roll had a width of 1130 mm and the rolled light sensitive material had a length of 61 m.

Figure 1:
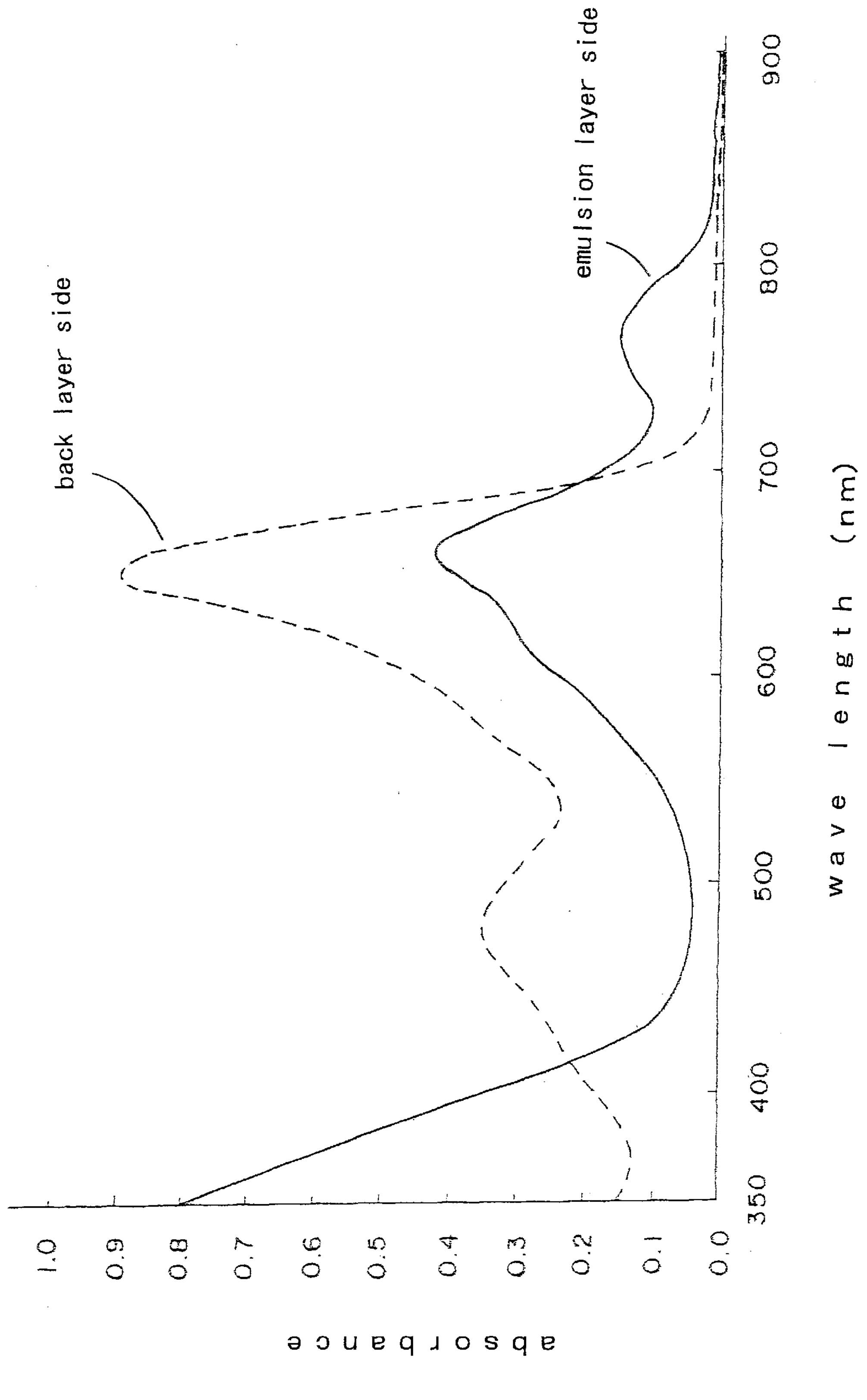
FIG. 1 shows absorption spectra for emulsion layer side and back layer side of a silver halide photographic light-sensitive material according to an embodiment of the present invention. The longitudinal axis represents absorbance (graduated in 0.1), and the transverse axis represents wavelength of from 350 nm to 950 nm. The solid line represents the absorption spectrum of the emulsion layer side, and the broken line represents the absorption spectrum of the back layer side.

Humidity in the roll was measured and found to be 45%. The obtained sample had a film surface pH of 5.5–5.8 for the emulsion layer side and 5.7–6.6 for the back side. Absorption spectra of the emulsion layer side and back layer side are shown in FIG. 1. The absorption spectra were measured by using a spectrophotometer Model U-3500 produced by Hitachi Ltd., in which a sample of which layers on the side opposite to the side to be measured were removed was placed on a f 200 integrating sphere installed in the sample room.

Evaluation was performed as follows.

EVALUATION OF PHOTOGRAPHIC PROPERTIES

The obtained sample was exposed with xenon flash light for $10^{-6}$ second through an interference filter having a peak at 667 nm and a step wedge.

Then, the sample was processed at 35° C. for 30 seconds by using Developers (A) and (B) having the compositions mentioned below and an automatic developing machine, FG-680AG (Fuji Photo Film Co., Ltd.).

| Developer (A) (composition per liter of concentrated solution) | |
|---|---|
| Water | 600 mL |
| Potassium hydroxide | 105.0 g |
| Diethylenetriaminepentaacetic acid | 6.0 g |
| Potassium carbonate | 120.0 g |
| Sodium metabisulfite | 120.0 g |
| Potassium bromide | 9.0 g |
| Hydroquinone | 75.0 g |
| 5-Methylbenzotriazole | 0.24 g |
| 4-Hydroxymethyl-4-methyl-1-phenyl-3-pyrazolidone | 1.35 g |
| Sodium 2-mercaptobenzimidazole-5-sulfonate | 0.432 g |
| 4-(N-carboxymethyl-N-methylamino-2,6-dimercaptopyrimidine | 0.18 g |
| 4-(N-carboxymethyl-N-methylamino-4,6-dimercaptopyrimidine | 0.06 g |
| Sodium erysorbate | 9.0 g |
| Diethylene glycol | 60.0 g |

The volume was made 1 L and pH was adjusted to 10.7 by adding potassium hydroxide and water. One part of the above solution added with 3 parts of water was used as a starter solution (mother solution, pH 10.40). One part of the above solution added with 2 parts of water was used as a replenisher (pH 10.45). The replenishing amount was 100 mL per one sheet of Daizen (large sheet) size (50.8×61.0 cm) or 323 mL per $m^2$.

| Composition of Fixer (B) : (composition per liter of concentrated solution) | |
|---|---|
| Ammonium thiosulfate | 360 g |
| Sisodium ethylenediaminetetraacetate dihydrate | 0.09 g |
| Sodium thiosulfate pentahydrate | 33.0 g |
| Sodium metasulfite | 57.0 g |
| Sodium hydroxide | 37.2 g |
| Acetic acid (100%) | 90.0 g |
| Tartaric acid | 8.7 g |
| Sodium gluconate | 5.1 g |
| Aluminum sulfate | 25.2 g |
| pH 4.85 | |

One part of the above concentrated solution was diluted with two parts of water upon use. pH of the solution used was 4.8.

(Gradation)

Gradation was evaluated in terms of gamma () for the range of optical density of 0.3–3.0 represented by a value corresponding to ((3.0–0.3)/log (Light exposure giving density of 3.0)-log(Light exposure giving density of 0.3)).

(Half Tone Dot Quality)

Test steps were outputted by using an image setter, FT-R5055 (Dainippon Screen Mfg. Co., Ltd) at 175 lines/inch with changing the light quantity and developed under the conditions described above. The exposure was performed at an LV value giving 50% of medium half tone dots, and half tone dots of the medium half tone dot portion were visually observed with a loupe of 100-magnification to rank them into 5 grades. The grade 5 means the best quality of the half tone dots, and 1 means is the worst. The grades of 3 or more indicate a practically acceptable level. The half tone % was measured by using Macbeth TD904.

(Storage Stability of Light-sensitive Material)

The samples produced as shown in Table 1 in a roll shape were subjected to a forced storage condition test. As for the storage conditions, each sample was stored for 5 days under the condition of 50° C. and 45%, and evaluated by sensitometry to determine the sensitivity S1.5 (Thermo). Variation in the sensitivity (ûS1.5) between an outermost portion and a portion at a center of inside (30 m from the outermost portion) of the sample wound in a roll shape was calculated in accordance with the equation mentioned below and shown in Table 1 in terms of percentage.

Sensitivity Variation (ûS1.5)=(S1.5(outermost portion)–S1.5 (center portion))/S1.5(Fr)×100

A smaller value is more desirable, and it is required to be 15% or less as an absolute value.

TABLE 1

| | | | Emulsion layer | | | Hydrazine | Photographic property | | Storability | |
|---|---|---|---|---|---|---|---|---|---|---|
| Sample No. | Processed shape | Emulsion | Silver amount ($g/m^2$) | Gelatin amount ($g/m^2$) | Non-photosensitive silver halide emulsion | compound Amount (mol/Ag mol) | u | Half tone dot quality | Sensitivity variation (S1.5) | Remark |
| 1 | II | A | 3.6 | 1.6 | 1 | — | 9.3 | 3.0 | 0.25 | Comparative |
| 2 | II | B | 3.6 | 1.6 | ① | — | 8.9 | 3.0 | 0.23 | Comparative |
| 3 | II | A:B = 1:2 | 3.6 | 1.6 | ① | — | 7.6 | 3.0 | 0.20 | Comparative |
| 4 | II | A:B = 1:4 | 3.6 | 1.6 | ① | — | 4.6 | 2.5 | 0.12 | Comparative |

TABLE 1-continued

| Sample No. | Processed shape | Emulsion | Emulsion layer Silver amount (g/m²) | Emulsion layer Gelatin amount (g/m²) | Non-photosensitive silver halide emulsion | Hydrazine compound Amount (mol/Ag mol) | Photographic property u | Photographic property Half tone dot quality | Storability Sensitivity variation (S1.5) | Remark |
|---|---|---|---|---|---|---|---|---|---|---|
| 5 | II | A:B = 1:10 | 3.6 | 1.6 | ① | — | 4.1 | 2.0 | 0.11 | Comparative |
| 6 | I | A | 3.6 | 1.6 | ① | — | 9.3 | 3.0 | 0.10 | Invention |
| 7 | I | B | 3.6 | 1.6 | ① | — | 8.9 | 3.0 | 0.11 | Invention |
| 8 | I | A:B = 1:2 | 3.6 | 1.6 | ① | — | 7.6 | 3.0 | 0.09 | Invention |
| 9 | I | A:B = 1:4 | 3.6 | 1.6 | ① | — | 4.6 | 2.5 | 0.11 | Comparative |
| 10 | I | A:B = 1:10 | 3.6 | 1.6 | ① | — | 4.1 | 2.0 | 0.10 | Comparative |
| 11 | II | A | 3.6 | 1.6 | ① | $1 \times 10^{-4}$ | 22.3 | 4.0 | 0.48 | Comparative |
| 12 | II | B | 3.6 | 1.6 | ① | $1 \times 10^{-4}$ | 25.1 | 4.5 | 0.52 | Comparative |
| 13 | II | A:B = 1:2 | 3.6 | 1.6 | ① | $1 \times 10^{-4}$ | 24.6 | 5.0 | 0.66 | Comparative |
| 14 | II | A:B = 1:4 | 3.6 | 1.6 | ① | $1 \times 10^{-4}$ | 23.9 | 4.5 | 0.59 | Comparative |
| 15 | II | A:B = 1:10 | 3.6 | 1.6 | ① | $1 \times 10^{-4}$ | 22.8 | 4.0 | 0.55 | Comparative |
| 16 | I | A | 3.6 | 1.6 | ① | $1 \times 10^{-4}$ | 22.3 | 4.0 | 0.10 | Invention |
| 17 | I | B | 3.6 | 1.6 | ① | $1 \times 10^{-4}$ | 25.1 | 4.5 | 0.08 | Invention |
| 18 | I | A:B = 1:2 | 3.6 | 1.6 | ① | $1 \times 10^{-4}$ | 24.6 | 5.0 | 0.09 | Invention |
| 19 | I | A:B = 1:4 | 3.6 | 1.6 | ① | $1 \times 10^{-4}$ | 23.9 | 4.5 | 0.10 | Invention |
| 20 | I | A:B = 1:10 | 3.6 | 1.6 | ① | $1 \times 10^{-4}$ | 22.8 | 4.0 | 0.11 | Invention |
| 21 | I | B | 2.7 | 1.2 | ① | $1 \times 10^{-4}$ | 25.1 | 4.5 | 0.08 | Invention |
| 22 | I | B | 2.7 | 1.2 | ② | $1 \times 10^{-4}$ | 26.2 | 5.0 | 0.09 | Invention |
| 23 | I | B | 2.7 | 1.2 | ③ | $1 \times 10^{-4}$ | 25.6 | 4.5 | 0.10 | Invention |

Note:
Ratio of A:B for emulsion is represented with a molar ratio of silver.

From the results shown in Table 1, it can be seen that the samples of the present invention are excellent in the half tone dot quality and the storability.

SD-1

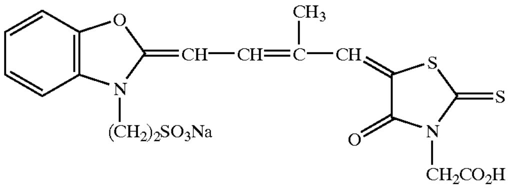

Cpd-1

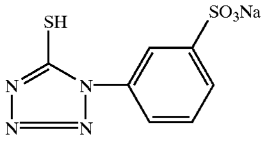

Cpd-2

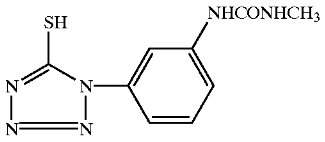

Cpd-3

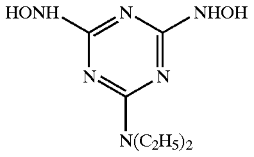

Cpd-4

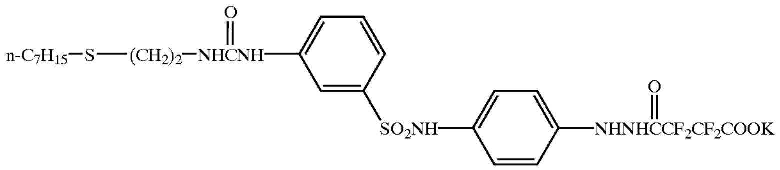

Cpd-5

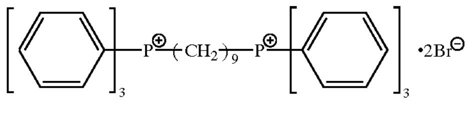

Cpd-6

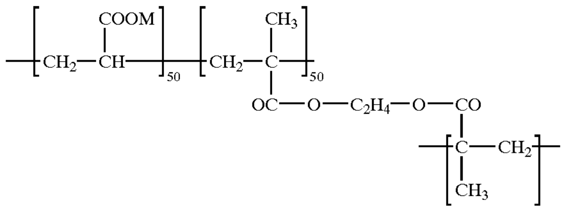

M = H or Na

-continued
Cpd-7
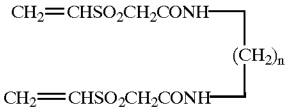
(n = 2):(n = 3) = 3:1
Cpd-8
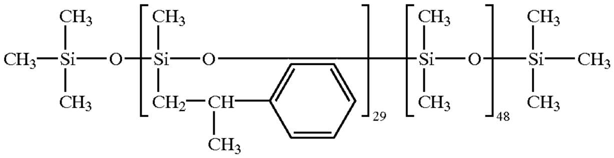
Cpd-9
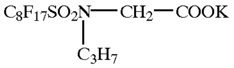
Cpd-10
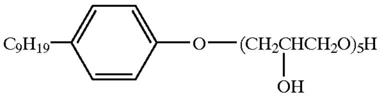
Cpd-11
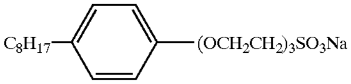
Cpd-12
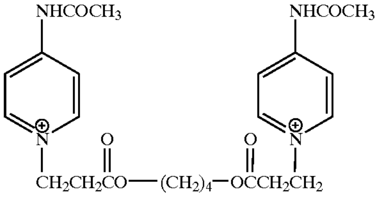
Cpd-13
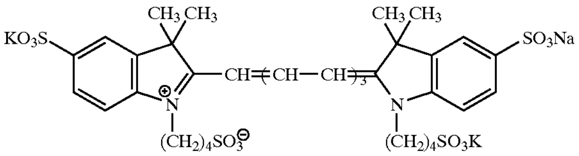
Cpd-14
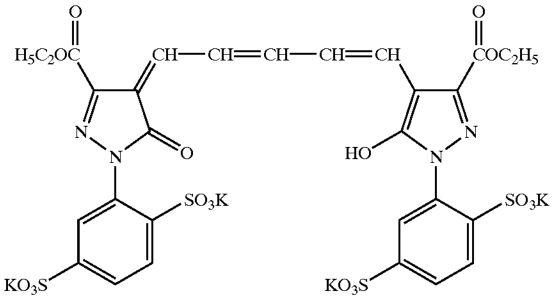
Cpd-15
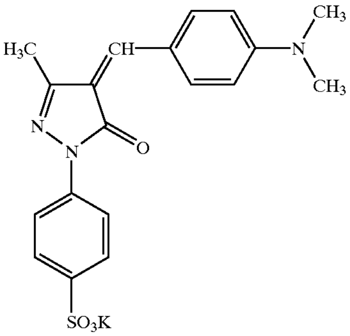
Cpd-16
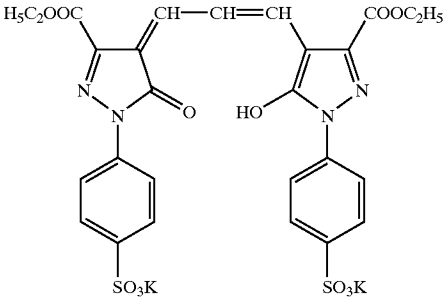
Cpd-17
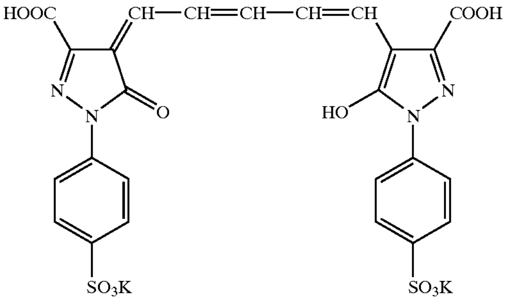
Cpd-18
$CH_3(CH_2)_{11}CH{=}CHSO_3Na$
Cpd-19
$CH_3(CH_2)_{11}CH_2{-}CHSO_3Na$
Cpd-20
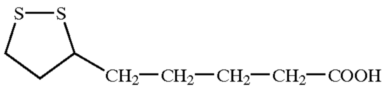

-continued

Cpd-17

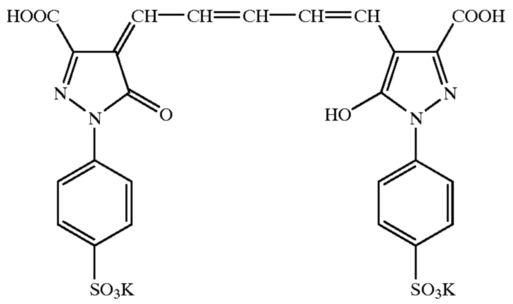

Cpd-18

$CH_3(CH_2)_{11}CH{=}CHSO_3Na$

Cpd-19

$CH_3(CH_2)_{11}CH_2{-}CHSO_3Na$

Cpd-20

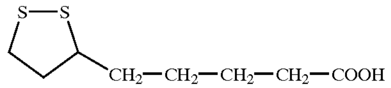

Core/shell type vinylidene chloride copolymer (i)

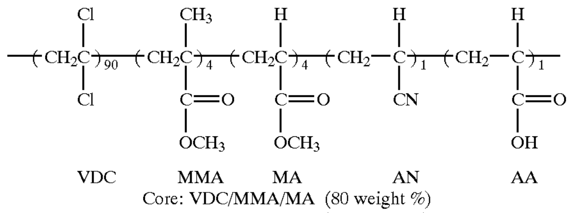

Core: VDC/MMA/MA (80 weight %)
Shell: VDC/AN/AA (20 weight %)
Average particle size: 70 nm Compound (Cpd-21)

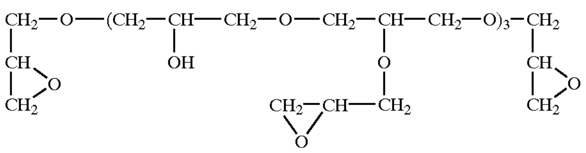

Compound (Cpd-22)

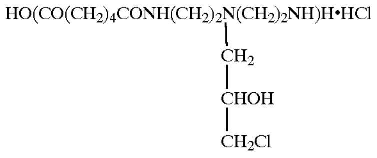

Example 2

The same experiment as that of Example 1 was performed by using Solid Developer (C) and Solid Fixer (D) containing the same developing agent as in Example 1 and densely filled in a polyethylene container according to the following layer structures. As a result, the samples having the characteristics of the present invention showed good performance like Example 1.

| Composition of Solid developer (C) | |
|---|---|
| First layer | Hydroquinone |
| Second layer | Other components |
| Third layer | KBr |
| Fourth layer | $Na_2S_2O_5$ |
| Fifth layer | Potassium carbonate |
| Sixth layer | KOH pellets |

As the fixer, one filled according to the following structure in the same manner as the developer was used.

| Composition of Solid Fixer (D) | | |
|---|---|---|
| First layer | $(NH_4)_2S_2O_3/Na_2S_2O_3/SS$ | 160.0 g |
| Second layer | $Na_2S_2O_5$ | 15.0 g |
| Third layer | Anhydrous sodium acetate | 32.7 g |
| Fourth layer | Ethylenediaminetetraacetic acid | 0.03 g |
| | Succinic Acid | 3.3 g |
| | Tartaric acid | 3.0 g |
| | Sodium gluconate | 1.8 g |
| Fifth layer | Ammonium alum | 23.0 g |
| pH 4.80 (as 1 L of used solution) | | |

Example 3

The same experiment as that of Example 1 was performed except that Developer (E) mentioned below was used instead of Developer (A) used in Example 1. As a result, the samples having the characteristics of the present invention showed good performance like Example 1.

The composition per liter of concentrated solution of Developer (E) is shown below.

| | |
|---|---|
| Water | 600 mL |
| Potassium hydroxide | 96.0 g |
| Diethylenetriaminepentaacetatic acid | 6.0 g |
| Potassium carbonate | 48.0 g |
| Sodium metabisulfite | 120.0 g |
| Potassium bromide | 9.0 g |
| Hydroquinone | 70.0 g |

-continued

| | | |
|---|---|---|
| 5-Methylbenzotriazole | 0.24 | g |
| 1-Phenyl-3-pyrazolidone | 1.7 | g |
| 2-Mercaptobenzothiazole | 0.18 | g |
| 1-Phenyl-5-mercaptotetrazole | 0.06 | g |
| Sodium erysorbate | 9.0 | g |
| Diethylene glycol | 40.0 | g |

The volume was made 1 L and pH was adjusted to 10.8 by adding potassium hydroxide and water. One part of the above solution added with 2 parts of water was used (pH 10.45). The replenishing amount was 100 mL per one sheet of Daizen (large sheet) size (50.8×61.0 cm) or 323 mL per $m^2$.

Example 4

The same experiment as that of Example 1 was performed except that Developer (A) of which pH was lowered to 10.2 and bromide ion concentration was increased due to processing of a large amount of films was used instead of Developer (A) used in Example 1. Developer (A) of which pH was lowered to 10.2 and bromide ion concentration was increased was obtained after 300 sheets of Daizen size (50.8×61.0 cm) per day was processed for continuous 4 days with replenishing the used solution in an amount of 50 mL per one sheet of Daizen size. As a result, the samples having the characteristics of the present invention showed good performance like Example 1.

Example 5

When the processing procedures of Examples 1 to 4 were performed at a development temperature of 38° C., fixing temperature of 37° C. and development time of 20 seconds, results similar to those obtained in Examples 1 to 4 were obtained and thus the effect of the present invention was not degraded.

Example 6

When the processing procedures of Examples 1 to 5 were performed by using an automatic developing machine, FG-680AS (Fuji Photo Film Co., Ltd.) and a transportation speed of the light-sensitive material of 1500 mm/minute as a line speed, similar results were also obtained.

Example 7

When the same evaluations as Examples 1 to 5 were performed by using, instead of Lux Setter RC-5600V produced by Fuji Photo Film Co., Ltd, any one of Image setter FT-R5055 produced by Dainippon Screen Mfg. Co., Ltd., Select Set 5000, Avantra 25 and Acuset 1000 produced by Agfa Gevaert AG, Dolev 450 and Dolev 800 produced by Scitex, Lino 630, Quasar, Herkules ELITE and Signasetter produced by Heidelberg, Luxel F-9000, and Panther Pro 62 produced by PrePRESS Inc., similar effects can be obtained with the samples according to the present invention.

What is claimed is:

1. A silver halide photographic light-sensitive material comprising at least one silver halide emulsion layer on a support, which has a characteristic curve drawn in orthogonal coordinates of logarithm of light exposure (x-axis) and optical density (y-axis) using equal unit lengths for the both axes, on which gamma is 5.0 or more for the optical density range of 0.3–3.0, and is in the shape of a light-shielded light-sensitive material roll comprising a light-sensitive material roll including the light-sensitive material wound around a roll core, disk-shaped light-shielding members each attached to each of both ends of the roll core and having a radius approximately equal to a radius of the light-sensitive material roll and a light-shielding leader comprising a long length light-shielding sheet having a length longer than a length around the disk-shaped light-shielding member and a width approximately equal to a width of the long length light-sensitive material sheet and heat-shrinkable light-shielding film strips that have a length longer than a length around the disk-shaped light-shielding member, can be torn along the length direction and attached to both sides of the long length light-shielding sheet along side ends so that the strips each could extend from the long length light-shielding sheet in the transverse direction, and wherein the extending portions of the heat-shrinkable light-shielding film strips exceed outer peripheries of the disk-shaped light-shielding members and are fused to outside surfaces of the disk-shaped light-shielding members in a state that the extending portions of the heat-shrinkable light-shielding film strips are thermally shrunk mainly along the length direction, wherein the silver halide photographic light-sensitive material has a film surface pH of 6.0 or less for the emulsion layer side.

2. The silver halide photographic light-sensitive material according to claim 1, wherein the roll core is hollow, the disk-shaped light-shielding members have ring-shaped projections on the surfaces at the center and the ring-shaped projections are fitted into a hollow of the roll core so that the ring-shaped projections could contact with inner wall of the hollow roll core.

3. The silver halide photographic light-sensitive material according to claim 1, wherein the heat-shrinkable light-shielding film strips that can be torn show an Elmendorf tear strength along the length direction in the range of 0.1–0.5 N.

4. The silver halide photographic light-sensitive material according to claim 1, wherein the heat-shrinkable light-shielding film strips that can be torn have a property that they are torn along a direction parallel to the side ends of the light-shielding sheet or a direction of going away from the side ends of the light-shielding sheet, when the light-shielding leader is rolled out.

5. The silver halide photographic light-sensitive material according to claim 1, the heat-shrinkable light-shielding film strips that can be torn have a shrinking ratio along the length direction of 5–30% at 100° C.

6. The silver halide photographic light-sensitive material according to claim 5, the heat-shrinkable light-shielding film strips that can be torn have a shrinking ratio along the width direction smaller than the shrinking ratio along the length direction by at least 1% at 100° C.

7. The silver halide photographic light-sensitive material according to claim 1, wherein the heat-shrinkable light-shielding film strips that can be torn comprise a heat shrinkable film and thermoplastic light-shielding films substantially not showing heat-shrinking property laminated on both surfaces of the heat shrinkable film.

8. The silver halide photographic light-sensitive material according to claim 1, which is in the shape of a light-shielded light-sensitive material roll having a light-shielding leader comprising a long length light-shielding sheet attached with heat-shrinkable light-shielding film strips that can be torn along the length direction on both sides of the long length light-shielding sheet along the side ends so that the each heat-shrinkable light-shielding film strip could extend from the long length light-shielding sheet in the transverse direction.

9. The silver halide photographic light-sensitive material according to claim 1, wherein the silver halide photographic light-sensitive material contains a hydrazine compound.

* * * * *